United States Patent
Ichikawa et al.

[19]

[11] Patent Number: 5,903,043
[45] Date of Patent: *May 11, 1999

[54] SEMICONDUCTOR DEVICE AND AN ARITHMETIC AND LOGIC UNIT, A SIGNAL CONVERTER AND A SIGNAL PROCESSING SYSTEM USING THE SAME

[75] Inventors: Takeshi Ichikawa, Hachioji; Tetsunobu Kochi, Hiratsuka, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/548,549

[22] Filed: Oct. 26, 1995

[30] Foreign Application Priority Data

Oct. 28, 1994 [JP] Japan ................................. 6-265038
Jan. 31, 1995 [JP] Japan ................................. 7-014096

[51] Int. Cl.$^6$ .................................................. H01L 29/00
[52] U.S. Cl. ............................. 257/532; 326/38; 326/50; 326/68; 326/81; 326/83; 326/103; 326/106; 326/121
[58] Field of Search ................................. 257/532, 535; 326/38, 47, 50, 68, 81, 83, 103, 106, 119, 121

[56] References Cited

U.S. PATENT DOCUMENTS

| | | | |
|---|---|---|---|
| 5,276,508 | 1/1994 | Boisvert et al. ........................ | 358/48 |
| 5,329,312 | 7/1994 | Boisvert et al. ........................ | 348/256 |
| 5,428,237 | 6/1995 | Yuzurihara et al. .................... | 257/349 |
| 5,466,961 | 11/1995 | Kikuchi et al. ......................... | 257/379 |
| 5,623,221 | 4/1997 | Miyaki .................................... | 327/108 |

FOREIGN PATENT DOCUMENTS 2536922   6/1984   France .

OTHER PUBLICATIONS

"An Ecomonical majority Logic IC Materialized by the CMOS", Nikkei Electronics, Nov. 5, 1973, pp. 132–144.

*Primary Examiner*—Ngân V. Ngô
*Attorney, Agent, or Firm*—Fitzpatrick, Cella, Harper & Scinto

[57] ABSTRACT

In a semiconductor device, wherein capacitors are connected with multi-input terminals Q1 to Qn and one end of each capacitor is commonly connected to a sense amplifier, the semiconductor device comprises either the reset element for resetting the commonly connected capacitor terminals or the reset element which is connected between a capacitor and a switch, which is provided between a capacitor and an input terminal, and a structure in which inverted-phase-signals of the drive signals of the reset elements are input is connected with the same terminals as those of the reset elements, scaling down the circuit, improving the processing, and reducing the power consumption.

58 Claims, 33 Drawing Sheets

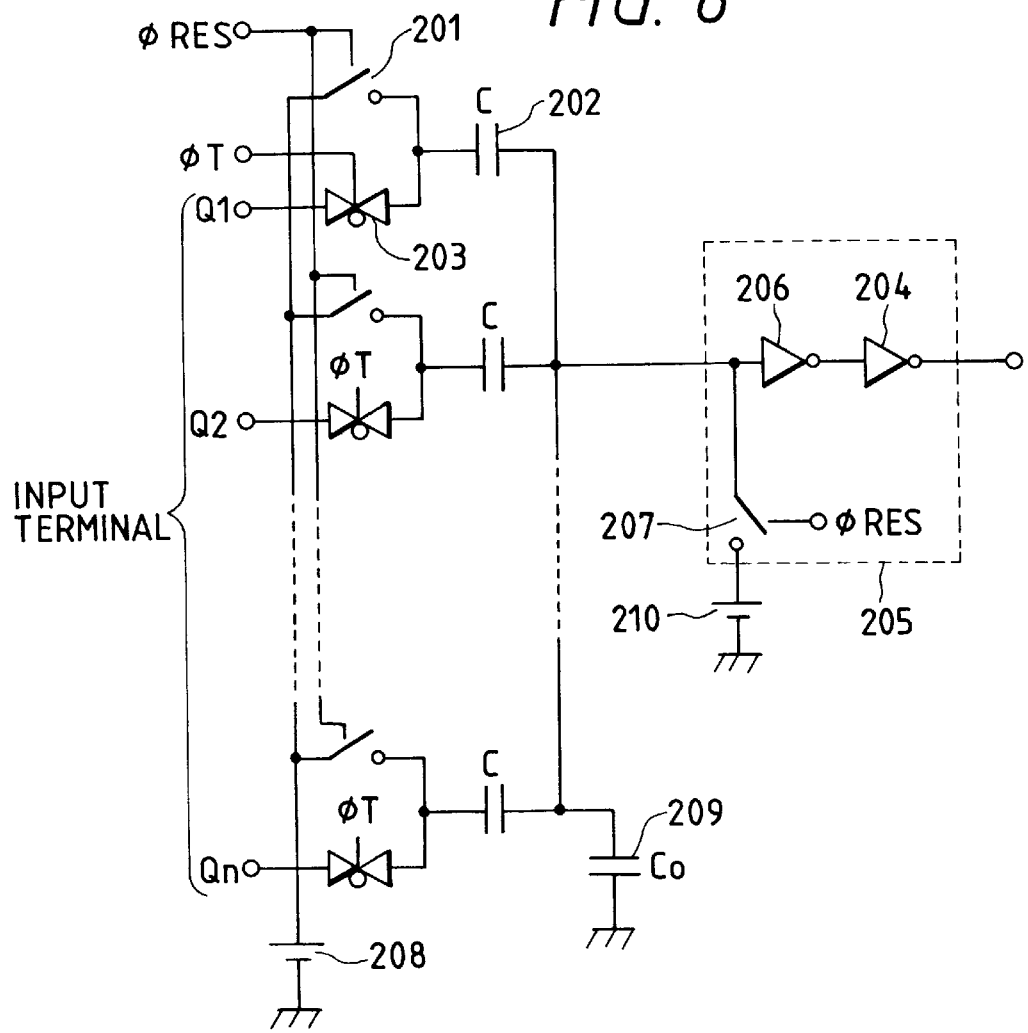
FIG. 8
FIG. 9A  φRES
FIG. 9B  φT
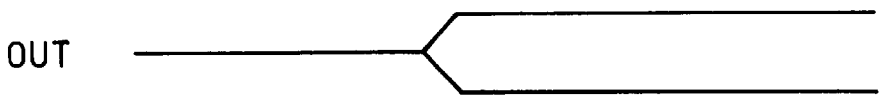
FIG. 9C  OUT

FIG. 18A φRES
FIG. 18B φT
FIG. 18C OUT
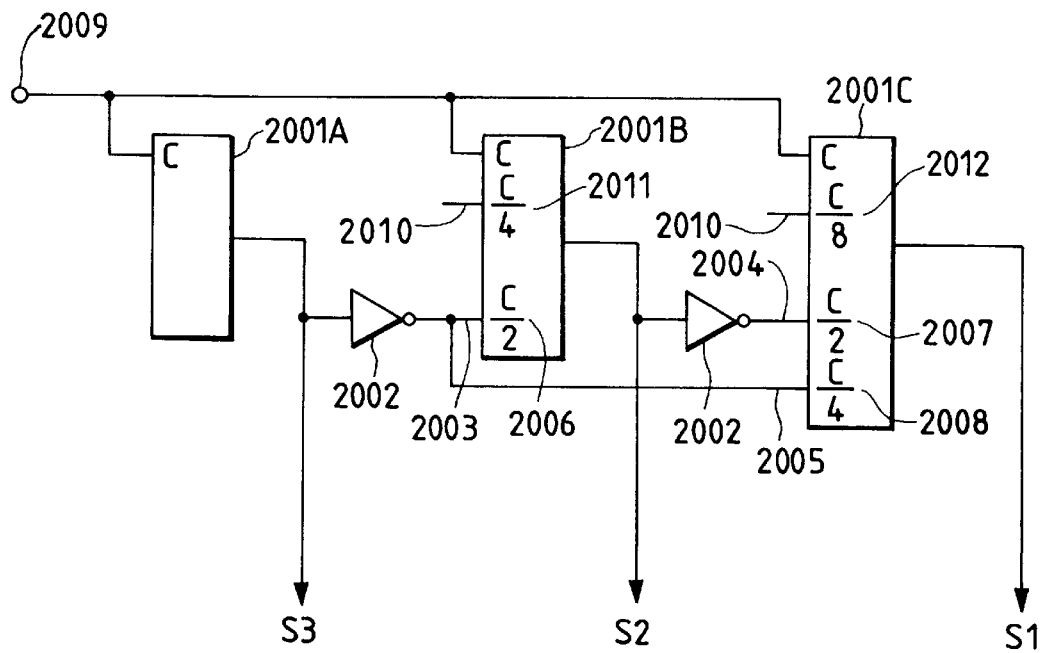
FIG. 19

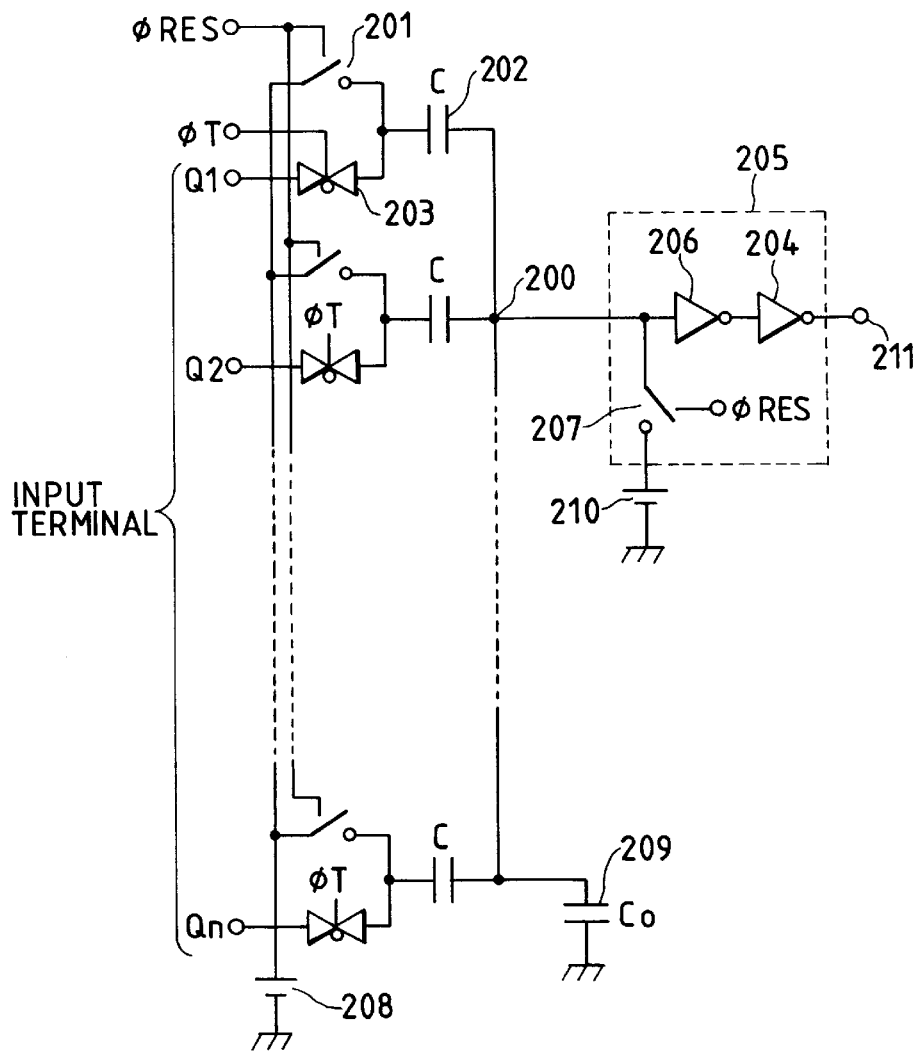
FIG. 28
FIG. 29A  φRES
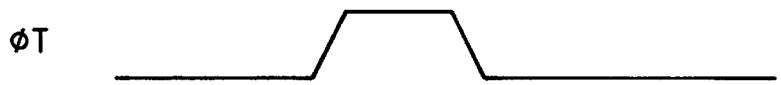
FIG. 29B  φT
FIG. 29C  OUT

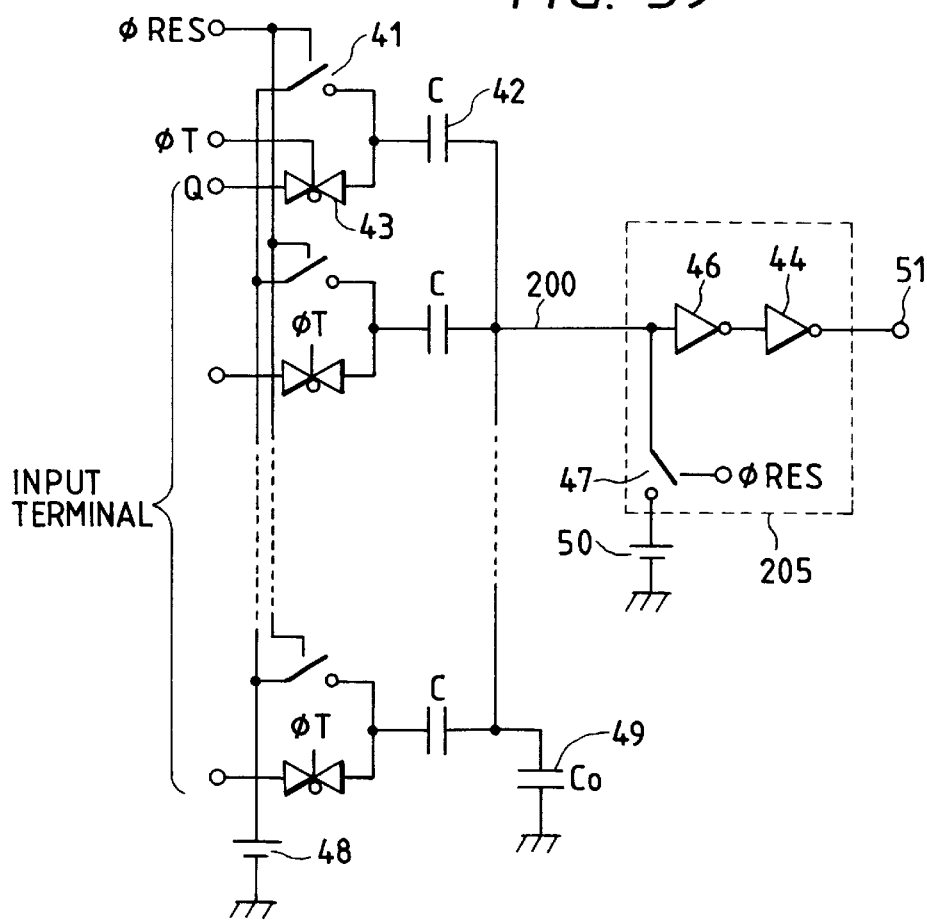
FIG. 39
FIG. 40A ϕRES
FIG. 40B ϕT
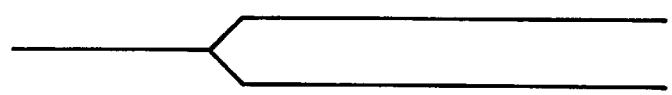
FIG. 40C OUT

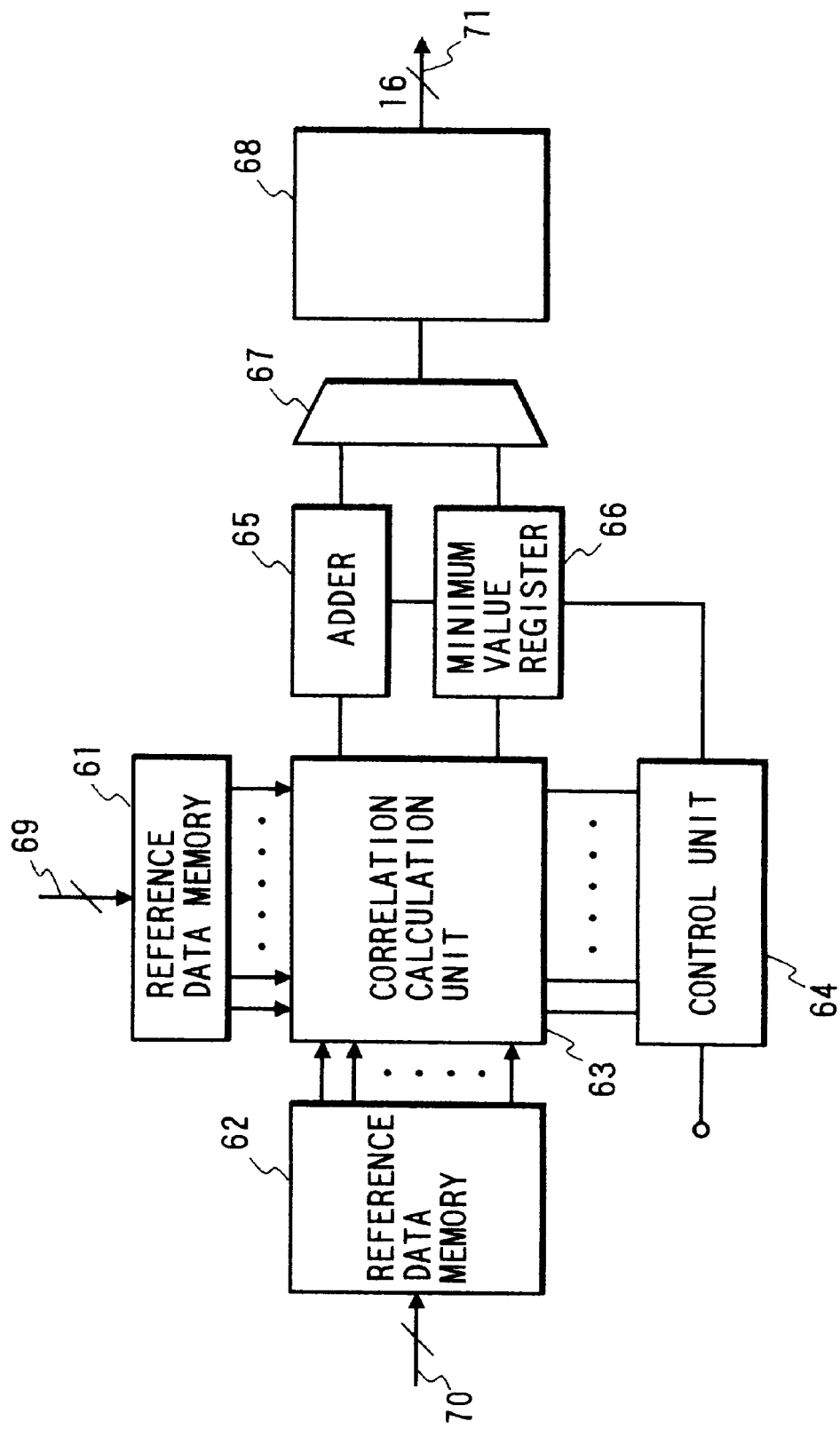

SEMICONDUCTOR DEVICE AND AN ARITHMETIC AND LOGIC UNIT, A SIGNAL CONVERTER AND A SIGNAL PROCESSING SYSTEM USING THE SAME

BACKGROUND OF THE INVENTION

1. Field of the Invention

The invention relates to a semiconductor device and an arithmetic and logic unit, a signal converter and a signal processing system using it, and more particularly, to a semiconductor device which can perform parallel arithmetic and, for example, an arithmetic and logic unit which can perform correlation operation, a signal converter which can analog-to-digital or digital-to-analog convert signals and a signal processing system using it.

2. Related Background Art

Conventionally the semiconductor device which performs parallel processing has a problem that, as the number of signals to be parallelly operated increases, the circuit scale increases serially, which increases the manufacturing cost and decreases the yield. Also it has another problem that, due to an increase in the delay in wiring, etc. and an increase in the number of operations in the circuit which an increase in the circuit scale entails, the processing speed falls as well as that power consumption increases significantly.

In the solid-state image sensor shown in FIG. 1, for example, the image pickup element 41 is arranged along the vertical and horizontal axes and the time-series analog signal from the sensing unit 60 as an area sensor is converted into a digital signal by the analog-to-digital converter 40 and is stored once in the frame memory 39. These signals are processed by the arithmetic and logic circuit 38 and are output from the arithmetic and logic output circuit 50. In concrete terms, it is possible to output an object's movement ($\Delta X$, $\Delta Y$), etc. by correlation operation of pieces of data at different times.

When processing a dynamic image real time, however, there is a problem that, due to the number of processes of the operation processing being very large, the circuit scale increases serially for obtaining a more real image, which decreases the processing speed. For example, a device which can really process the MPEG2 system, being proposed as a dynamic image compression/decompression system, is still under development. In the parallel processing, therefore, there are problems of a decrease in the processing speed due to an increase in the circuit scale and an increase in power consumption. Also they entail problems of an increase in the manufacturing cost and a decrease in the manufacturing yield due to an increase in the circuit scale.

Moreover, the majority logic circuit, which is useful for the operation processing circuit, has been treated in the article "An Economical Majority Logic IC Materialized by the CMOS", which appeared on pages 132 to 144 of the Nov. 5, 1973 issue of "Nikkei Electronics". In that case, however, a majority logic circuit is presented as one of the digital signal processes and, in addition, it is formed by the CMOS. So the number of elements by the CMOS as well as the number of operation processing steps increases. It still has similar problems, therefore, that the circuit scale and power consumption increase and that, additionally, the processing speed falls.

SUMMARY OF THE INVENTION

The objective of our invention is to offer, in view of the conventional problems, a semiconductor device which enables to try to decrease the circuit scale and power consumption and improve the processing speed.

Also another objective of our invention is to offer a semiconductor device which enables to shorten the resetting time by decreasing the effect at on/off by the reset pulse and obtain high-sensitivity, accurate and high-speed data output without an ill effect on the signal by mixture of noise.

Also another objective of our invention is to offer a semiconductor device which enables to try to improve sensitivity to the micro-signal due to the number of transistor elements being small for a logic circuit.

Also another objective of our invention is to offer a semiconductor device having a plurality of input terminals, a plurality of capacities one of the sides of which is connected to the input terminal, a sense amplifier of the other side of the capacity being commonly connected to the input section, a resetting means commonly connected to the other side of the capacity and a structure to be input with the reset signal to be input to the resetting means and the inverted signal.

Also another objective of our invention is to offer a semiconductor device having a plurality of input terminals, a plurality of capacities one of the sides of which is connected to the input terminal via a switching means, a sense amplifier of the other side of the capacity being commonly connected to the input section, a resetting means to reset the voltage between the capacity and the switching means and a structure to be input with the reset signal to be input to the resetting means and the inverted signal.

An additional objective of our invention is to offer an arithmetic and logic unit, a signal converter and a signal processing system using the semiconductor device.

Also another objective of our invention is to offer an arithmetic and logic unit, a signal converter and a signal processing system using it to enable to try to decrease the circuit scale and power consumption and improve the processing speed as well as try to generally decrease the manufacturing cost and improve the manufacturing yield for cost down.

BRIEF DESCRIPTION OF THE DRAWINGS

FIGS. 2, 8, 11, 28, 33, 38 and 39 are schematic equivalent circuit diagrams for explaining respective examples of the semiconductor device of our invention.

FIGS. 3A to 3J, 9A to 9C, 12A and 12B, 18A to 18C, 29A to 29C, 32A and 32B, and 40A to 40C are typical timing charts for explaining respective examples of the operation timing of our invention.

FIGS. 15, 19, 37 and 41 are schematic equivalent circuit diagrams for explaining respective examples of the arithmetic and logic unit using the semiconductor device of our invention.

FIGS. 20 and 42 are typical block diagrams for explaining respective examples of the overall configuration of the semiconductor device our invention or a device using it.

DETAILED DESCRIPTION OF PREFERRED EMBODIMENTS

Figure 1:
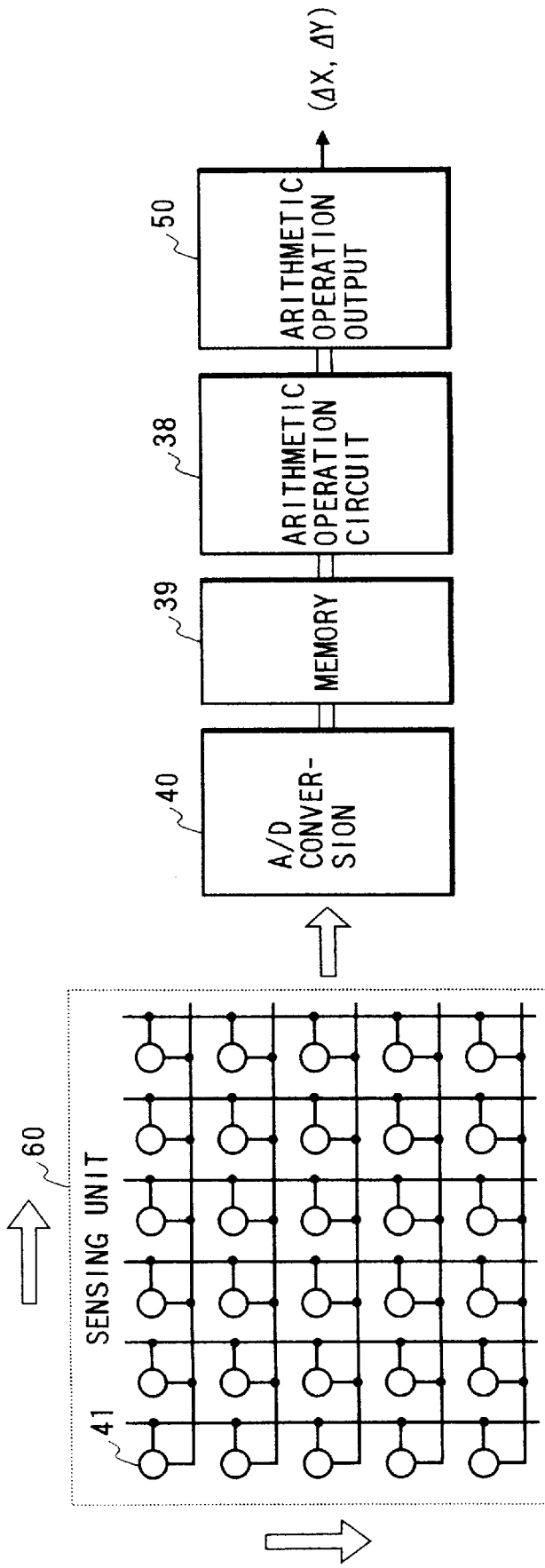
FIG. 1 is a schematic block diagram for explaining an example of configuration of the solid-state image sensor.

The above objections can be achieved by a semiconductor device having a plurality of input terminals, a plurality of capacities one of the sides of which is connected to the input terminal, a sense amplifier of the other side of the capacity being commonly connected to the input section, a resetting means commonly connected to the other side of the capacity and a structure to be input with the reset signal to be input to the resetting means and the negative-phase-sequence (inverted) signal.

Also the above objection can be achieved by a semiconductor device having a plurality of input terminals, a plurality of capacities one of the sides of which is connected to the input terminal via a switching means, a sense amplifier of the other side of the capacity being commonly connected to the input section, a resetting means to reset the voltage between the capacity and the switching means and a structure to be input with the reset signal to be input to the resetting means and the inverted signal.

Such a configuration enables to set the commonly connected side more accurately to the resetting electric potential. As a result, it is possible to obtain output in correspondence to the infinitesimal change in the signal which occurs on the commonly connected side. Namely sensitivity improves, which has a great effect of enabling high-speed response and, therefore, contributing to less power consumption.

Also it is possible to set the commonly connected terminal more accurately to the resetting electric potential by adopting the MOSFET in the resetting means and composing the structure to have a conductive semiconductor impurity layer which is different from the semiconductor substrate to be formed by sandwiching the electrode to be impressed with the negative-phase-sequence pulse on the semiconductor substrate and arrange the semiconductor impurity layer to be connected together electrically to the other side of the commonly connected capacity.

Also it is possible to set the commonly connected side more accurately to the resetting electric potential by setting the gate capacity of the MOSFET of the resetting means to twice or almost twice the gate capacity of the structure.

In addition, it is possible to set the commonly connected side more accurately to the resetting electric potential by setting the gate width W of the MOSFET of the resetting means to twice or almost twice the gate capacity of the structure.

Moreover, it is possible to reset the electric potential between the second switch and the capacity more accurately by possibly having the second switching means between the multi-input terminal and the capacity, having the second resetting means to reset the voltage between the capacity and the switching means and arranging the second structure to be input with the second resetting means drive signal (pulse) and the negative-phase-sequence signal (pulse) to be connected between the second resetting means and the capacity. As a result, it is possible to set the absolute value of the infinitesimal change in voltage which occurs in the commonly connected terminal on the opposite side by division of capacity more accurately via the capacity. Namely sensitivity improves, which has a great effect of enabling high-speed response and, therefore, contributing to less power consumption.

Also it is possible to reset the electric potential between the second switch and the capacity more accurately by adopting the MOSFET in the second resetting means and composing the structure to have a conductive semiconductor impurity layer which is different from the semiconductor substrate to be formed by sandwiching the electrode to be impressed with the negative-phase-sequence pulse on the semiconductor substrate and arrange the conductive semiconductor impurity layer which is different from the substrate to be connected together electrically to the terminal of the capacity on the input terminal side.

Also it is possible to reset the electric potential between the second switch and the capacity more accurately by setting the gate capacity of the MOSFET of the second resetting means to twice or almost twice the gate capacity of the second structure.

Also it is possible to reset the electric potential between the second switch and the capacity more accurately by setting the gate width W of the MOSFET of the second resetting means to twice or almost twice the gate width of the structure.

It is possible to set each terminal more accurately to the resetting electric potential due to it being possible to take a larger design margin by, in the explanation above, arranging the reversed-phase-pulse (reversed-phase-signal) to rise or fall simultaneously to or later than the drive pulse (drive signal).

Also it is possible to set each terminal and line more accurately to the resetting electric potential due to it being possible to take a larger design margin by arranging the structure to be connected from the input terminal of the resetting means drive pulse via a circuit containing the inverter circuit.

Also it is possible to set each terminal and line more accurately to the resetting electric potential due to it being possible to take an even larger design margin by composing a delay circuit using the inverter circuit.

In addition, plurality of the semiconductor devices may be provided, so that an output of the first semiconductor device of the plural ones and/or the inverted output of the semiconductor device is inputted to the second of the semiconductor device. Also when C is the minimum capacity of the capacitors corresponding to the multi-input terminal in the semiconductor device, the total of the capacities of the commonly connected capacitors may be a value which is an odd number or substantially an odd number times the minimum capacitor C.

Also the reset element may be divided into a plurality of MOSFET's in the semiconductor device.

By such a configuration, it is possible to set the commonly connected terminal more accurately to the resetting electric potential. As a result, it is possible to obtain output in correspondence to the infinitesimal change in the signal which occurs in the commonly connected terminal. Namely sensitivity improves, which has a great effect of enabling high-speed response and, therefore, contributing to less power consumption.

Also even in such a semiconductor device, the structure may comprise the semiconductor substrate formed sandwiching the electrode for supplying with the inverted-phase-pulse to the semiconductor substrate, and a semiconductor impurity layers of different conductivity types, wherein the semiconductor impurity layers are connected electrically to the commonly connected capacity side. By so doing, it is possible to set the commonly connected terminal more accurately to the resetting electric potential.

Also in such a semiconductor device, total sum of the gate capacities of the MOSFET of the resetting elements may be twice or almost twice the gate capacity of the structure. In that case too, it is possible to set the commonly connected terminal more accurately to the resetting electric potential.

Also in the semiconductor device, the total sum of the gate width W of the MOSFETs of the reset element may be twice or substantially twice the gate width of the structure. In that case also, it is possible to set the commonly connected terminal more accurately to the resetting electric potential.

Moreover, the MOSFET of the resetting element is divided into two MOSFET's of the same type. And, type of the semiconductor impurity layer of the structure may be the same as the type used in the reset unit.

Also the gate width W and the gate length L of the MOSFET of the reset element divided into two may be almost equal, and may be almost equal to the gate width and length of the structure.

Moreover, the second switch respectively between the input terminal and the capacitor, the second reset element to reset the voltage between the capacitor and the second switch may be provided so as to adopt the MOSFET in the reset element and to divide it into a plurality of MOSFET's, and arrange the second structure to be input with the reset element drive pulse and the negative-phase-sequence pulse to be connected between the second switching means and the capacity. By so doing, it is possible to reset the electric potential between the second switch and the capacity more accurately and at higher speed. As a result, it is possible to set the absolute value of the infinitesimal change in voltage which occurs on the commonly connected side of the opposite side by division of capacity more accurately via the capacity. Namely sensitivity improves, which has a great effect of enabling high-speed response and, therefore, contributing to less power consumption.

Also the second structure may comprise a conductive semiconductor impurity layer which is different from the semiconductor substrate to be formed by sandwiching the electrode to be impressed with the negative-phase-sequence pulse on the semiconductor substrate and be so arranged that the conductive semiconductor impurity layer which is different from the substrate is connected together electrically to the capacity side on the input terminal side. By so doing, it is possible to reset the electric potential between the second switch and the capacity more accurately.

In addition, the total sum of the gate capacity of the MOSFET of the second reset element may be twice or almost twice the gate capacity of the second structure. By so doing, it is possible to set the electric potential between the second switch and the capacity more accurately.

Moreover, the total sum of the gate width W of the MOSFET of the second reset element may be twice or almost twice the gate width of the second structure. By so doing, it is possible to set the electric potential between the second switch and the capacity more accurately.

Also, the MOSFET of the second reset element may be divided into two MOSFET's of the same type and also make the type of the semiconductor impurity layer of the second structure the same as the type used in the resetting means.

Also, the gate width W and the gate length L of the MOSFET of the second reset element may be divided into two almost equal and also make them almost equal to the gate width and length of the second structure.

Moreover, it is possible to set each terminal more accurately to the resetting electric potential due to it being possible to take a larger design margin by, in the semiconductor device, arranging the negative-phase-sequence pulse to rise or fall simultaneously to or later than the drive pulse.

Also it is possible to set each terminal more accurately to the resetting electric potential due to it being possible to take a larger design margin by arranging the input section to the second structure to be connected from the input section of the second resetting means drive pulse via a circuit containing the inverter circuit.

Also it is possible to set each terminal more accurately to the resetting electric potential due to it being possible to take a larger design margin by composing a delay circuit using the inverter circuit.

Moreover, a plurality of the semiconductor device is provided so that the output of the first of the semiconductor device of the plurality of pieces and/or the inverted output of the semiconductor device is inputted into the second of the semiconductor device. When C is the minimum capacity of the capacitors corresponding to the input terminal, the capacity value which is the total of the capacities of the commonly connected to capacitor may be a value which is an odd number or almost an odd number times the minimum capacitor C.

In addition, an arithmetic and logic unit which can perform correlation operation and other kinds of operation may comprise the semiconductor device.

Moreover, an analog-to-digital converter containing the semiconductor device inputs the analog signal into the semiconductor device, and outputs the digital signal corresponding to the analog signal. Alternatively, an analog-to-digital converter containing the semiconductor device may be proveded. The analog-to-digital converter inputs the digital signal to the semiconductor device and outputs the analog signal corresponding to the digital signal.

Also in our invention, a signal processing system may contain any one of the arithmetic and logic unit which can perform correlation operation, etc. and the signal converter which is an analog-to-digital converter or a digital-to-analog converter.

Incidentally, the signal processing system of our invention may contain the image input device to input the picture signal or the storage to store information. It can serve multifarious signal processing, e.g. picture signal compression/decompression and operation processing.

Embodiments

Some embodiments of our invention are explained in detail below referring to drawings.

[Embodiment 1]

Figure 2:
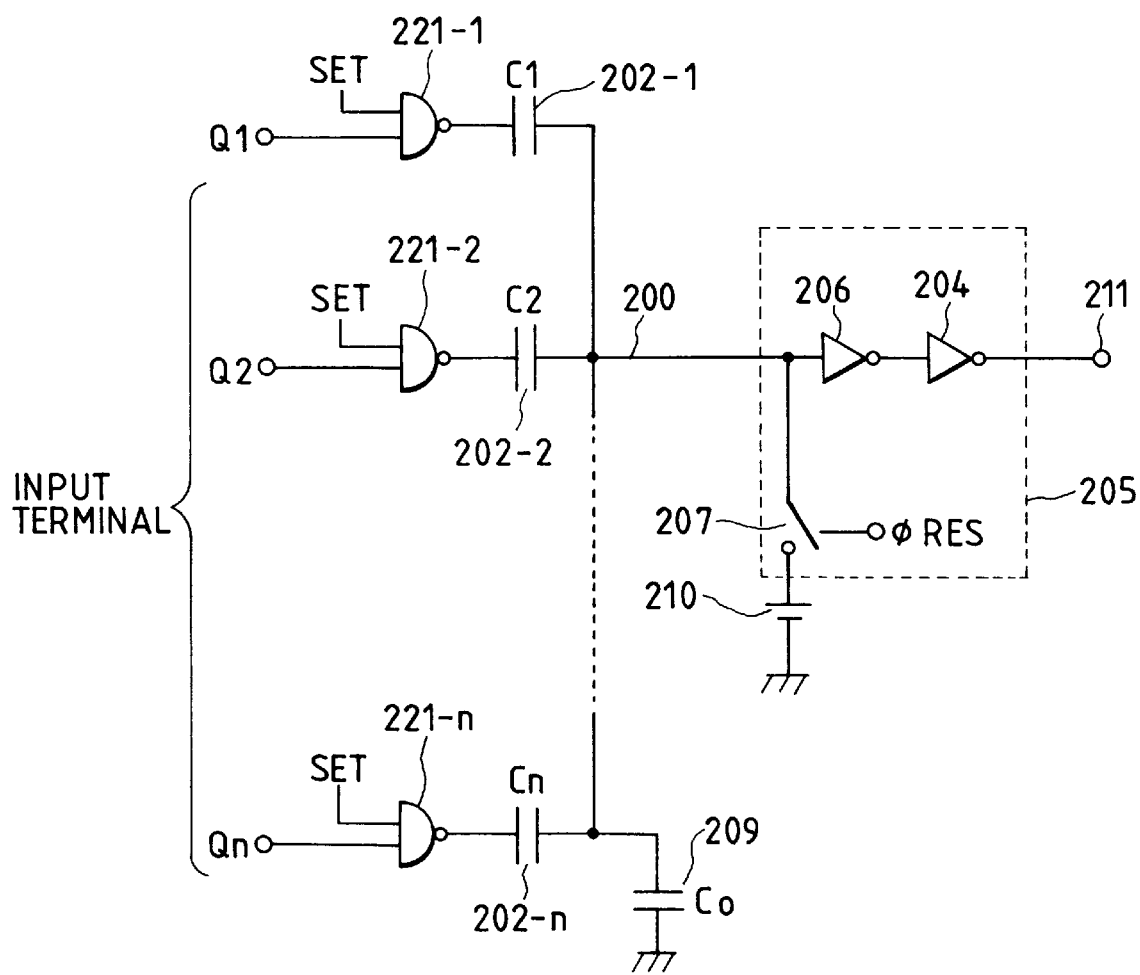
Figure 3:
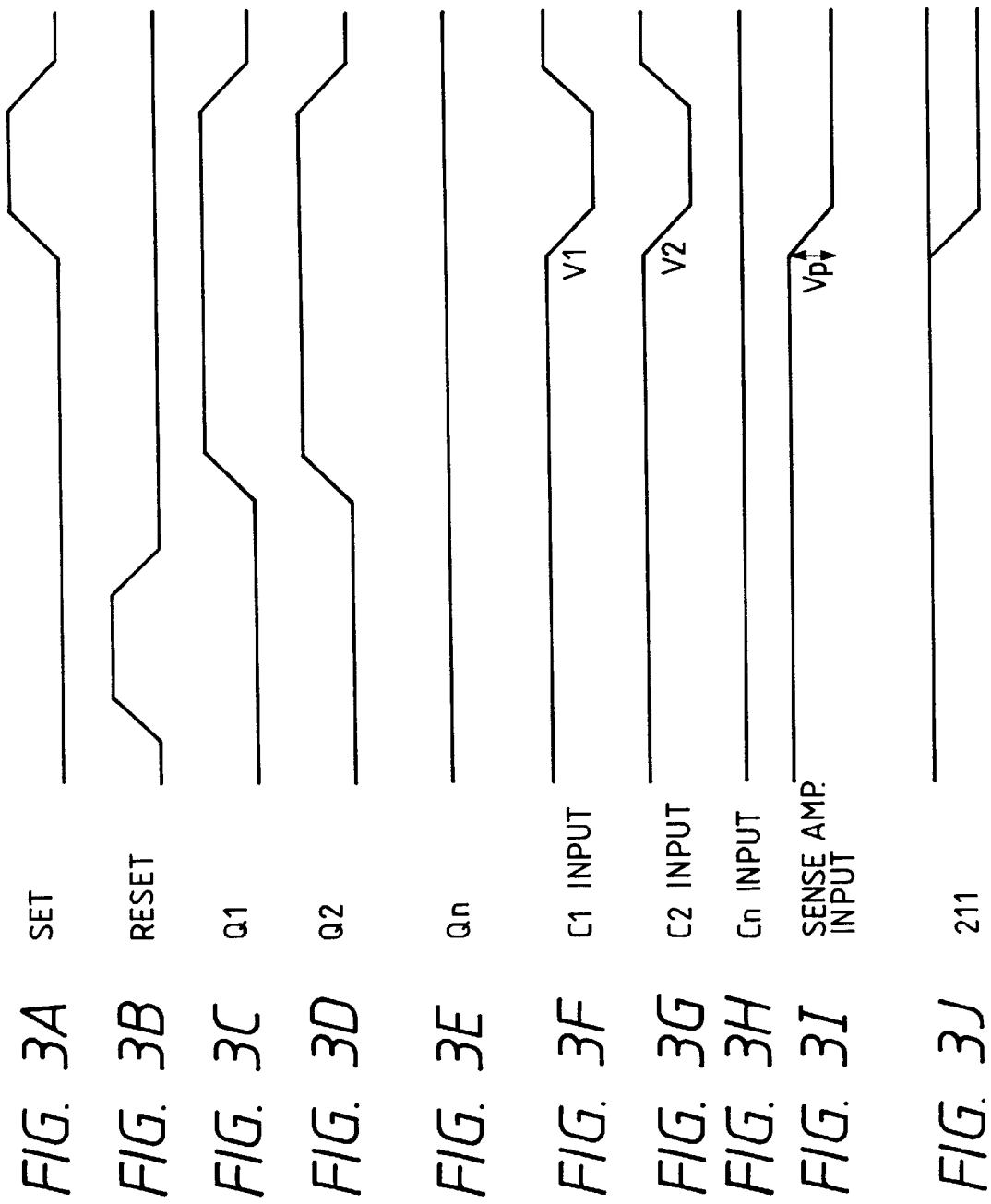

FIG. 2 is a schematic circuit diagram for explaining the concept of the semiconductor device of embodiment 1. In the same figure, Q1–Qn represent input terminals. n multi-input terminals are provided. 221 represents a NAND circuit here. It is possible to output the input from the input terminal Qi respectively in the desired voltage value. 202-1 to 202-n represent capacitors respectively. Their values may be common or different from each other. 205 represents the sense amplifier, 206 the sense amplifier's 205 inverter, 204 the sense amplifier's 205 second inverter, 207 the inverter reset switch, 210 the reset power source, 211 the output terminal and 209 the capacity including the parasitic capacity on the commonly connected end of the capacitor 202.

The operation in this embodiment is explained below referring to FIGS. 3A to 3J. First, a low-level signal is to be input to "set" of the NAND circuit 221 and the input side of each capacitor 202 is to be fixed to a certain value, e.g. 2.5 V or 5 V. Then the input end of the sense amplifier's 205 inverter 206 is to be reset to the power source 210 voltage by making the reset switch 207 by the reset pulse φRES. The capacitor's 202 commonly connected terminal 200 is held at the resetting electric potential when the reset pulse φRES is turned off. Then input signals are to be input respectively to the input terminals Q1–Qn and then a high-level signal is to be input to "set" of the NAND circuit 221 to input the voltage change to be determined by the power source of each NAND circuit 221 to the input side of each capacitor 202. In this example, signals are input to C1, C2 from Q1, Q2, so the voltage change V1 occurs in the capacitor C1 and the voltage change V2 occurs in the capacitor C2. No voltage change occurs in Cn. Now letting Ci equal the capacitor's 202 capacity and $C_0$ the parasitic capacity value and assuming that N pieces of the capacitor 202 are connected in parallel, the commonly connected end of the capacitor 202 changes for one piece of input by the following amount from the resetting electric potential by division of capacity.

$$Ci \times V/(C_0+(C1+C2+ \ldots +Cn))$$

V represents the electric potential change component at the capacity input end.

In voltage change due to multi-input, therefore, as soon as the set terminal turns high level, for example, the NAND circuit 221 is made, inversion output is performed and an electric potential of $Ci \times V = C1 \times V1 + C2 \times V2$ is impressed and is supplied to the sense amplifier's 205 input terminal.

If the inverter's 206 input-end voltage changes in excess of the inverter's 206 logical inversion electric potential, the inverter's 206 output-end voltage inverts accordingly. If signals are input respectively to N pieces of input, the sum (Vp) of N pieces of division of capacity output is input to the inverter's 206 input end. In conclusion, a high-level or low-level signal is output to the sense amplifier's 205 output terminal 211 according to the electric potential change input to the input-end side of each capacity. In this case, low level is output to the output terminal 211.

By the configuration above, it is possible to compose a circuit to perform parallel arithmetic at high speed as certain multiple variable signals are input to the multi-input terminal. Also in such a circuit configuration, the number of transistors may be smaller than in ordinary logic circuits, so it is suited to decreasing power consumption as well as increasing speed. Moreover, while input is performed here using the NAND circuit 221, it is not necessarily limited to. It is essentially the same if directly input by eliminating the NAND circuit 221. It goes without saying that there is no problem if another method is adopted. In the example of direct input, for example, three manners of input, i.e. incur voltage change to the positive side from a certain constant electric potential, incur voltage change to the negative side from it and do not incur voltage change, and other manners of input are possible and it is possible to perform such parallel arithmetic of several variables as to perform output accordingly.

Next, a means to reset the commonly connected capacity terminal is explained in detail below referring to FIG. 4.

Figure 4:
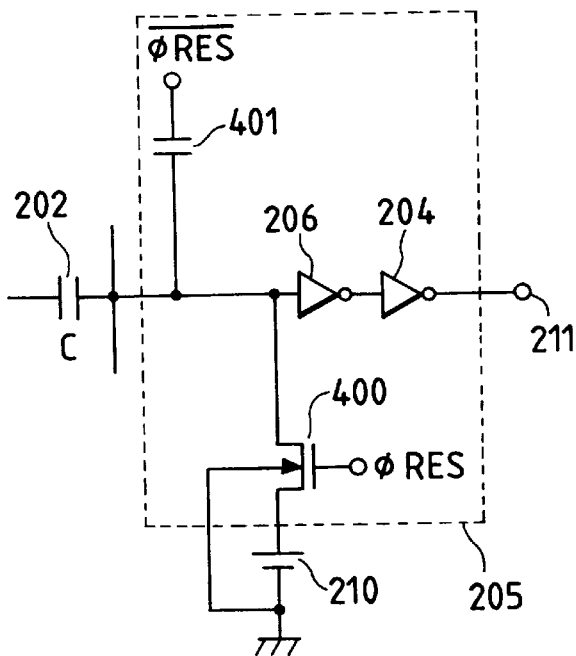
FIGS. 4, 5, 6, 7, 10, 13, 14, 16, 17, 22, 24, 25, 27, 30, 31, 34B, 35 and 36 are partial schematic equivalent circuit diagrams for explaining respective examples of the semiconductor device of our invention.

FIG. 4 shows an example of details from the capacitor C (202) of FIG. 2 to the sense amplifier output via the commonly connected terminal. In this example, the NMOS transistor 400 is used as a means to reset the commonly connected terminal by the power source 210. The drive pulse φRES for resetting is input to the NMOS transistor's 400 gate. As the NMOS transistor 400 is used here, the commonly connected terminal is reset by the power source 210 while the signal pulse is at high level, for example, and then the signal is turned low level to turn off the NMOS transistor 400 to turn the commonly connected terminal to the floating status. Meanwhile, the φRES signal's negative-phase-sequence pulse $\overline{\phi RES}$ is input to the commonly connected terminal via the capacity 401 as a structure.

By connecting such a structure, it is possible to offset the voltage change in the commonly connected terminal due to division of capacity of the transistor's gate and drain (the commonly connected terminal side) overlapping capacity and the capacity represented by 209 which occurs when φRES turns off the NMOS transistor 400, so it is possible to reset the commonly connected terminal more accurately to the power source's 210 electric potential. If the commonly connected terminal voltage is set to near the inverter's logical inversion voltage, for example, the nearer the inverter's logical inversion voltage that value, the more is it possible to perform output in correspondence to the infinitesimal change in the signal which occurs in the commonly connected terminal. Namely it is obvious that sensitivity improves, which has a great effect, it goes without saying, of enabling high-speed response and, therefore, contributing to less power consumption. While the nearer the value of the NMOS transistor's 400 gate-drain overlapping capacity the value of the capacity 401 used here, the more desirable is it since reset to near the power source's 210 electric potential. It is not necessarily limited to, however. It goes without saying that a great effect is also brought about even if the value differs, e.g. a half value.

Figure 5:
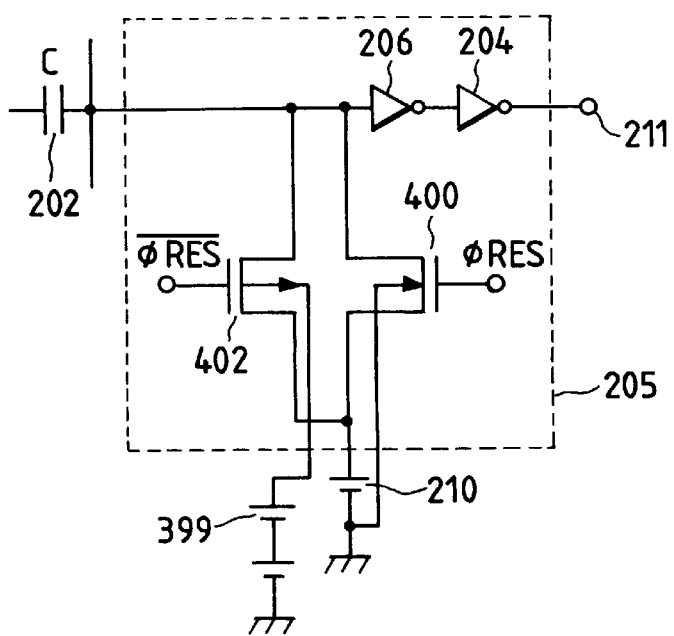

FIG. 5 shows an example of using the PMOS transistor as the structure. In FIG. 5, the PMOS transistor 402 is used instead of the capacitor 401. φRES is input to the PMOS transistor's 402 gate while the drain side is connected to the commonly connected terminal and the source side is connected to the power source 210. The effect is the same as in the capacity explained in FIG. 4. Otherwise it is not necessarily limited to as a resetting means either. There is no problem at all if, for example, the PMOS transistor is used. In that case, however, it is necessary, referring to the example above, to make such corrections as replacing the PMOS transistor represented by 402 of FIG. 4 with the NMOS transistor, changing the φRES signal (naturally $\overline{\phi RES}$ too) polarity and so on.

[Embodiment 2]

Figure 6:
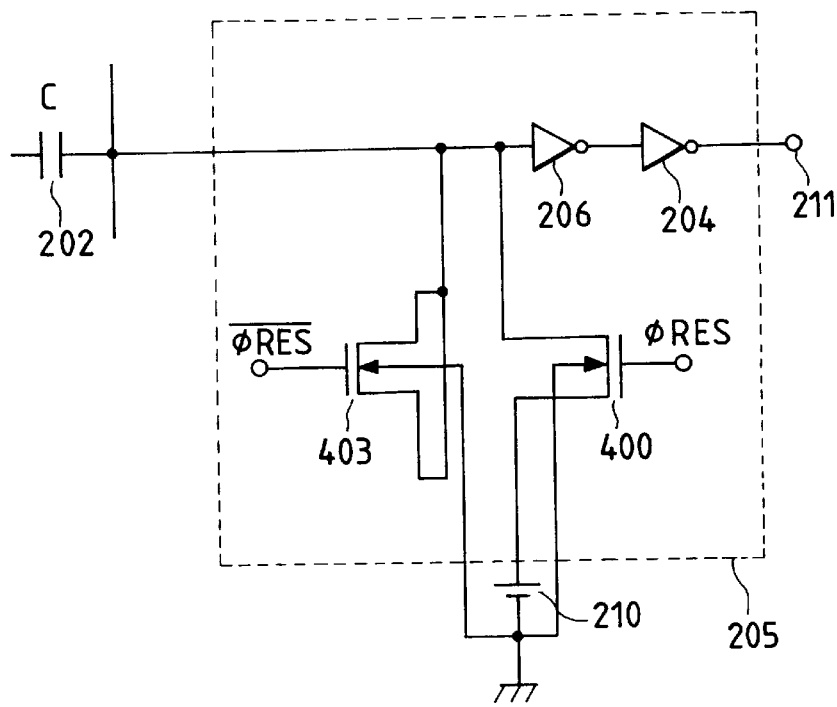

In embodiment 2, it has been enabled to reset the commonly connected terminal more precisely to the power source's 210 electric potential. The semiconductor device of embodiment 2 is explained below referring to FIG. 6. FIG. 6, like FIGS. 4 and 5, shows an example of a partial schematic equivalent circuit diagram from the capacitor C (202) of FIG. 2 to the sense amplifier output via the commonly connected terminal. In this example, the NMOS transistor 400 is used as the means to reset the commonly connected terminal by the power source 210. The drive pulse φRES for resetting is input to the NMOS transistor's 400 gate. As the NMOS transistor 400 is used here, the commonly connected terminal is reset by the power source 210 while the signal pulse is at high level, for example, and then the signal is turned low level to turn off the NMOS transistor

400 to turn the commonly connected terminal to the floating status. Meanwhile, the one represented by 403 is used as the structure to input the φRES signal's negative-phase-sequence pulse φRES. That structure has a conductive semiconductor impurity layer which is different from the semiconductor substrate to be formed by sandwiching the electrode to be impressed with the negative-phase-sequence pulse on the semiconductor substrate and the semiconductor impurity layer is connected together electrically to the commonly connected capacity terminal.

In FIG. 6, the structure takes the NMOS transistor's drain and source as the common terminal and is connected to the terminal of capacity being commonly connected. While the NMOS transistor's 400 capacity is mainly the transistor's gate and drain (the commonly connected terminal side) overlapping capacity, its capacity value is a quantity which depends on the amount of source/drain impurities, transistor forming thermal hysteresis, etc. Therefore, it is fairly difficult to design and create accurately. In addition, there is gate voltage dependency. A structure which is considered to have the same capacity including the voltage dependency as such a transistor is shown in FIG. 6. The capacity of such a structure can be set to a capacity value which is almost equal to that including the voltage dependency of the NMOS transistor 400 being used as the resetting means. Therefore, it is possible to offset the voltage change in the commonly connected terminal by division of capacity with the capacity represented by 209 (FIG. 4) to enable to reset the commonly connected terminal more accurately to the power source's 210 electric potential.

If the commonly connected terminal voltage is set to near the inverter's logical inversion voltage, for example, the nearer the inverter's logical inversion voltage that value, the more is it possible to perform output in correspondence to the infinitesimal change in the signal which occurs in the commonly connected terminal. Namely it is obvious that sensitivity improves, which has a very great effect, it goes without saying, of enabling high-speed response and, therefore, contributing to less power consumption. Moreover, if the gate capacity value of the MOS transistor as the resetting means is set to twice or almost twice the gate capacity of such a structure, the total capacity values become almost equal since the source and the drain are common in the structure. Also each gate electrode is impressed with the negative-phase-sequence pulse, so it is possible to reset the commonly connected terminal more accurately to the power source's 210 electric potential. Further desirable is that, if the gate width of the MOS transistor as the resetting means is set to twice or almost twice the gate width of such a structure, the total gate overlapping capacity values become almost equal since the source and the drain are common in the structure. Also each gate electrode is impressed with the negative-phase-sequence pulse, so it is possible to reset the commonly connected terminal more accurately to the power source's 210 electric potential.

Incidentally, while an example of one piece each of the NMOS transistor being connected as the resetting means or as the structure to be impressed with the negative-phase-sequence pulse is shown in FIG. 6, it goes without saying that it is not necessarily limited to. It doesn't matter at all if the resetting means and the structure to be impressed with the negative-phase-sequence pulse are both the PMOS transistor, or if a plurality of pieces are connected, both the NMOS and PMOS transistors are used as the resetting means and the structure to be impressed with the negative-phase-sequence pulse for each of them is had. The reset element is the NMOS transistor. And the structure supplied with the reversed-phase-pulse may be the PMOS transistor or vice versa.

[Embodiment 3]

Figure 7:
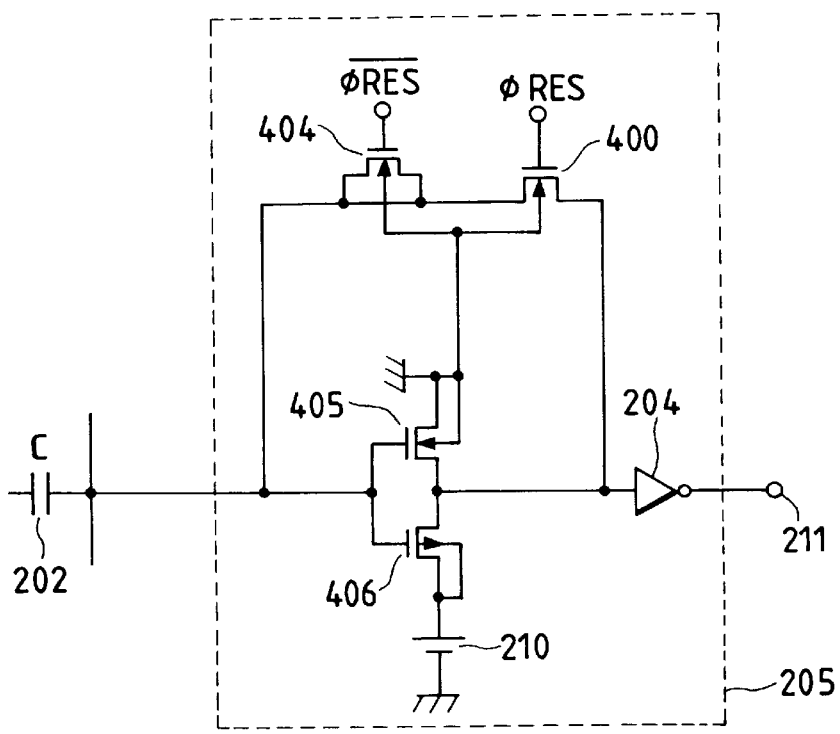

In embodiment 3, the resetting means is explained in detail referring to FIG. 7. FIG. 7, like FIGS. 4 and 5, shows an example of a partial schematic equivalent circuit diagram from the capacitor C (202) of FIG. 2 to the sense amplifier output via the commonly connected terminal. The sense amplifier here is not simply the inverter shown in embodiments 1 and 2. Rather it is the inverter's input and output having been connected via the resetting means (switch). The NMOS transistor represented by 400 being the resetting means, the inverter's input and output terminals are common and are just equal to the inverter's logical inversion voltage when that transistor is on. A sense amplifier with a very high sensitivity to the infinitesimal change in voltage which occurs in the terminal of capacity being commonly connected such that the voltage changes according to the actual input value Q if the inverter's input/output terminal is disconnected in that status materializes.

The structure represented by 404 is the NMOS transistor of the source and drain being common explained in embodiment 2. Its gate electrode is impressed with the pulse to the resetting means and the negative-phase-sequence pulse. By using such a structure, it is possible to turn the inverter's input voltage to the floating status more accurately by the inverter's logical inversion voltage. As a result, sensitivity improves, which has a great effect, it goes without saying, of enabling high-speed response and, therefore, contributing to less power consumption. While an example of one piece each of the NMOS transistor being connected as the resetting means or the structure to be impressed with the inverted-phase-pulse is shown in this embodiment, it goes without saying that it is not necessarily limited to and that the other structures explained in embodiments 1 and 2 may be used. Also it goes without saying that the circuit configuration to connect the resetting means or the structure to be input with the resetting means drive pulse and the negative-phase-sequence pulse is not necessarily limited to the configuration shown in this embodiment or those shown in embodiments 1 and 2 either.

[Embodiment 4]

Embodiment 4 is explained below referring to FIGS. 8 to 12B. In this embodiment, the switching means being had between the multi-input terminal and the capacity and the resetting means to reset the voltage between the capacity and the switching means are explained in detail. In FIG. 8, Q1–Qn represent n multi-input terminals. 201 typically represents the reset switch, 202 the capacitor, 203 the signal transfer switch, 205 the sense amplifier, 206 the sense amplifier's inverter, 204 the sense amplifier's second inverter, 207 the second reset switch for resetting the inverter, 208 the resetting power source, 210 the second resetting power source, 211 the output terminal and 209 the parasitic capacity on the capacitor's 202 commonly connected end. It is not necessarily limited to, however.

FIGS. 9A to 9C are an explanatory timing chart showing the operation in this embodiment. The operation in this embodiment is explained below referring to the same figure. First, one end of the capacitor 202 is reset by the reset pulse φRES. As the resetting voltage, if the supply voltage is 5 V-based, for example, 2.5 V, or about its half, is used. The resetting voltage is not necessarily limited to that. It may as well be another voltage. In that case, the sense amplifier's 205 inverter's 206 input terminal is reset almost simultaneously by making the reset switch 207. It goes without saying, however, that there is no limitation that such a timing must also be simultaneous. In this example, a value near the logical inversion voltage to invert the inverter's 206 output is chosen as the resetting voltage. If the reset pulse φRES is turned off, each resetting electric potential is held across the capacitor 202. Then if the transfer switch 203 is made by the transfer pulse φT, the signal is transferred to one end of the capacitor 202 and the electric potential at one end of the capacitor 202 changes, for example, from the resetting voltage of 2.5 V to 0 V, which corresponds to low level, or 5 V, which corresponds to high level. The operation thereafter is the same as in the operation explained in embodiment 1.

Figure 10:
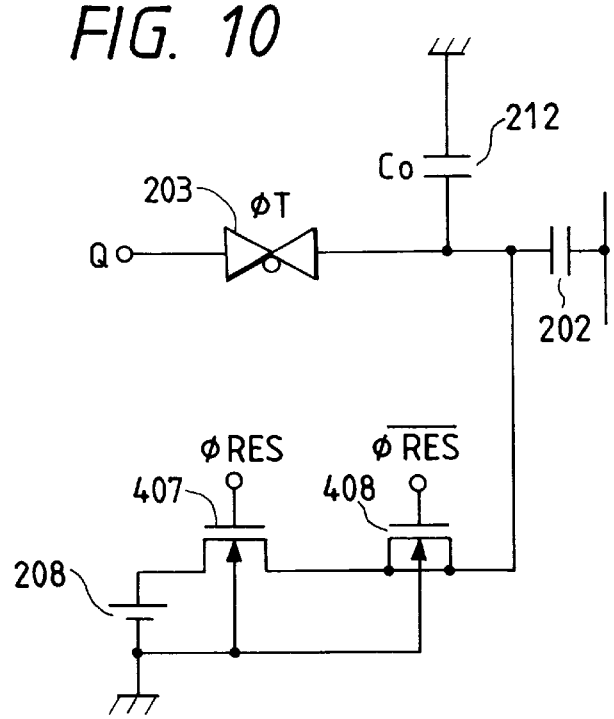

FIG. 10 is a schematic equivalent circuit diagram showing an example of the circuit from the input terminal to the capacitor C (202) of FIG. 8. In FIG. 10, 202 represents the capacity, 203 the signal transfer switch and 208 the resetting power source just as in FIG. 8. Also the NMOS transistor 407 is used as the means to reset the terminal between the signal transfer switch 203 and the capacitor 202 by the power source 208. The drive pulse φRES for resetting is input to the NMOS transistor's 407 gate. As the NMOS transistor 407 is used here, the signal pulse is input at the timing shown in FIGS. 9A to 9C, for example, the terminal between the switch and the capacity is reset by the power source 210 during high level and then the terminal between the switch and the capacity is turned to the floating status. Meanwhile, the φRES signal's negative-phase-sequence pulse φ$\overline{\text{RES}}$ is input to the structure 408. That structure has a conductive semiconductor impurity layer which is different from the semiconductor substrate to be formed by sandwiching the electrode to be impressed with the negative-phase-sequence pulse on the semiconductor substrate and the semiconductor impurity layer is connected together electrically to the commonly connected capacity terminal.

In FIG. 10, that structure is connected to the terminal between the switch and the capacity taking the NMOS transistor's drain and source as the common terminal. By connecting that structure, it is possible to offset the voltage change in the terminal between the switch and the capacity by division of capacity of the transistor's gate and drain (the commonly connected terminal side) overlapping capacity and the capacity represented by 212 which occurs when φRES turns off the NMOS transistor to enable to reset the terminal between the switch and the capacity more accurately to the power source's 208 electric potential. As a result, it is possible to set the absolute value of the infinitesimal change in voltage which occurs in the commonly connected terminal on the opposite side by division of capacity more accurately via the capacitor 202. Namely sensitivity improves, which has a great effect of enabling high-speed response and, therefore, contributing to less power consumption.

Figure 11:
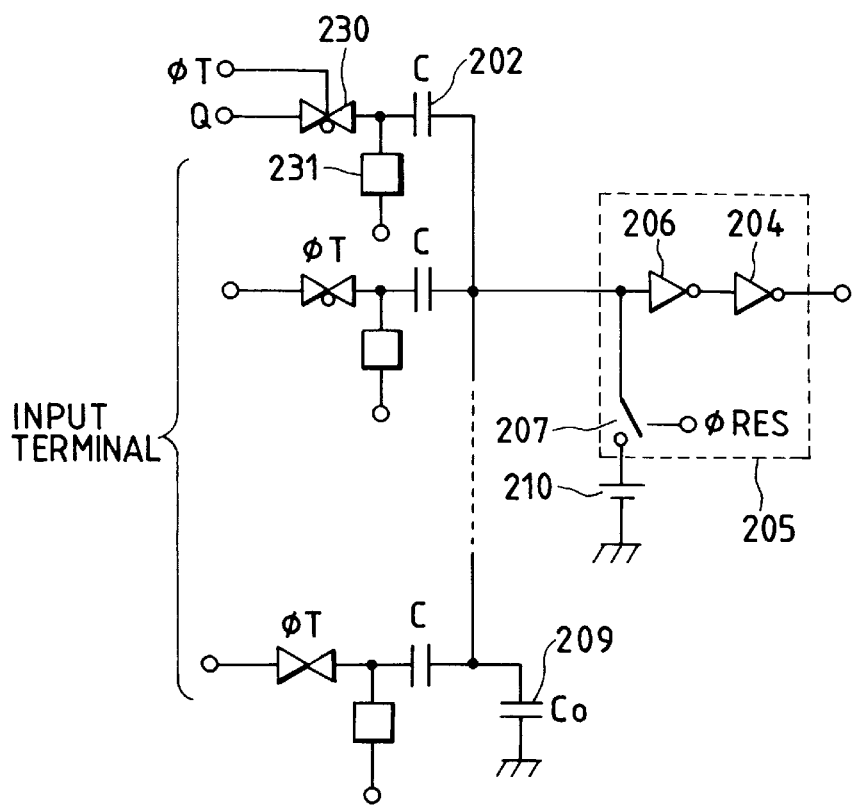
Figure 12:
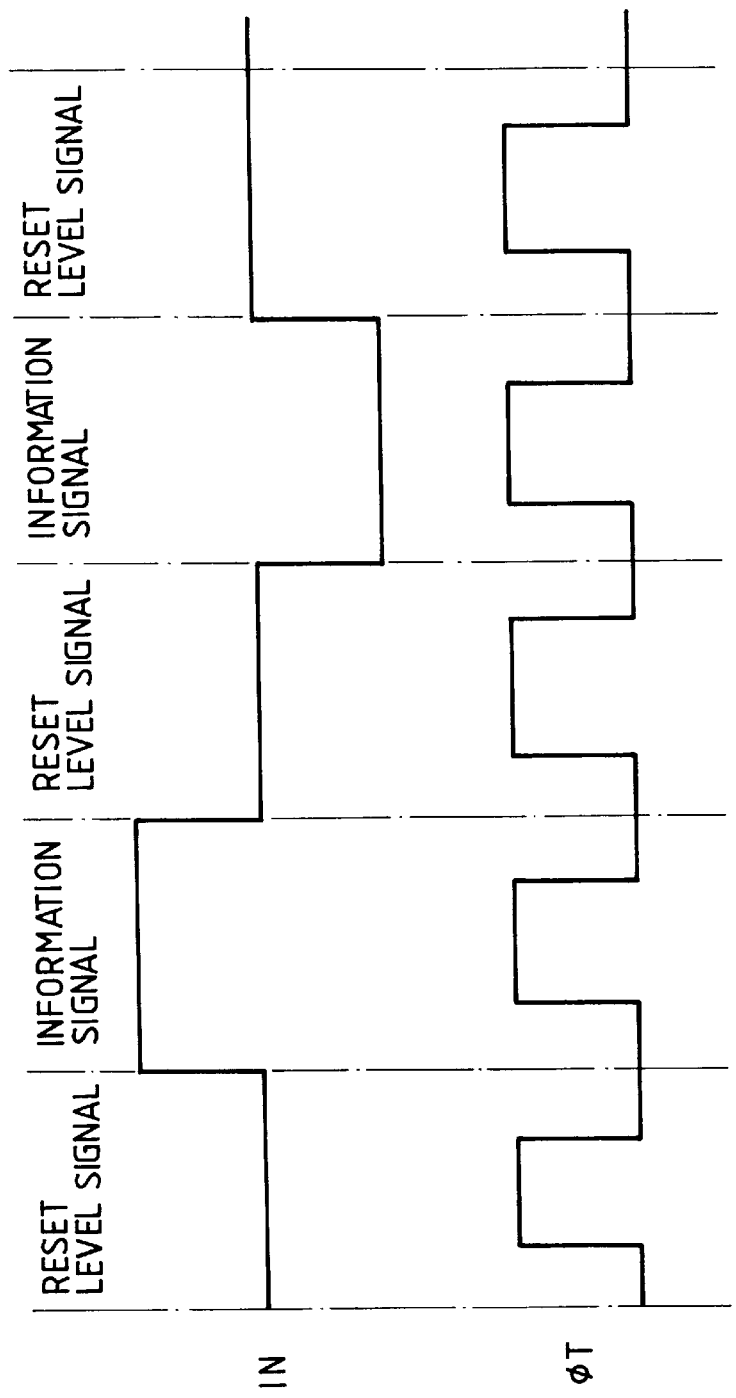

Incidentally, it goes without saying that the structure and the resetting means used here are not necessarily limited to the form in this embodiment as explained in embodiments 1 to 3. Also it is obvious that the signal transfer switch is not to be necessarily limited to either. Moreover, the configuration shown in FIG. 11 is also included in our invention. In FIG. 11, the switching means 230 is provided between the multi-input terminal and the capacity. It can be used as a resetting means as well as a switching means. Namely it is enough to distinguish between the period of the resetting status to open the switch by turning the input to the resetting electric potential and the period to open the switch by turning the input to an information signal. (FIGS. 12A and 12B show timing charts.) In that case too, it is possible to connect the structure 231 to be input with the pulse of the resetting means and the negative-phase-sequence pulse to the capacity's input terminal side. The operation is as explained above. It goes without saying that such a configuration is also included in our invention.

[Embodiment 5]

Figure 13:
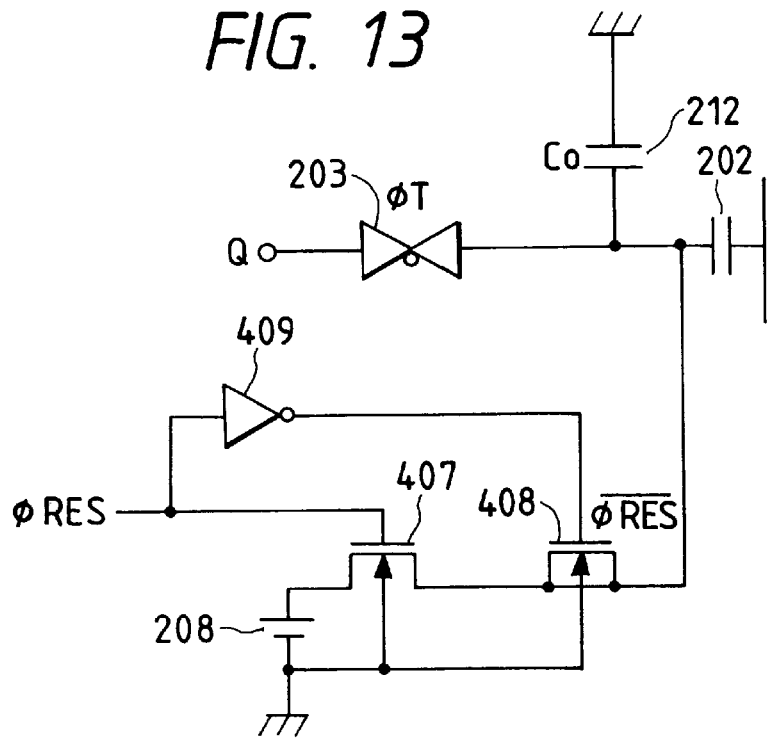
Figure 14:
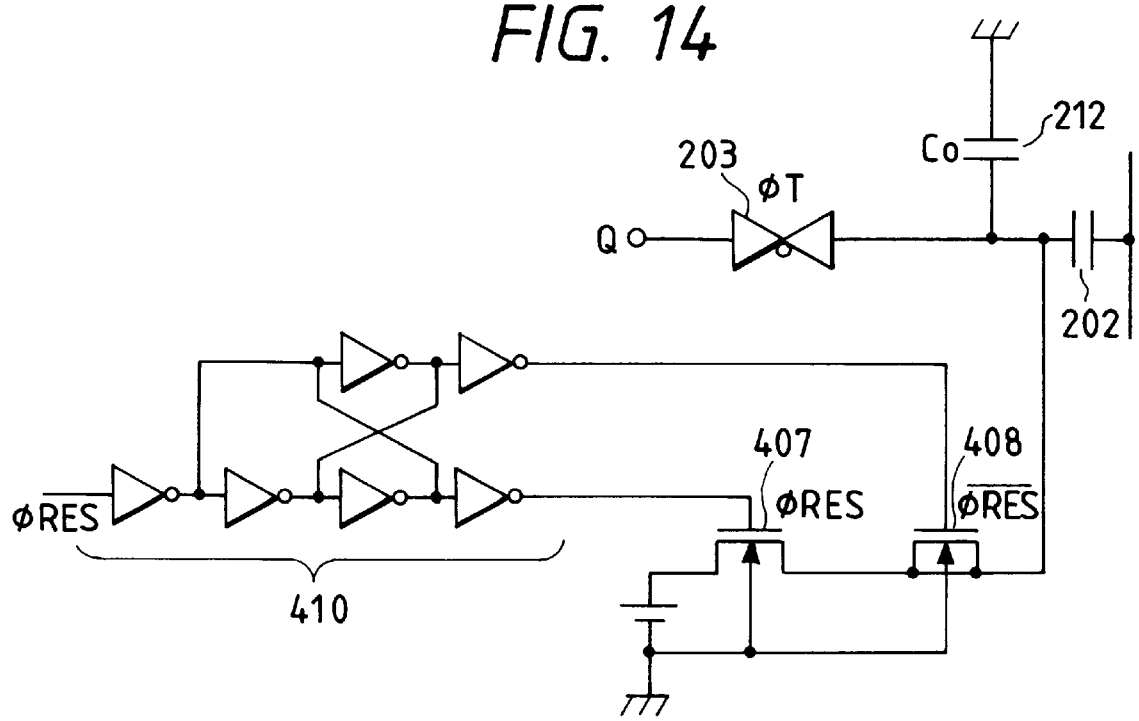

Embodiment 5 is explained below referring to FIGS. 13 and 14. FIGS. 13 and 14 show examples of circuits from the input terminal to the capacitor C (202) of FIG. 8. Regarding the pulses to be input respectively to the NMOS transistor, being the resetting means, represented by 407 and the structure represented by 408 in the example of FIG. 10, if the pulse φRES to the resetting means is later than φ$\overline{\text{RES}}$, the NMOS transistor 407, being the resetting means, is in the on status during such delay, so the terminal between the switch and the capacity remains at the resetting power source's 208 electric potential even if φ$\overline{\text{RES}}$ changes. Therefore, the effect of the structure represented by 408 lessens. Regarding this point, φ$\overline{\text{RES}}$ is input somewhat later than the input of φRES via the inverter in FIG. 13. By so doing, it is possible to draw out the effect of the structure 408 without loss.

In FIG. 14, φ$\overline{\text{RES}}$ and φRES are input at almost the same timing via a plurality of inverters. In that case, voltage change can be withheld little even while φ$\overline{\text{RES}}$ or φRES is changing. Such an example is not necessarily limited to the explained point in the example of this embodiment. It is also the same in the embodiments in the commonly connected terminal shown in embodiments 1 to 3. Also it goes without saying that the structure in this embodiment including the other structures explained in embodiments 1 to 4 is not necessarily limited to.

[Embodiment 6]

Figure 15:
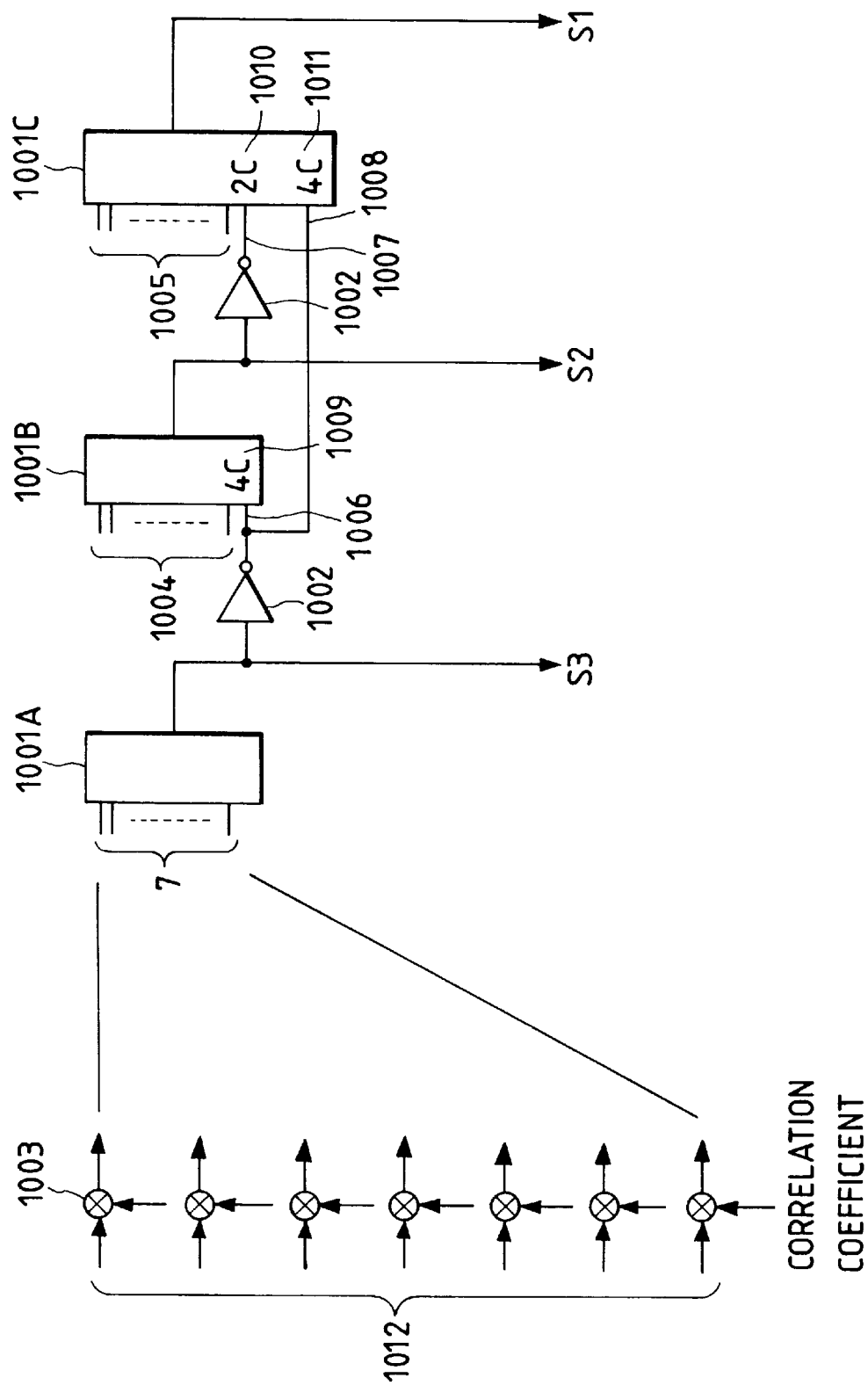

An embodiment to apply the semiconductor device of our invention to the correlator is explained below. FIG. 15 is an explanatory typical block diagram which best expresses the 7-input correlator of our invention. In the same figure, 1001A, 1001B and 1000C represent the majority operation circuit blocks and 1002 represents the inverter and 1003 the comparator. Signals similar to those input to the input terminal 1012 are also input to the terminals 1004 and 1005. 1006, 1007 and 1008 represent the terminals to input the output signal from the majority operation circuit block in the previous step and 1009, 1010 and 1011 represent the capacity values to be connected in correspondence respectively to 1006, 1007 and 1008 when C is let equal the capacity connected to the ordinary input terminal. In FIG. 15, each signal is first input to the comparator 1003 together with the correlation coefficient. The comparator 1003 outputs high level if each signal and the correlation coefficient agree and low level if they don't. The comparator's 1003 output is input to the majority operation circuit block 1001.

If the comparator's 1003 output is input to the 7-input majority operation circuit block 1001A, for example, high level is output from the majority operation circuit block 1001A if the number of high levels is the majority, i.e. if four or more inputs out of seven inputs are at high level. Likewise the high-level signal is output, for example, if six or more inputs are at high level in the 11-input majority operation circuit block and if seven or more inputs are at high level in the 13-input majority operation circuit block. S3 of Table 1 shows the 7-input majority operation circuit block's output values per number of high levels of the input. Then the 7-input majority operation circuit block's 1001A output is put through polarity inversion in the inverter 1002 and is impressed to the majority operation circuit block's 1001B weighted input terminal as shown in FIG. 15.

Figure 16:
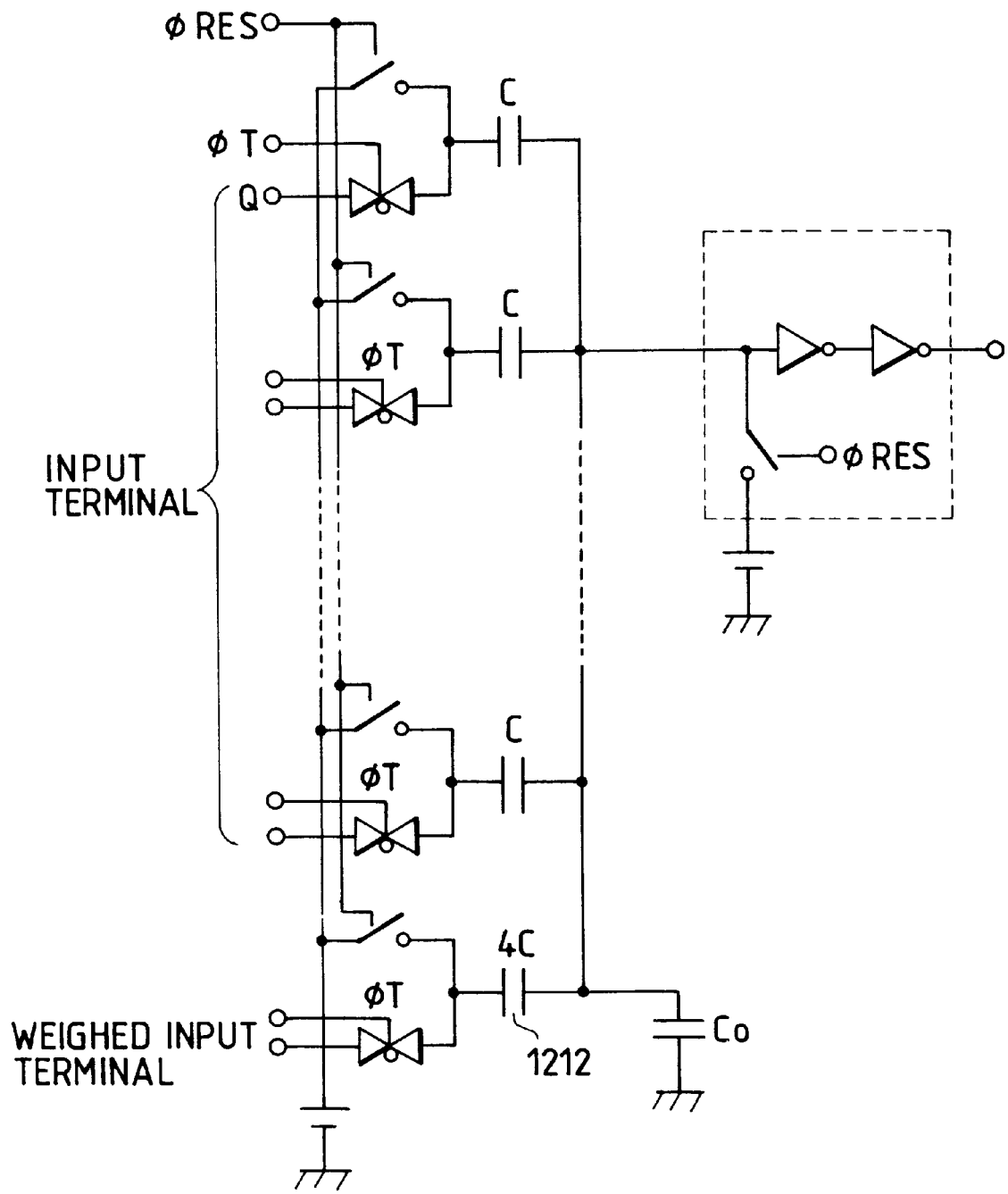

FIG. 16 shows the circuit configuration of the majority operation circuit block 1001B. It shows a circuit where weighting is available. In the same figure, 1212 represents the capacitor which has a capacity value about four times that of the capacity 1202 to be connected to the other input terminal route. The same circuit can be regarded as an 11-input majority operation circuit of a configuration of, letting C equal the capacitor value to be connected to the input terminal route, 11 pieces of C being commonly connected, of which four C's are impressed with the signal from the weighted input terminal and the other seven terminals of which are impressed with the same signal as the one input to 1001A. The weighted input terminal in the next step is impressed with low level as explained earlier, for example, if four or more inputs out of seven inputs of the seven input terminals are at high level (i.e. when the result of the first step is high level). Moreover, the 11-input majority operation circuit judges high level to be the majority in total and outputs high level in the next step if six or more inputs out of seven inputs of the signals impressed to the input terminals except for the weighted input terminal in the next step are at high level. Also it outputs low level in the next step if four or more inputs and five or less inputs out of seven inputs are at high level, since it is not the majority. The weighted input terminal in the next step is impressed with high level, meanwhile, if three or less inputs out of seven inputs are at high level, since the 11-input majority operation circuit outputs low level in the first step. High level is output from the next step onwards if two or more inputs and three or less inputs out of seven inputs are at high level, being judged that high level is the majority in the next step, since 4+2 or 4+3 is 6 or more. Low level is output from the next step onwards if 1 or less input is at high level, since 4+0 or 4+1 is 6 or less.

S2 of Table 1 shows the majority operation circuit block's 1001B output values per number of high levels of the input. S1 of Table 1 shows the output to be obtained by also making the majority operation circuit block 1001C operate by impressing the inverted signal of the majority operation circuit block's 1001A and the majority operation circuit block's 1001B output to two weighted terminals having capacity values respectively of four times and two times. By the configuration above, it is possible to output the number of inputs out of a plurality of inputs the correlation coefficient of which agrees with the signal by converting it into a 3-digit binary number as shown in Table 1.

Figure 17:
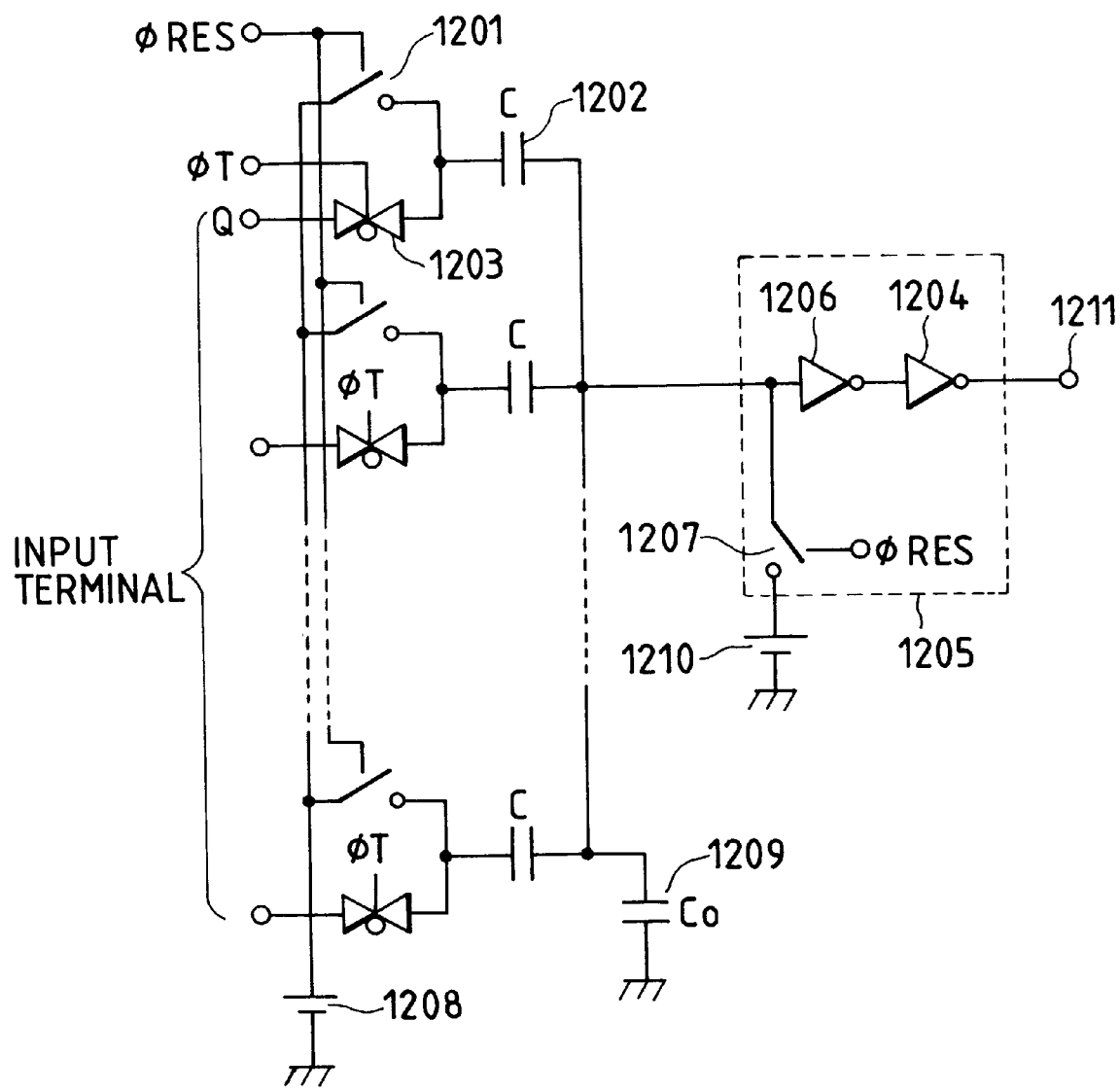

FIG. 17 is a typical circuit diagram of the majority operation circuit block 1001A. It shows a circuit where weighting is not available. In the same figure, 1201 typically represents the reset switch, 1020 the capacitor, 1203 the signal transfer switch, 1205 the sense amplifier, 1206 the sense amplifier's 1205 inverter, 1204 the sense amplifier's 1205 second inverter, 1207 the second reset switch for resetting the inverter, 1208 the resetting power source, 1210 the second resetting power source, 1211 the output terminal and 1209 the parasitic capacity on the commonly connected end of the capacitor 1202. It is not necessarily limited to, however.

FIGS. 18A to 18C show an example of the operation timing in this embodiment. The operation is explained below referring to the same figure. First, one end of the capacitor 1202 is reset by the reset pulse φRES. As the resetting voltage, if the supply voltage is 5 V -based, for example, 2.5 V, or about its half, is used. The resetting voltage is not necessarily limited to that. It may as well be another voltage. In that case, the sense amplifier's 1205 inverter's 1206 input terminal is reset almost simultaneously by making the reset switch 1207. In that case, a value near the logical inversion voltage to invert the inverter's 1206 output is chosen as the resetting voltage. If the reset pulse φRES is turned off, each resetting electric potential is held across the capacitor 1202.

Then if the transfer switch 1203 is made by the transfer pulse φT, the signal is transferred to one end of the capacitor 1202 and the electric potential at one end of the capacitor 1202 changes, for example, from the resetting voltage of 2.5 V to 0 V, which corresponds to low level, or 5 V, which corresponds to high level. Now letting C equal the capacitor's 1202 capacity and $C_0$ the parasitic capacity's capacity value and assuming that N pieces of the capacitor 1202 are connected in parallel, the commonly connected end of the capacitor 1202 changes for one piece of input by the following amount from near the inverter's 1206 logical inversion voltage by division of capacity.

$\pm[C\times2.5/(C_0+N\times C)]\cdot|V|$

If the inverter's 1206 input-end voltage changes from the logical inversion voltage, the inverter's 1206 output-end voltage inverts accordingly. If signals are input respectively for N pieces of input, the sum of N pieces of division of capacity output is input to the inverter's 1206 input end.

TABLE 1

| Input | S3 | S2 | S1 |
|-------|----|----|----|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

In conclusion, if the number of high-level signals out of N pieces of input is the majority, the inverter's 1206 input end shifts to a higher electric potential than the logical inversion voltage and high level is output to the sense amplifier's 1205 output end 1211. If the number of low-level signals is the majority, low level is output to it. By the configuration above, the circuit of FIG. 17 functions as a majority operation circuit to output the logical value which is the majority of a plurality of inputs. While FIG. 15 shows the 7-input correlation operation circuit as an example, it goes without saying that it is not necessarily limited to and that it is easily possible to expand further to multi-input.

[Embodiment 7]

An embodiment to apply the semiconductor device of our invention to the analog-to-digital converter is explained below. FIG. 19 is an explanatory typical block diagram of the 3-bit accuracy analog-to-digital converter of our invention. In the same figure, 2001A, 2001B and 2001C represent the 1-input, 2-input and 3-input arithmetic and logic circuit blocks respectively and 2002 represents the inverter. 2003, 2004 and 2005 represent the terminals to input the output signal from the majority operation circuit block in the previous step and 2006, 2007 and 2008 the capacities to be connected in correspondence respectively to 2003, 2004 and 2005 when C is let equal the capacity connected to the ordinary input terminal. 2009 represents the analog signal input terminal. Also 2010 represents the set input terminal and 2011 and 2012 represent the capacity values to be connected in correspondence to each.

An example of using the 5-V power source is explained below. First the arithmetic and logic circuit block's sense amplifier input is to be reset to 0 V for 2001A and about 2.5 V for 2001B and 2001C. Also the signal input terminals 2003, 2004 and 2005 and the set input terminal 2010 are to be reset to 5 V. In that case, the signal input terminal 2009 is 0 V. Next, the set input terminal 2010 is to be set to 0 V and the input is to be changed from 0 V to the analog signal voltage. Then high level is output due to the arithmetic and logic circuit block's sense amplifier input electric potential exceeding the logical inversion voltage (assumed to be 2.5 V here) when the analog input signal becomes about 2.5 V or more in the arithmetic and logic circuit block 2001A. S3 of Table 2 shows the result. When the analog input signal is 2.5 V or more, the input terminal 2003 changes from 5 V, being the resetting electric potential, to 0 V. In that case, the electric potential change at the arithmetic and logic circuit block's sense amplifier input end is to be expressed as follows letting VA equal the analog input signal electric potential.

$$[C \cdot VA - 5 \times (C/2) - 5 \times (C/4)]/(C + C/2 + C/4)$$

It is known from the expression above that the arithmetic and logic circuit block 2001B outputs high level when the analog signal voltage VA is 3.75 V or more and that it outputs low level when the analog signal voltage VA is 2.5 V or more and less than 3.75 V. S2 of Table 2 shows the result. Likewise S1 of Table 2 shows the arithmetic and logic circuit block's 2001C output.

By the configuration above, it is possible to realize an analog-to-digital converter to output the analog signal voltage by converting it into a 3-bit digital signal as shown in Table 2 in a very small configuration and, in addition, with a high processing speed as well as less power consumption. While the 3-bit analog-to-digital converter is explained in this embodiment, it goes without saying that it is not necessarily limited to and that it is easily possible to expand to more bits. Moreover, while an example of the flush-type analog-to-digital converter using the capacity is explained in this embodiment, it goes without saying that our invention is not necessarily limited to that system and that a similar effect is obtained if, for example, it is applied to the encoder circuit section, etc. of the analog-to-digital converter of a system to perform analog-to-digital conversion by comparing the signal input to the resistor sequence and the standard signal by the comparator and encoding its result by the encoder.

TABLE 2

| Analog Input Signal Voltage | S3 | S2 | S1 |
| --- | --- | --- | --- |
| 0.0 ≦ VA < 0.625 | 0 | 0 | 0 |
| 0.625 ≦ VA < 1.25 | 0 | 0 | 1 |
| 1.25 ≦ VA < 1.875 | 0 | 1 | 0 |
| 1.875 ≦ VA < 2.5 | 0 | 1 | 1 |
| 2.5 ≦ VA < 3.125 | 1 | 0 | 0 |
| 3.125 ≦ VA < 3.75 | 1 | 0 | 1 |
| 3.75 ≦ VA < 4.375 | 1 | 1 | 0 |
| 4.375 ≦ VA < 5.0 | 1 | 1 | 1 |

Also, while examples of the correlation operator and the analog-to-digital converter are explained in the embodiments above, our invention is not necessarily limited to them. It goes without saying that a similar effect is obtained if it is otherwise applied to various logic circuits, e.g. the digital-to-analog converter and the adder. When composing a digital-to-analog converter in particular, it is possible to realize binary digital-to-analog conversion by, letting C equal the capacity to be input with LSB data, doubling it consecutively as 2C, 4C, 8C as the order of the bit rises. In that case, it is enough to make a configuration to receive the terminal of the commonly connected capacity with the source follower amplifier.

Also, as explained above, the total capacity of the capacity means is, when C is let equal the minimum capacity of the capacity means connected to the multi-input terminal, almost an odd number times C in the circuit block of the terminal on one side of the capacity means corresponding to each multi-input terminal being commonly connected to perform output to the sense amplifier.

In the correlator, it is composed entirely of minimum values if it has no control input terminal. If it has the control terminal, the capacity to be connected to the control input terminal is an even number, being 2C, 4C and the total with the odd-number input terminals is almost an odd number times C as explained in the previous embodiment. Such a configuration brings about an effect to be able to improve the processing accuracy since it is possible to clarify whether larger or smaller than the desired standard value.

The correlator has been explained. In the binary digital-to-analog converter, if C is let equal the least significant bit LSB signal input capacity, it is doubled consecutively as 2C for the next bit, 4C for the next bit and so on. As a result, the total of the capacity of the multi-input terminal is almost an odd number times C to enable to realize a high-accuracy digital-to-analog converter. Also in the analog-to-digital converter too, it is possible to set the total value of the capacity to be connected to the multi-input terminal each to an odd number or almost an odd number times the minimum capacity value by setting the division number to an odd number, e.g. 1 for the division number to judge clearly whether the analog signal level is ½ the full range or more or less than ½ the full range and 3 further for the division number to judge whether it is ¼, ²⁄₄, ¾ or ⁴⁄₄. Such a configuration enables high-accuracy operation, so it is possible to realize high-speed operation with little power consumption without providing an unnecessarily large capacity means.

[Embodiment 8]

Figure 20:
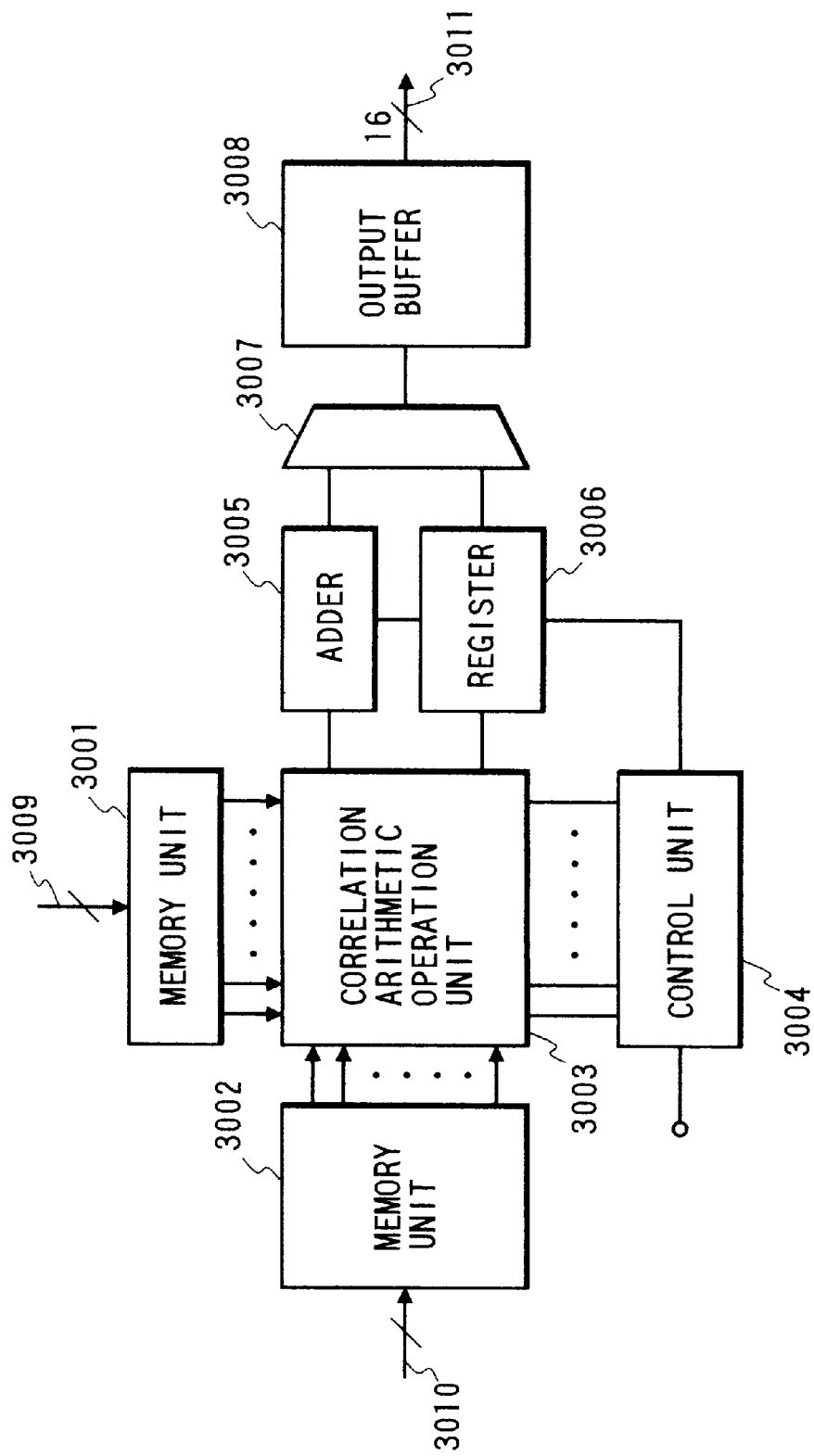

Embodiment 8 of our invention is explained below referring to FIG. 20. In embodiment 8, the semiconductor device of our invention is merged into conventional circuit technology to realize a movement detection chip. In the same figure, 3001 and 3002 represent the memory units to store standard data and reference data respectively, 3003 represents the correlation processing section, 3004 the control unit to control the whole chip, 3005 the correlation operation result addition processing section, 3006 the register to store the minimum value of the addition result of 3005, 3007 the comparator and the part to store the address of the minimum value and 3008 the output buffer and the output result storage. The standard data sequence is input to the terminal 3009 while the reference data sequence to be compared with the standard data sequence is input from the terminal 3010.

The memory units of 3001 and 3002, which consist of the SRAM, are composed of the ordinary CMOS circuit. The data sent to the correlation processing section of 3003 goes through parallel processing in a configuration by the correlator of our invention. Not only a very high speed is achieved but also a small number of elements are required for the configuration as well as the chip size becoming smaller for cost down. The correlation operation result is scored in the addition processing section of 3005. It is compared with the register 3006, where the maximum correlation operation result (the add value becomes the minimum value) up to before the correlation operation above, in the output buffer and the output result storage 3008.

If the operation result this time is even smaller than the minimum value up to the last time, the result is stored in the register 3006 anew. If the result up to the last time is smaller, the result is maintained. By performing such operation, the maximum correlation operation result is always stored in the register 3006. After the operation of all data sequences has ended, the result is output from the terminal 3011. While the control unit 3004, the addition processing section 3006, the registers 3006, 3007 and 3008 are composed of the ordinary CMOS circuit this time, the addition processing section 3005, etc. in particular can realize parallel addition by using the circuit configuration of our invention to realize high-speed processing. As explained above, not only high speed and low cost but also small current drain and low power can be realized due to operation being executed on a capacity basis. Therefore, our invention is also suitable for portable equipment, e.g. the 8-mm VTR camera, etc.

[Embodiment 9]

Figure 21A:
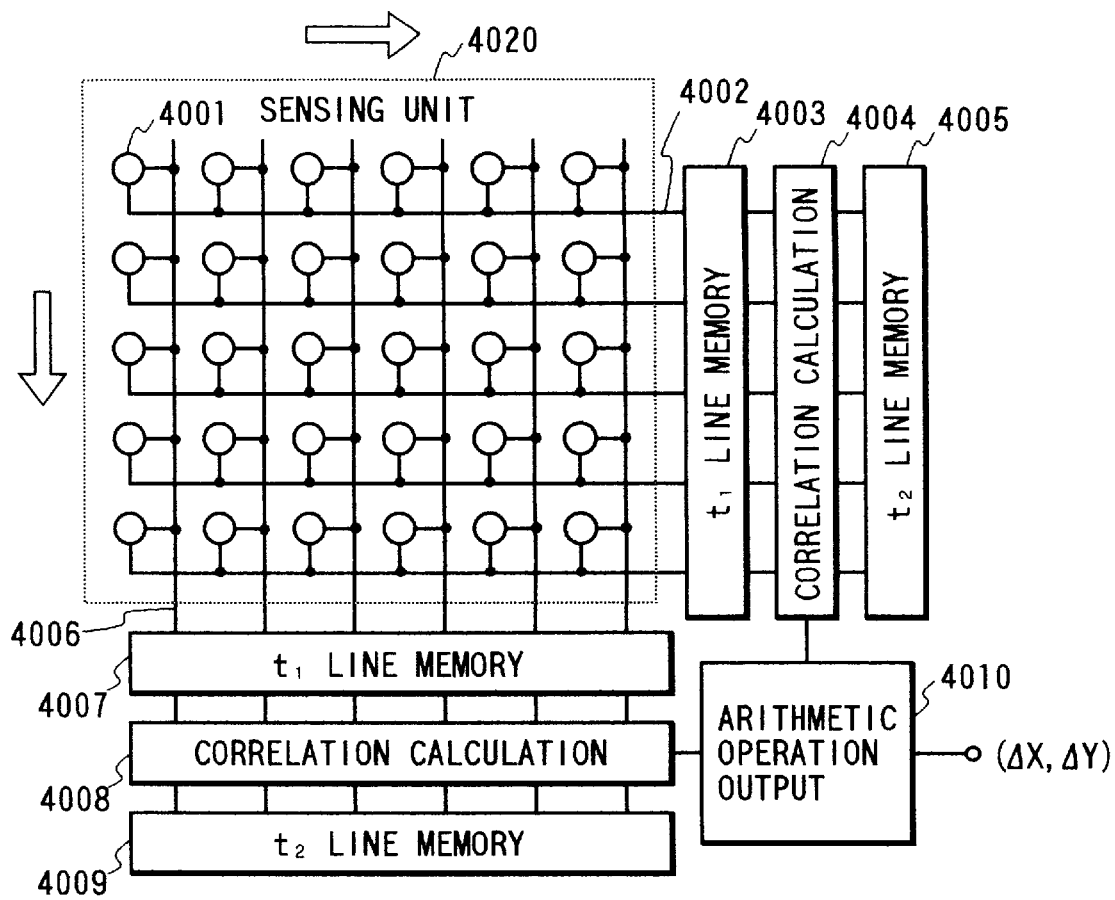
FIGS. 21A and 43A are schematic block diagrams for explaining respective signal processing systems using the semiconductor device of our invention.
Figure 21B:
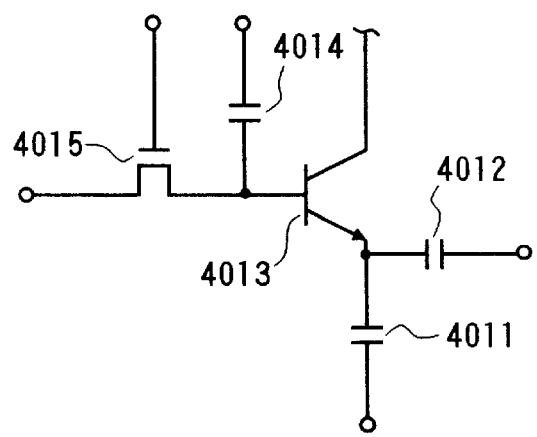
FIGS. 21B and 43B are schematic equivalent circuit diagrams for explaining respective examples of the pixel section configuration.
Figure 21C:
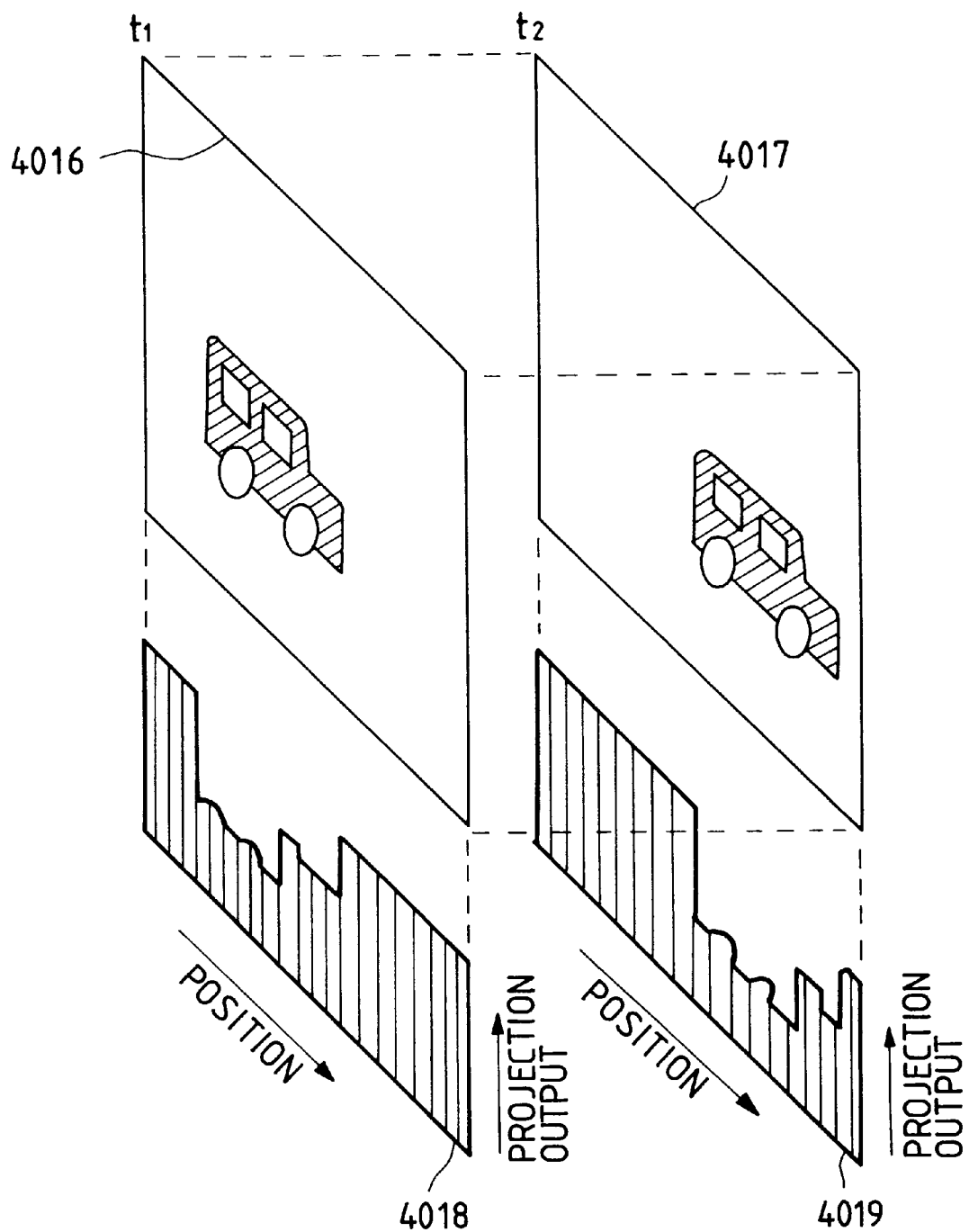
FIGS. 21C and 43C are explanatory diagrams for explaining respective contents of operation.

Embodiment 9 of our invention is explained below referring to FIGS. 21A to 21C. In embodiment 9, a chip (high-speed image processor) to perform high-speed image processing before reading image data by merging the semiconductor device of our invention into the photosensor (solid-state image sensor) is shown. FIG. 21A is a general block diagram, FIG. 21B is a pixel section block diagram and FIG. 21C is a diagram to show the content of operation. In FIGS. 21A to 21C, 4001 represents the sensing unit, 4002, 4005, 4007 and 4008 represent the memory units, 4004 and 4008 the correlation processing sections, 4010 represents the operation output section, 4011 and 4012 represent the capacity means to connect the optical signal output terminal and the output bus lines represented by 4002 and 4006, 4013 represents the bipolar transistor, 4014 the capacity means connected to the bipolar transistor's base region and 4015 the switch transistor. The image data incident to the image data sensing unit 4020 is photo-electrically converted in the bipolar transistor's 4013 base region.

The output corresponding to the photo-electrically converted optical carrier is read to the emitter of the bipolar transistor of 4013 and pushes up the output bus line electric potential via the capacity means 4011 and 4012. By the operation above, the addition result for the pixel in the vertical direction is read to the memory of 4007 while that for the pixel in the horizontal direction is read to the memory of 4003. Namely it is possible to output the addition results in the X and Y directions of any region of the sensing unit 4020 if the region to raise the bipolar's base electric potential is selected by the decoder (not shown in the figure), etc. via the pixel section's capacitor 4014. If an image represented by 4016 is input at time t1 and one represented by 4017 is input at time t2 as shown in FIG. 21C, for example, the output results of having added respectively in the Y direction are to be represented by 4018 and 4019. Such data is stored respectively in the memories 4007 and 4009 of FIG. 21A. Also, as known from 4018 and 4019 of FIG. 21C, the two kinds of data shifting in correspondence to the movement of the image, it is possible to detect the movement of an object on a 2-dimensional plane in a very simple mode if such a shift is calculated in the correlation processing section of 4008. Incidentally, data storage from the sensing unit 4020 can be switched easily to the line memories 4003 and 4005.

It being possible to install the correlation operation device of our invention in 4004 and 4008 of FIG. 21A, the number of elements is smaller than in conventional circuits. In particular, the elements can be arranged at the sensor pixel pitch. While the configuration above is for operation on a sensor's analog signal basis, it goes without saying that it is also possible to meet digital correlation by installing the analog-to-digital converter of our invention between the memory unit and the output bus line. Also while the bipolar type is used in the sensor of our invention, it goes without saying that, even if the MOS type, a configuration of the photodiode only instead of installing the amplifier transistor is also effective. Moreover, while correlation operation between data sequences at different times is performed in the embodiment, it is possible to realize pattern recognition too if the X and Y projection results of a plurality of pieces of pattern data to be recognized are stored in 1 of the memory units beforehand.

As explained above, by merging our invention into the pixel input section:

(1) It is possible to realize the movement detection and pattern recognition processes at high speed since data read parallelly and collectively is put through parallel processing instead of being processed after having been read serially from the conventional sensor.

(2) It is possible to realize the following high-performance products at low cost since it is possible to realize image processing using 1 sensor chip without increasing the peripheral circuits. Namely it is possible to realize control to direct the TV screen towards the user, control to direct the air conditioner wind direction towards the user and 8-mm TVR camera tracking control as well as such high-performance products as the label recognition device in the factory, the automatic figure recognition and acceptance robot, the car-to-car distance control device, etc.

While merger into the image input section is explained above, it goes without saying that our invention is effective for recognition, etc. processing not only of image data but also of voice.

[Embodiment 10]

Next, embodiment 10 is explained below referring to drawings.

Figure 22:
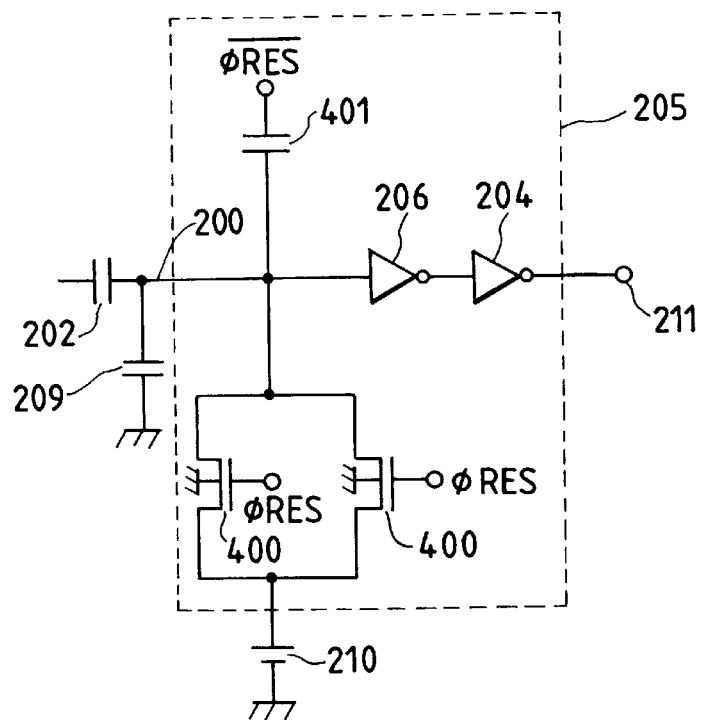

A means to reset the commonly connected capacity terminal 200, etc. is explained in detail below referring to FIG. 22. FIG. 22 shows an example of details from the capacitor C (202) of FIG. 2 to the sense amplifier's 205 output via the commonly connected terminal 200. In this example, two NMOS transistors 400 are used as the means to reset (the switch 207 of FIG. 2) the commonly connected terminal 200 by the power source 210. The drive pulse φRES for resetting is input to each NMOS transistor's 400 gate. As the NMOS transistor 400 is used here, the commonly connected terminal 200 is reset by the power source 210 while the control signal pulse is at high level, for example, and then the control signal pulse is turned low level to turn off the NMOS transistor 400 to turn the commonly connected terminal 200 to the floating status. Meanwhile, the φRES signal's negative-phase-sequence pulse φ$\overline{\text{RES}}$ (inverted signal) is input to the commonly connected terminal 200 via the capacitor 401.

As a result of such a structure being connected, the voltage change by the NMOS transistor's gate and drain (the commonly connected terminal side) overlapping capacity which occurs when the control signal pulse φRES turns on/off the NMOS transistor 400 and the voltage change by the capacitor 401 to be supplied with the control signal pulse's φRES negative-phase-sequence φ$\overline{\text{RES}}$ offset one another. Therefore, it is possible to mutually offset the voltage change in the commonly connected terminal 200 to enable to reset the commonly connected terminal 200 more accurately to the power source's 210 resetting electric potential at higher speed. If resetting with the control signal pulse φRES changing from 0 V to 5 V and its negative-phase-sequence φ$\overline{\text{RES}}$ changing from 5 V to 0 V, for example, it is possible to cancel such changes since it is possible to impress them as mutually negative-phasesequence respectively via the NMOSFET 400 and the capacitor 401. Also if the voltage of the commonly connected terminal 200 is set to near the inverter's 206 logical inversion voltage, for example, the nearer the inverter's 206 logical inversion voltage that value, the more is it possible to perform output in correspondence to the infinitesimal change in the signal which occurs in the commonly connected terminal 200. Namely it is obvious that sensitivity improves, which has a very great effect, it goes without saying, of enabling high-speed response and, therefore, contributing to less power consumption. While the nearer the NMOS transistor's 400 gate-drain overlapping capacity the value of the capacitor 401 used here, the more desirable is it since reset to near the power source's 210 resetting electric potential. It is not necessarily limited to, however. It goes without saying that a great effect is also brought about even if the value differs, e.g. a half value.

In FIG. 22, two pieces of the NMOS transistor as the resetting means are connected in parallel. Dividing into a plurality of transistors yields the following advantages over resetting with 1 NMOS transistor.

Figure 23A:
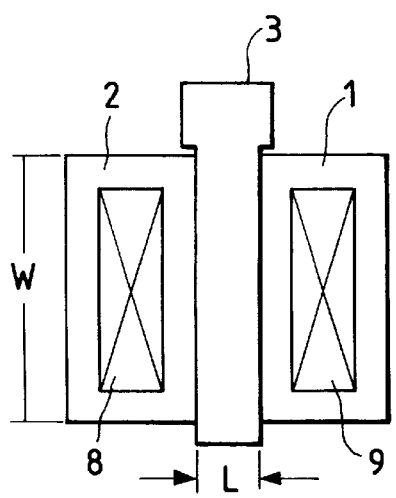
FIGS. 23A, 23B and 26A are typical plans for explaining respective examples of the MOS transistor configuration.
Figure 23B:
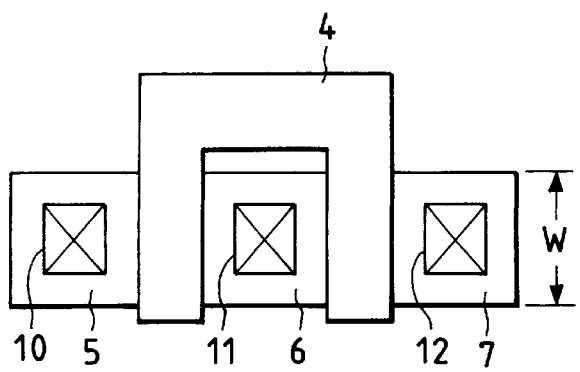

FIGS. 23A and 23B show simple layout drawings when making a configuration respectively with one transistor and two transistors for the NMOS transistor having the same gate width W. In FIG. 23A, one and two represent the source or drain region, three represents the gate and 8 and 9 represent the contacts. Also in FIG. 23B, though the scale of the drawing is different, 5, 6 and 7 represent the source or drain region, four represents the gate and 10, 11 and 12 represent the contacts. If dividing into a plurality, it is possible to make the source region 1 common as in the source region 6 shown in FIG. 23B to enable to decrease the area of the active region of the reset MOSFET of the channel length L=1 μm and the channel width W=4 μm by about 20%.

Figure 24:
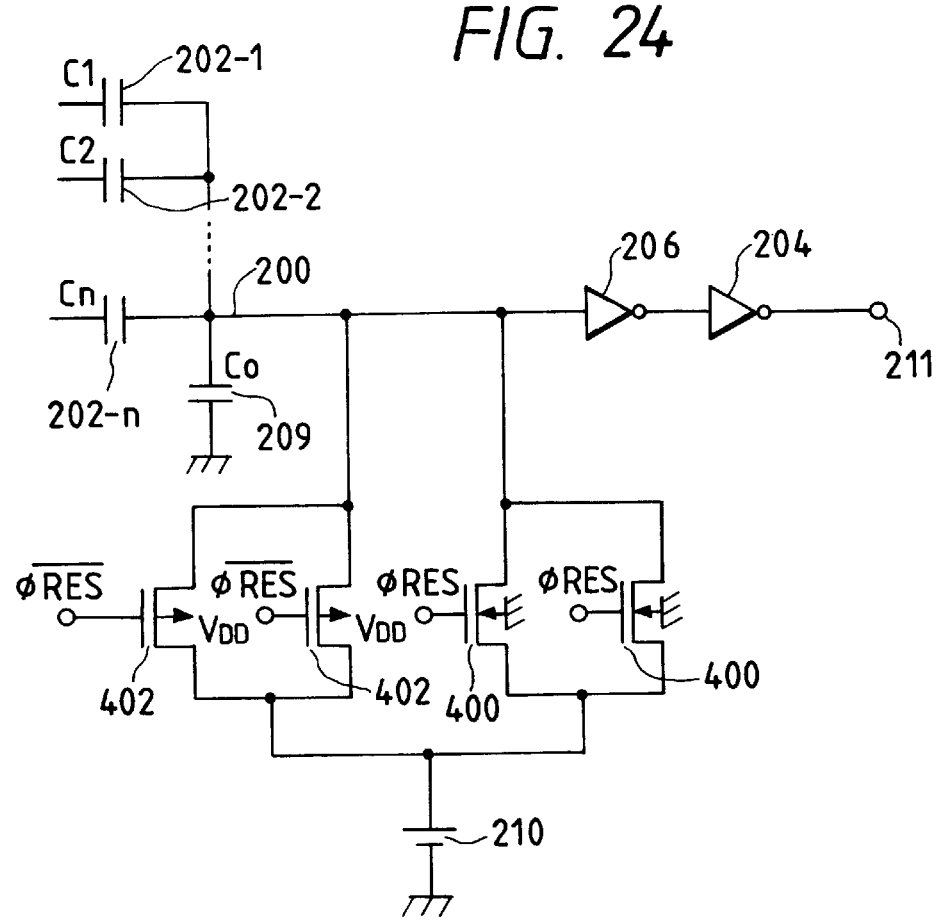

FIG. 24 shows an example of using the PMOS transistor as the structure. In FIG. 24, two pieces of the PMOS transistor 402 are used instead of the capacitor 401 shown in FIG. 22. φ$\overline{RES}$ is input to the PMOS transistor's 402 gate and the drain side is connected to the commonly connected terminal 200 while the source side is connected to the resetting power source 210. The effect is the same as in the capacity explained in FIG. 22. The NMOS 400, which switches on/off by the control signal pulse φRES, and the PMOS 400, which switches on/off by φ$\overline{RES}$, offset the instantaneous change in the commonly connected terminal 200 at on/off. As a result, sensitivity improves, which has a great effect of enabling high-speed response and, therefore, contributing to less power consumption. Namely it is possible to set the resetting voltage accurately for the capacitor $C_0$ 209 on the commonly connected terminal 200 side at high speed.

[Embodiment 11]

Figure 25:
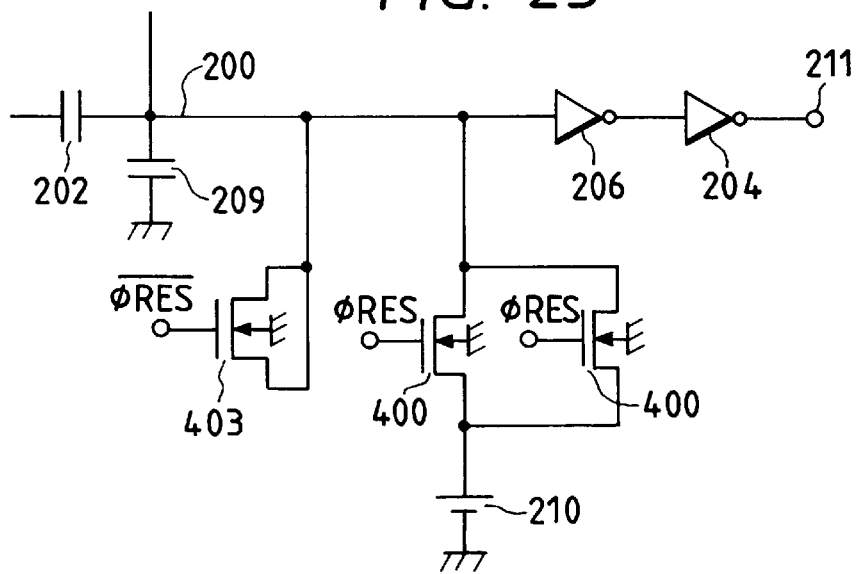

Embodiment 11 is an example of enabling to reset the commonly connected terminal 200 more precisely to the resetting power source's 210 electric potential. The semiconductor device of embodiment 11 is explained below referring to FIG. 25. FIG. 25, like FIGS. 22 and 24, shows an example of the detailed drawing from the capacitor C (202) of FIG. 2 to the sense amplifier's 205 output 211 via the commonly connected terminal 200. In this example, the NMOS transistor 400 is used as divided into two as the means to reset the commonly connected terminal 200 by the power source 210. The drive control signal pulse φRES for resetting is input respectively to the NMOS transistor's 400 gate. As the NMOS transistor 400 is used here, the commonly connected terminal 200 is reset by the power source 210 while the control signal pulse φRES is at high level, for example, and then the control signal pulse φRES is turned low level to turn off the NMOS transistor 400 respectively to turn the commonly connected terminal 200 to the floating status. Meanwhile, the one represented by the NMOS transistor 403 is used as the structure to be input with the φRES signal's negative-phase-sequence pulse φ$\overline{RES}$. That structure has a conductive semiconductor impurities layer which is different from the semiconductor substrate to be formed by sandwiching the electrode to be impressed with the negative-phase-sequence pulse φ$\overline{RES}$ on the semiconductor substrate and the semiconductor impurities layer is connected together electrically to the commonly connected capacity terminal 200. Namely the NMOS transistor's 403 source and drain being commonly connected, the capacity from the gate electrode to be impressed with the negative-phase-sequence pulse φ$\overline{RES}$ to the commonly connected terminal 200 side becomes twice the gate-drain capacity to enable to just offset each other with the two pieces of the NMOS transistor 400 to be impressed with the positive-phase-sequence pulse φRES.

In FIG. 25, the structure shown has its NMOS transistor's drain and source being commonly connected and its gate-drain capacity is connected to the commonly connected terminal 200. While the NMOS transistor's 400 capacity is mainly the transistor's gate and drain (the commonly connected terminal 200 side) overlapping capacity, its capacity value is a quantity which depends on the amount of source/drain impurities, transistor forming thermal hysteresis, etc. Therefore, it is fairly difficult to design and create accurately. In addition, there is gate voltage dependency. A structure which is considered to have the same capacity also including the voltage dependency as the NMOS transistor 400 is shown in FIG. 25. The capacity of such a structure can be set to a capacity value which is almost equal to that also including the voltage dependency of the NMOS transistor 400 being used as the resetting means. Therefore, it is possible to offset the voltage change in the commonly connected terminal 200 by division of capacity with the capacitor 209 shown in FIG. 22 to enable to reset the commonly connected terminal 200 more accurately to the power source's 210 electric potential.

If the commonly connected terminal's 200 voltage is set to near the inverter's logical inversion voltage, for example, the nearer the inverter's logical inversion voltage that value, the more is it possible to perform output in correspondence to the infinitesimal change in the signal which occurs in the commonly connected terminal 200. Namely it is obvious that sensitivity improves, which has a very great effect, it goes without saying, of enabling high-speed response and, therefore, contributing to less power consumption. Moreover, if the sum total of the gate capacity value of the MOS transistor as the resetting means is set to twice or almost twice the gate capacity of such a structure, the total capacity values become almost equal since the source and the drain are common in the structure. Also each gate electrode is impressed with the negative-phase-sequence pulse, so it is possible to reset the commonly connected terminal 200 more accurately to the power source's 210 electric potential. Further desirable is that, if the sum total of the gate width of the MOS transistor as the resetting means is set to twice or almost twice the gate width of such a structure, the total gate overlapping capacity values become almost equal since the source and the drain are common in the structure. Also each gate electrode is impressed with the negative-phase-sequence pulse, so it is possible to reset the commonly connected terminal 200 more accurately to the power source's 210 electric potential.

Figure 26A:
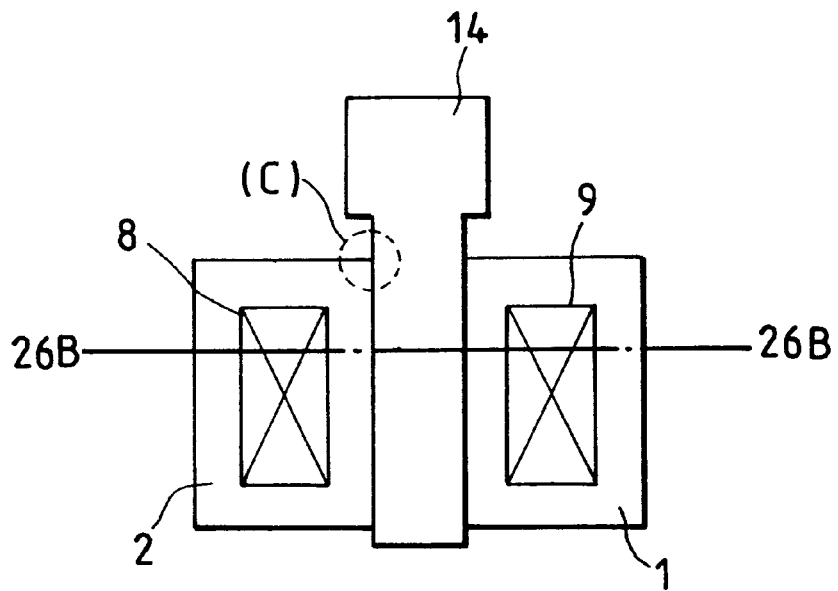
Figure 26B:
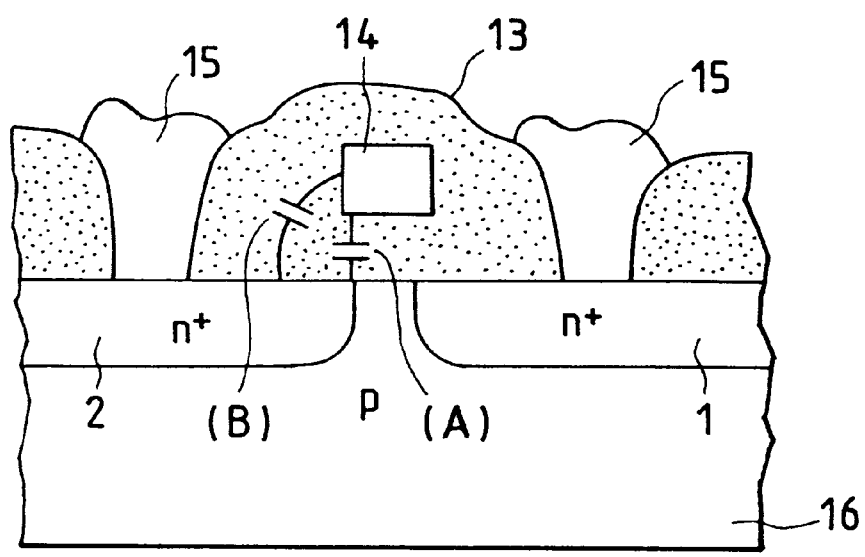
FIG. 26B is a typical sectional view taken along a line 26B—26B for explaining an example of the MOS transistor configuration.

It is further desirable if divided into two MOSFET's of the same type, i.e. the P type if the MOSFET of the resetting means is the P type and the N type if it is the N type, and if also the type of the structure's semiconductor impurity layer is the same as the type used in the resetting means above. The feed through of the voltage of the terminal 200 of the capacity being commonly connected when turning off the MOSFET, being the resetting means, depends on the MOSFET's gate and drain overlapping capacity as explained earlier. Such overlapping capacity is explained below referring to FIGS. 26A and 26B. In the FIGS. 1 and 2 represent the source or the drain, 8 and 9 the contacts, 14 represents the gate electrode, 15 the source or drain electrode and 16 the semiconductor substrate. The figures show an example of the NMOS transistor as a whole. The component of the overlapping capacity above is expressed as the sum of component A attributed to the drain region directly under the gate electrode 14, the fringe effect component B depending on the channel width W and the fringe effect component C at the edge which is the drain edge vertical to the channel width W direction as shown in FIGS. 26A and 26B. It is possible to set the capacity expressible by components A and B of those components almost equal if matched with the MOSFET, being the resetting means, and the structure to be impressed with the negative-phase-sequence pulse for the type of the MOSFET and the sum total of the gate channel width W. To match the capacity value for the fringe effect component C at the edge, meanwhile, it is necessary to match the type of the MOSFET and the number of edges for the MOSFET, being the resetting means, and the structure to be impressed with the negative-phase-sequence pulse. Namely, as there are a total four drain edges for one of the MOSFET's drain and source having been made the common terminal as the structure, it is necessary to create four drain edges likewise by dividing the MOSFET, being the resetting means, into 2. If not divided, there are two drain edges, so the capacity is short by the difference. When the MOSFET, being the resetting means, is turned off, therefore, the feed through of the capacity difference ΔC is impressed to the terminal 200 of the capacity being commonly connected, affecting accuracy. Letting Cr equal the drain capacity as viewed from the gate of the MOSFET, being the resetting means, Cr' the capacity as viewed from the structure's gate, Co the capacity which is parasitic on the terminal 200 of the capacity being commonly connected and $V_{DD}$ the control signal voltage input to the gate, the feed through quantity above is:

$$\Delta V = (Cr' - Cr)V_{DD}/(Cr + Cr' + Co)$$
$$= \Delta CV_{DD}/(Cr + Cr' + Co)$$

where ΔC is Cr'−Cr.

As the capacity of the drain edge does not depend on the value of the channel width W, the smaller the channel width W, relatively the greater the value of such a capacity to present a problem in characteristics.

Also in principle there is no problem at all if the gate channel width W of each of the MOSFET's divided into two should be unequal. If the structure's channel width W is 10 μm, for example, the channel width W of the MOSFET of the reset element may be respectively to 15 μm and 5 μm. It goes without saying, however, that the MOSFET of completely the same type and size is more desirable in view of the problems in layout and otherwise delicate dispersion (the shape of the edge, diffusion of impurities, etc.) due to a difference in the pattern which comes arising during the process, etc. For a structure the channel width W above of which is 10 μm, it is more desirable to use two MOSFET's of the same type and size of W=10 μm as the resetting means.

Incidentally, while an example of all the NMOS transistors being connected is shown as the resetting means or the structure to be impressed with the negative-phase-sequence pulse in FIG. 25, it goes without saying that it is not necessarily limited to. It doesn't matter at all if the resetting means and the structure to be impressed with the negative-phase-sequence pulse are both the PMOS transistor or if, if a plurality of pieces are connected, both the NMOS and PMOS transistors are used as the resetting means and the structure to be impressed with the negative-phase-sequence pulse for each of them is had. If the reset element is the NMOS transistor, the structure may be supplied with the inversed-phase-pulse may be the PMOS transistor or vice versa.

[Embodiment 12]

Figure 27:
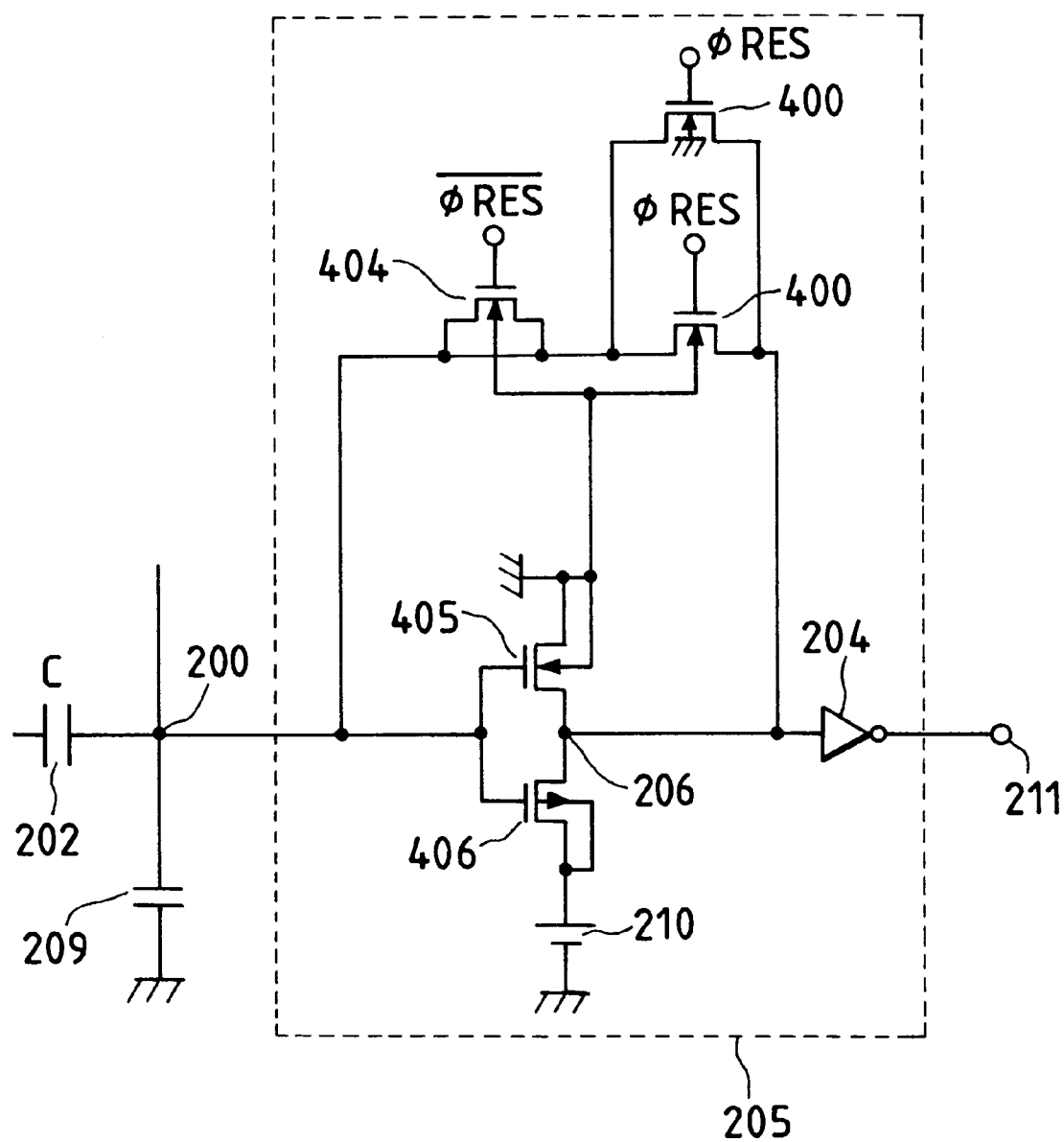

The resetting means according to Embodiment 12 of this invention is described in details with reference to FIG. 27. Like in FIGS. 22 and 24, an example of detailed drawings as seen through the terminal 200 commonly connected with Capacitor C (202) corresponding to the multi-input terminal of FIG. 2 extending to the output 211 of a sense amplifier 205 is shown. The sense amplifier 205 described here is not a mere inverter 206 illustrated in Embodiments 1 and 2 but is the output and input of the inverter 206 connected through the resetting means (a switch). A NMOS transistor marked by 400 is a resetting means. When this ransister is "on", the input and output terminals 200 of the inverter 206 are common, and are equal to the logical invertion voltage of the inverter 206. If the input and output terminals of the inverter 206 are separated in this condition, the sense amplifier will be very sensitive to slight changes in voltage allegedly resulting from actual input value Q at the terminals 200 whose capacitors are connected in common.

Structure 404 is a NMOS transistor with common source/drain described in Embodiment 11, in which the drain-gate capacitor and the source-gate capacitor add up in parallel to produce a capacity almost equivalent to NMOS 400 and apply negative-phase-sequence pulses $\phi\overline{RES}$ whose pulses are opposite to those of the resetting means at gate poles. The use of such a structure leads to the application of positive phase sequence pulses ϕRES and control sequence pulses with negative-phase-sequence thereto $\phi\overline{RES}$ to their respective NMOS transistors, which enables to cancel changes in voltage due to capacitors at each turn on and off of the pulse and to utilize the logical invertion voltage of the inverter to bring the input voltage of the inverter to a floating condition. As a result, sensitivity is enhanced, quick response is made possible contributing obviously to reduced power consumption. These are great improvements. In this Embodiment, a case of two NMOS transistors being connected thereto as resetting means and a NMOS transistor being connected thereto as a structure into which negative phase sequence pulses are applied is shown. However, this is not obviously the exclusive case, and other structures described in Embodiments 1 and 2 may be chosen. In addition, configuration in which a resetting means and a structure into which resetting means driving sequence pulses and negative phase sequence pulses are inputted are connected with a same terminal is not obviously limited to the one described in this embodiment and Embodiments 10 and 11.

[Embodiment 13]

Embodiment 13 according to this invention is described in details with reference to FIGS. 28 to 32B. In this embodiment, a resetting means provided with switching means between multiple input terminals and each capacitor and designed to reset the voltage between the capacitors and the sense amplifier 205 is described in details. In FIG. 28, Q1 to Qn are multiple input terminals comprising n terminals. 201 is a reset switch, 202 is a capacitor, 203 is a signal transfer switch, 205 is a sense amplifier, 206 is an inverter in the sense amplifier, 207 is a second reset switch designed to reset the inverter, 208 is a reset power source, 210 is a second reset power source, 211 is an output terminal, and 209 is a capacity typically showing the parasite capacity developing on one side commonly connected with the capacitors 202. This capacity is not limited to this.

FIGS. 29A to 29C are timing diagrams showing the operation of this embodiment. With reference to the diagram the operation of this embodiment is described as follows. To begin with, by means of reset sequence pulse φRES one end of the capacitor 202 is connected with the reset power source 208. If the power source voltage is for example 5 V, the reset voltage shall be adjusted to about a half of the voltage, in other words, 2.5 V. The reset voltage is not limited to this and any other voltage may be chosen. Almost at the same time, the input end 200 of the inverter 206 forming part of the sense amplifier 205 is connected with a second reset power source 210 by turning on a reset switch 207. However, there is obviously no restriction that this timing must be simultaneous. In this embodiment, at this time, a reset voltage of a value close to the logical inversion voltage at which the output of the inverter 206 is inverted is chosen. When the reset sequence pulse φRES is turned off, both ends of the capacitor 202 are maintained at their respective reset potential. Then, when a transfer switch is turned on by means of transfer sequence pulse φT, the signal is transfered on one side of the capacitor 202, and the electric potential on one end of the capacitor 202 changes from for example a reset voltage of 2.5 V to a low level of 0 V or a high level of 5 V. The operation thereafter is same as the one described in Embodiment 1, and depending on the input signal to the multiple input terminals, at the output terminal 211 of the sense amplifier 205 a low or high level output signal is outputted.

Figure 30:
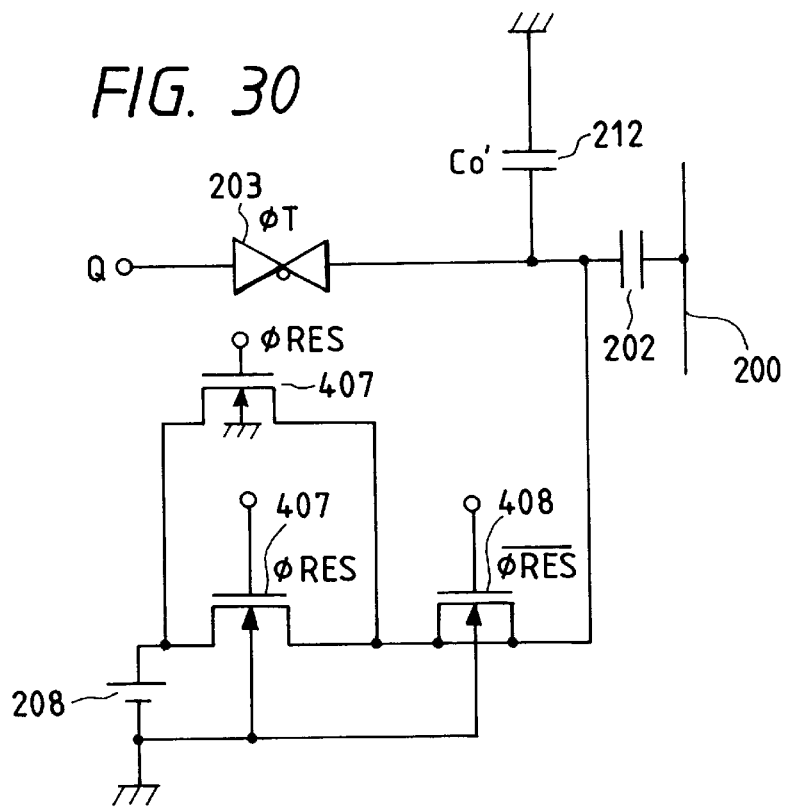

FIG. 30 is a diagram showing an example of circuit from the mutiple input terminals to the capacitor C (202) shown in FIG. 28. In FIG. 28, codes identical to those in FIGS. 26A and 26B have equivalent functions, and therefore detailed descriptions thereon are omitted. In this figure, 202 is a capacitor corresponding to the multiple input terminals, 203 is a signal transfer switch designed to transfer input signals to the capacitor 202 corresponding to the multiple input terminals, 208 is a reset power source designed to reset the input side of the capacitor 202 corresponding to the multiple input terminals, and 212 is a capacitor $C_0'$ of parasite capacity on the input side of the capacitor 202. In addition, as a means to reset the terminal between the signal transfer switch 203 and the capacitor 202 by means of a power source 208, a NMOS transistor divided into two parts 407 and a NMOS transistor 408 of a structure connected in series with the preceding NMOS transistor 407 are used. Reset drive sequence pulse φRES is inputted into the gates of the two NMOS transistors 407.

Here where NMOS transistors 407 are used, for example, according to the timing shown in FIG. 10 signal sequence pulse φRES is inputted, and while the electric potential is at a high level the terminal between the switch and the capacitor is reset by means of a power source 210, and then the electric potential is reduced to a low level and the terminal between the switch and the capacitor is kept in a floating condition. On the other hand, φRES signals and negative-phase-sequence pulse φ$\overline{RES}$ are inputted into a structure 408. This structure 408 has a semiconductor substrate and a conductive semiconductor inpurities layer different from the semiconductor substrate formed by sandwiching an electrode for applying negative sequence pulses on the semiconductor substrate, and is connected with the input side of the capacitor 202 with which the semiconductor inpurities layer is also electronically and commonly connected.

In FIG. 30, this structure in which the drain and source of a NMOS transistor are used as common terminals is connected with the terminal between the switch and the capacitor. The connection of this structure permits to cancel voltage changes at the terminal between the switch and the capacitor resulting from overlapping capacity of the transistor gate and drain (the side of the terminal 200 commonly connected) and the splitting of capacity with the capacitor $C_0'$ shown by 212, and to reset the terminal between the switch and the capacitor more precisely at the electric potential of the reset power source 208. Therefore, it is possible to set more precisely the absolute value of slight voltage changes resulting from the splitting of capacity at the terminal 200 commonly connected on the opposite side through the capacitor 202. Thus, sensitivity is enhanced, rapid response and an important contribution to the economy of power consumption can be achieved. These are quite considerable effects achieved.

It should be noted that the structure and resetting means used here are not limited to those described in this embodiment as mentioned in Embodiments 10 to 12. And the signal transfer switch obviously should not be specifically limited.

Figure 31:
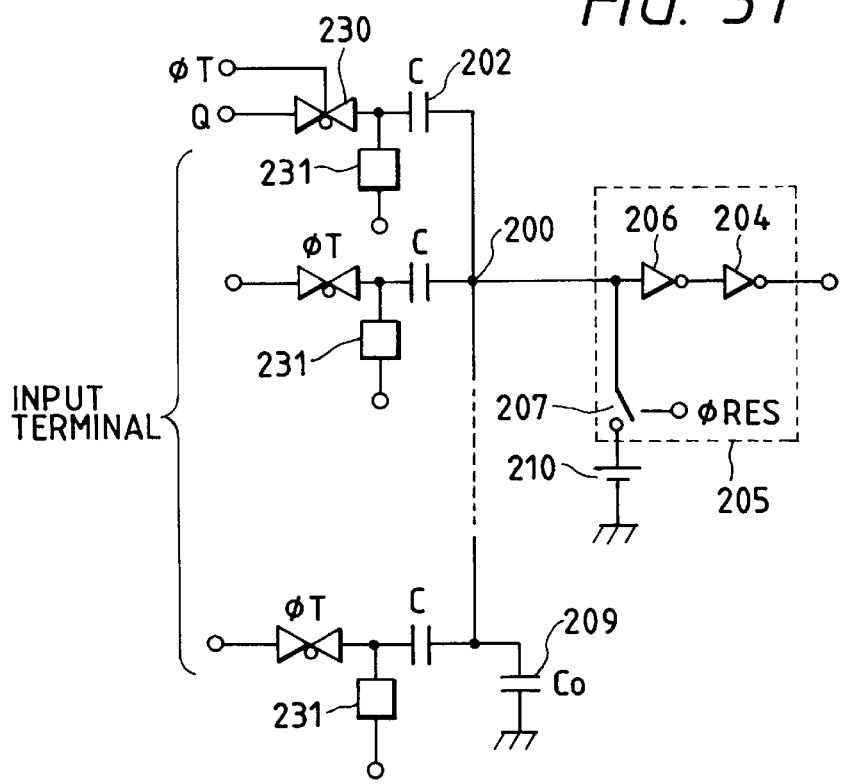
Figure 32:
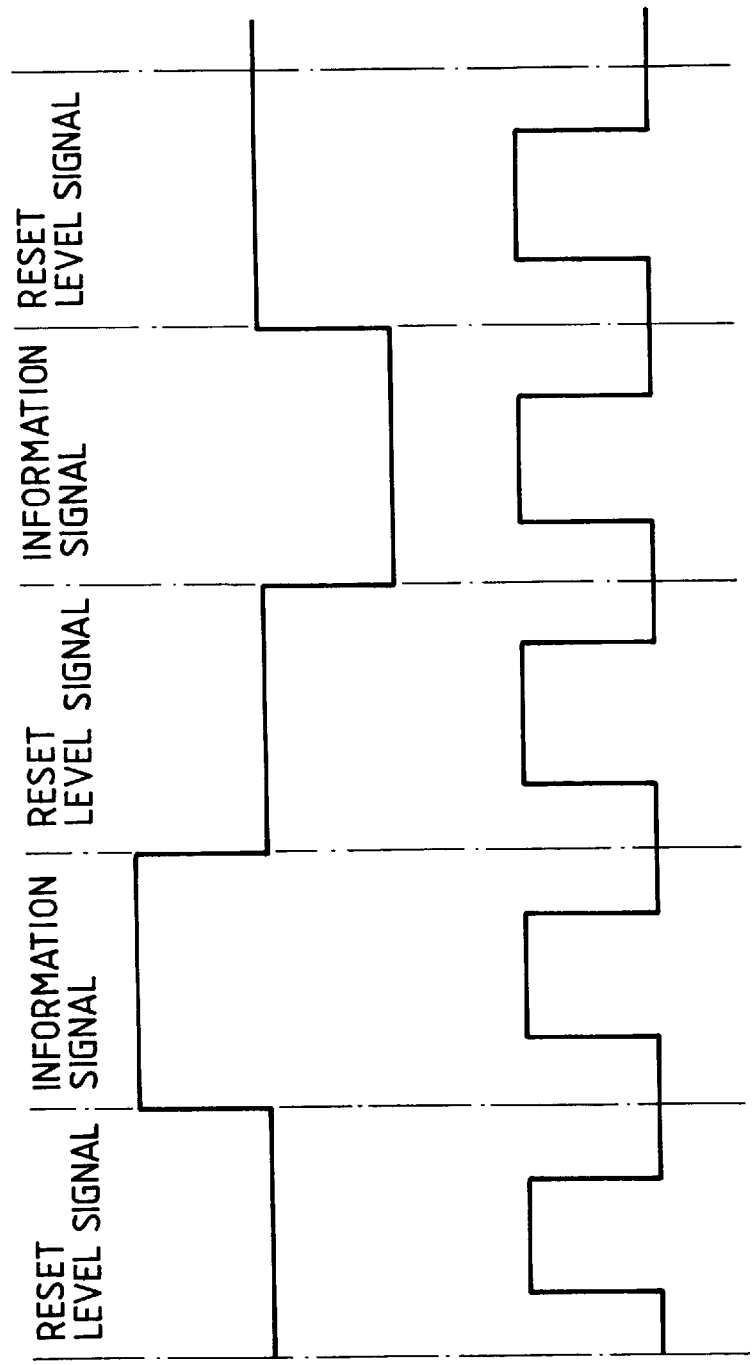

In addition a configuration shown in FIG. 31 can be adopted. A switching means 230 shown in this FIG. 31 between the multiple input terminals and the capacitor can be used as a switching means and also as a resetting means. In other words, input is divided by time series into a period of reset condition when the switch opened while the resetting potential is maintained and a period of time when the switch is opened after input IN is transformed into information signals and during those periods the switch 230 may be switched to high and low positions (FIGS. 32A and 32B are timing diagrams for this purpose). In this case also, in order to reset the input terminal side of the capacitor, a structure 231 for inputting sequence pulses serving as resetting means and negative phase sequence pulses can be connected. The configuration of the structure 231 is same as the circuit shown in FIG. 30, and NMOS transistors are connected in series. It operates as described above and such configuration is obviously included in this invention.

[Embodiment 14]

Embodiment 14 according to this invention is described with reference to FIGS. 33, 34A and 34B.

Figure 33:
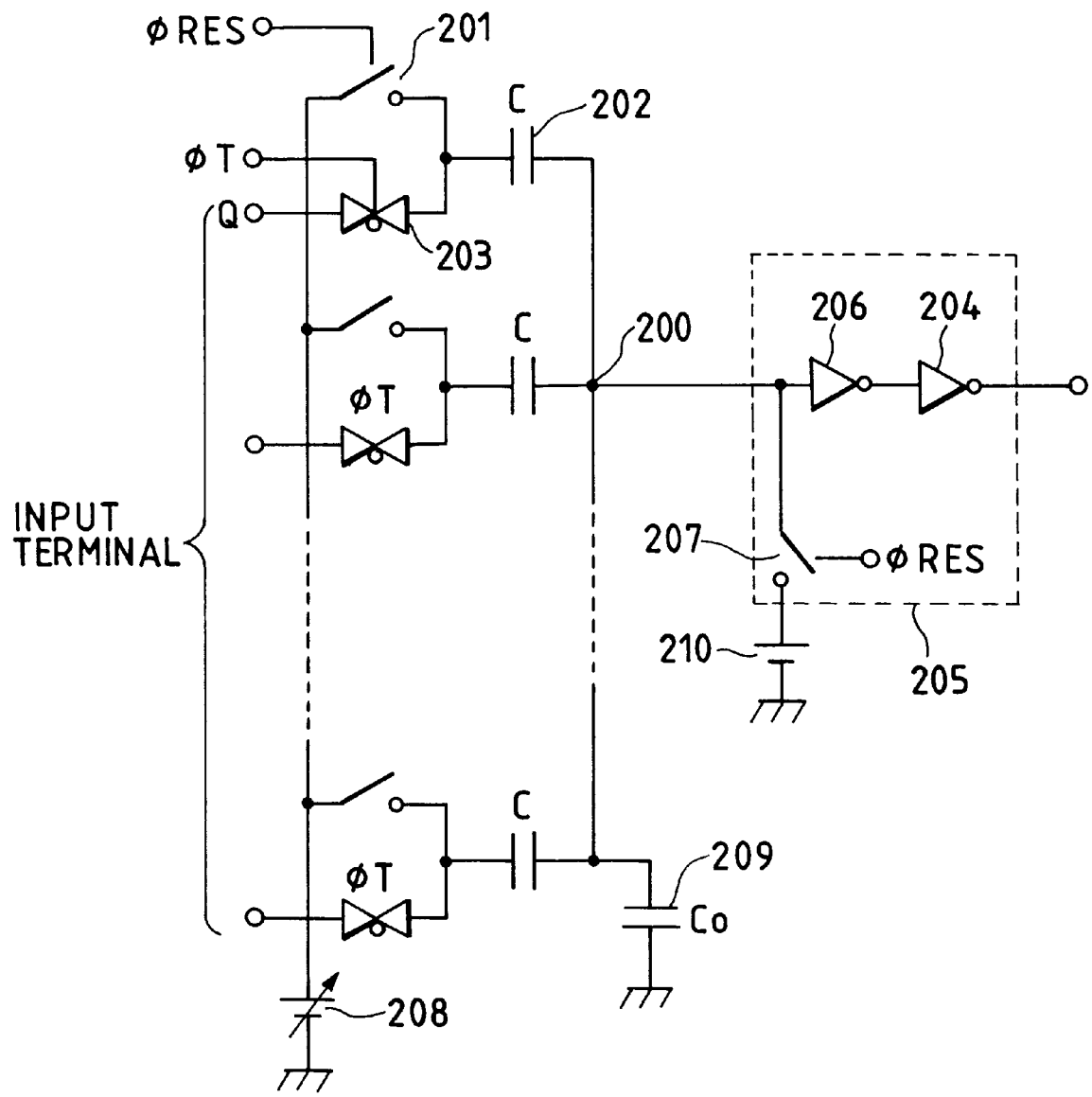
Figure 34A:
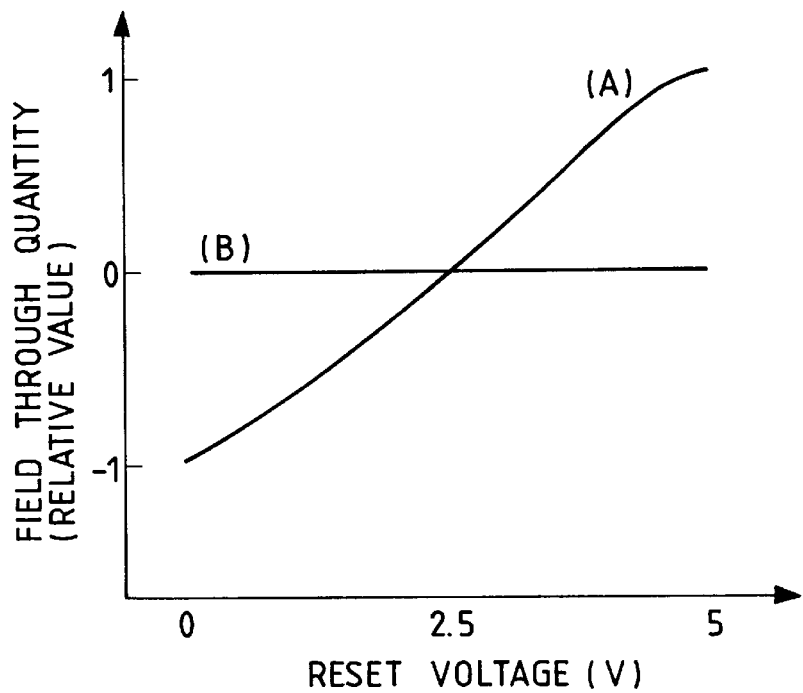
FIG. 34A is a graph for explaining an example of the relationship between the resetting voltage and the MOS transistor's feed through quantity.
Figure 34B:
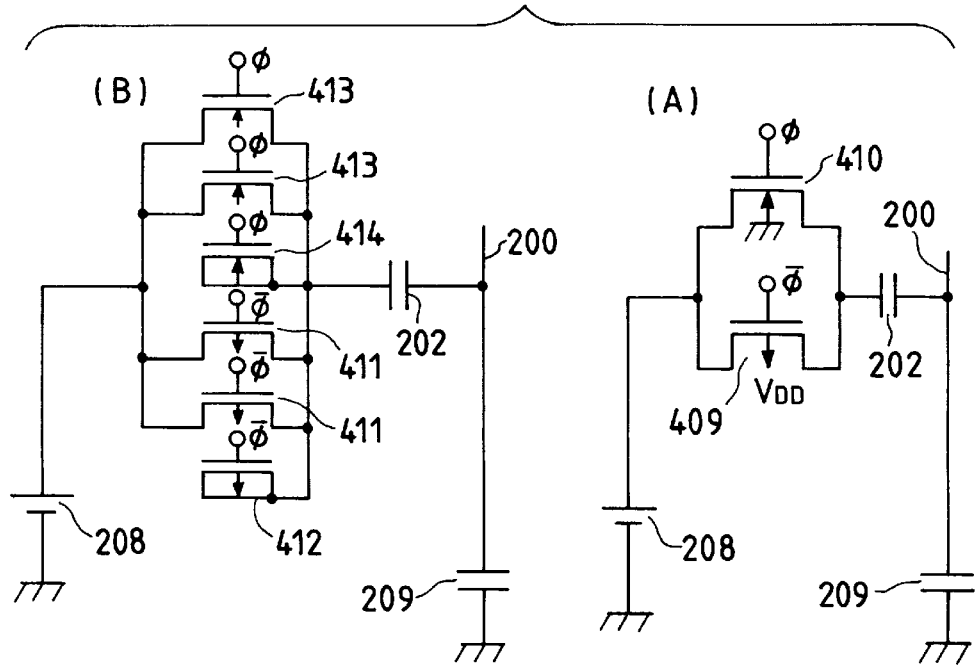

In FIG. 33 which is more or less identical to FIG. 28, the reset voltage chosen 208 is variable. When the reset voltage 208 is fixed (V0), changes in signal corresponding to the difference between the input value Q and the fixed value (Q−V0) are divided and are carried to the terminal 200 to which capacitors are connected jointly. When negative phase sequence signals of the input signals Q are used as reset voltage, on the other hand, it will be possible to allow signals to change at full amplitude by means of the power source. For example, if VDD=5 V, V0=2.5 V, in case the reset voltage is fixed, signal changes amount to 5−2.5=2.5 V or 0−2.5=−2.5 V being contained within a range of ±2.5 V. When the reset voltage chosen is negative phase sequence signals of the input signals, on the other hand, signal changes amount to 5−0=5 V or 0−5=−5 V being contained within a range of ±5 V.

In such a case, the resetting means 201 must be a switch allowing the passage of both power voltage and 0 V, and for such switch, transmission-type MOSFET incorporating both NMOSFET and PMOSFET is renowned.

Measurements of the fieldthrough characteristics of this transmission-type MOSFET revealed that it is dependent on the reset voltage. The experimental values are shown by the curve (A) in the reset voltage vs. field through value graph in FIG. 34A and the circuit diagram used then is shown in the circuit diagram (A) in FIG. 34B. The greater in the positive direction is the reset voltage, the more remarkable becomes the field through on the positive side due to PMOSFET, and the closer the reset voltage approaches to 0, the more remarkable becomes the field through on the negative side due to NMOSFET 410. The field through due to PMOSFET 409 becomes more remarkable as the reset voltage gets closer to 5 V.

In other words, in order to control field through with a transmission-type MOSFET, it is effective when the reset voltage is fixed. When the reset voltage is variable as in this embodiment, however, the combination of structures in which negative phase sequence pulse is applied to each PMOSFET and NMOSFET is effective. The straight line (B) in FIG. 34A show its results and the circuit diagram (B) in FIG. 34B specifically shows its circuit diagram. In the circuit diagram (B) here, on the input side of the capacitor 202, two NMOSFET 413, a structure of NMOSFET 414, two PMOSFET 411 and a structure of PMOSFET 412 are connected to supply reset voltage 208.

The adoption of such a configuration permits to cancel voltage changes at the terminal between the switch and the capacitor resulting from overlapping capacity of transistor gates and drains (on the side of terminal commonly connected) and the division of capacity with the capacitor 212 of parasitic capacity on the input side of the capacitor 202 resulting from the switching off of NMOS transistors by φRES. It also permits to reset more precisely the terminal between the switch and the capacitor at the voltage of the power source 208. Accordingly, it is possible to set more precisely the absolute value of slight voltage changes due to the division of capacity at the terminal 200 commonly connected on the opposite side through the capacitor 202. Thus sensitivity is enhanced, high-speed response and contribution to economy and power consumption can be achieved, which are all great achievements.

It should be noted that the structures and resetting means used here are not limited to those described in this embodiment as mentioned in Embodiments 10 to 12. In addition the signal transfer switch obviously should not be specifically limited. Furthermore, when the transmission-type MOSFET mentioned above is used for resetting the terminal 200 connected commonly through a capacitor as shown in Embodiments 10 to 12, the same applies obviously.

With regard to the division of MOSFET used as a resetting means, on the other hand, obviously the same applies absolutely to the transmission-type MOSFET.

[Embodiment 15]

Figure 35:
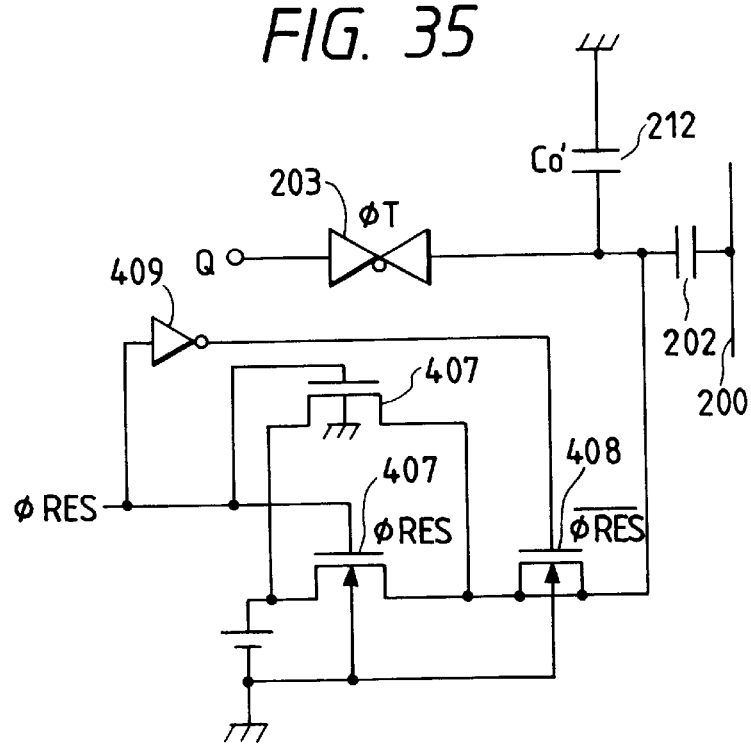
Figure 36:
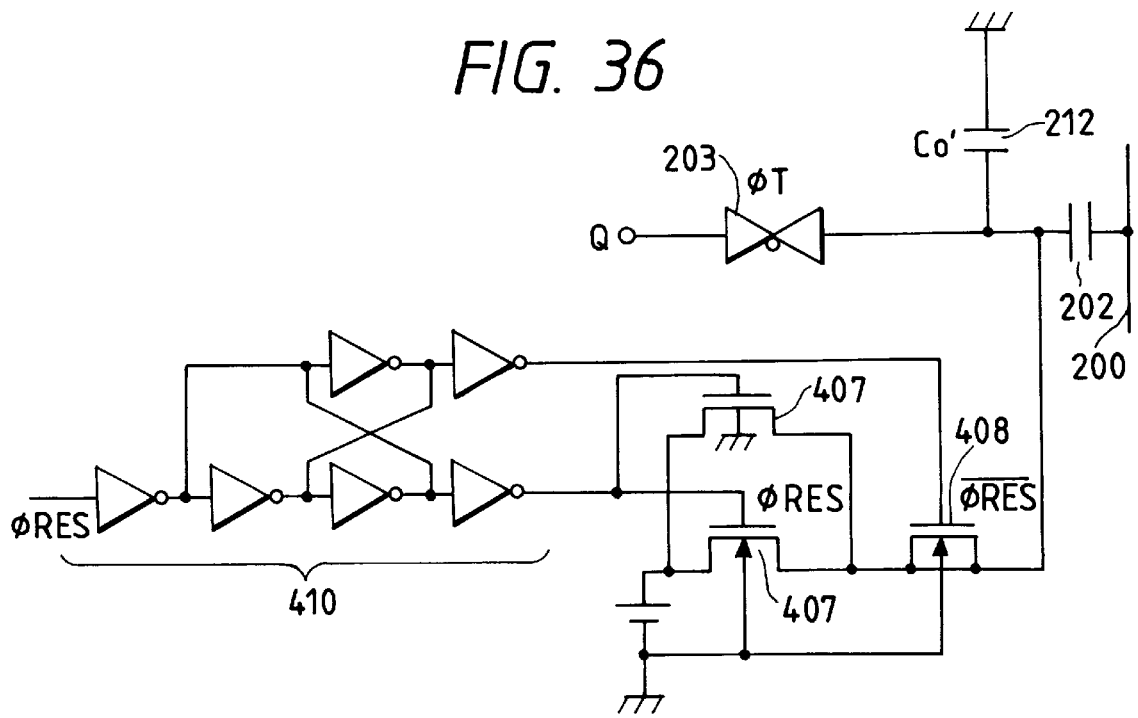

Embodiment 15 according to this invention is described with reference to FIGS. 35 and 36. FIGS. 35 and 36 both show an example of the circuit from the input terminal to the capacitor C (202) of FIGS. 26A and 26B. In the example of FIGS. 35 and 36, regarding the sequence pulses inputted in each of NMOS transistors shown by 407 serving as resetting means and in each structure shown by 408, when the sequence pulse to the resetting means φRES is slower than the negative-phase-sequence pulse φ$\overline{RES}$, during the delay NMOS transistors serving as resetting means are on. Therefore, even if the negative-phase-sequence pulse φ$\overline{RES}$ changes, the terminal between the switch and the capacitor remains at the electrical potential of the resetting power source 208. Therefore, the effect of the structure shown by 408 is reduced.

In FIG. 35, φRES is inputted with some time lag corresponding to the delays in signal transmission through an inverter 409 by having it pass through the inverter 409 from the input of φRES. By so doing, it becomes possible to draw out efficiently the effect of the structure shown by 408.

In FIG. 36, negative-phase-sequence pulse φ$\overline{RES}$ and sequence pulse φRES are inputted by having them pass through a plurality of inverters so that more or less the same timing may be achieved. At this time, even while φRES and φ$\overline{RES}$ are changing, voltage changes are contained. Such a case is not limited to the points described in this embodiment and is true in the case of application to the terminal 200 commonly connected as shown in Embodiments 10 to 13. Furthermore, this is not obviously limited to the structures of this embodiment including other structures described in Embodiments 10 to 14.

[Embodiment 16]

Figure 37:
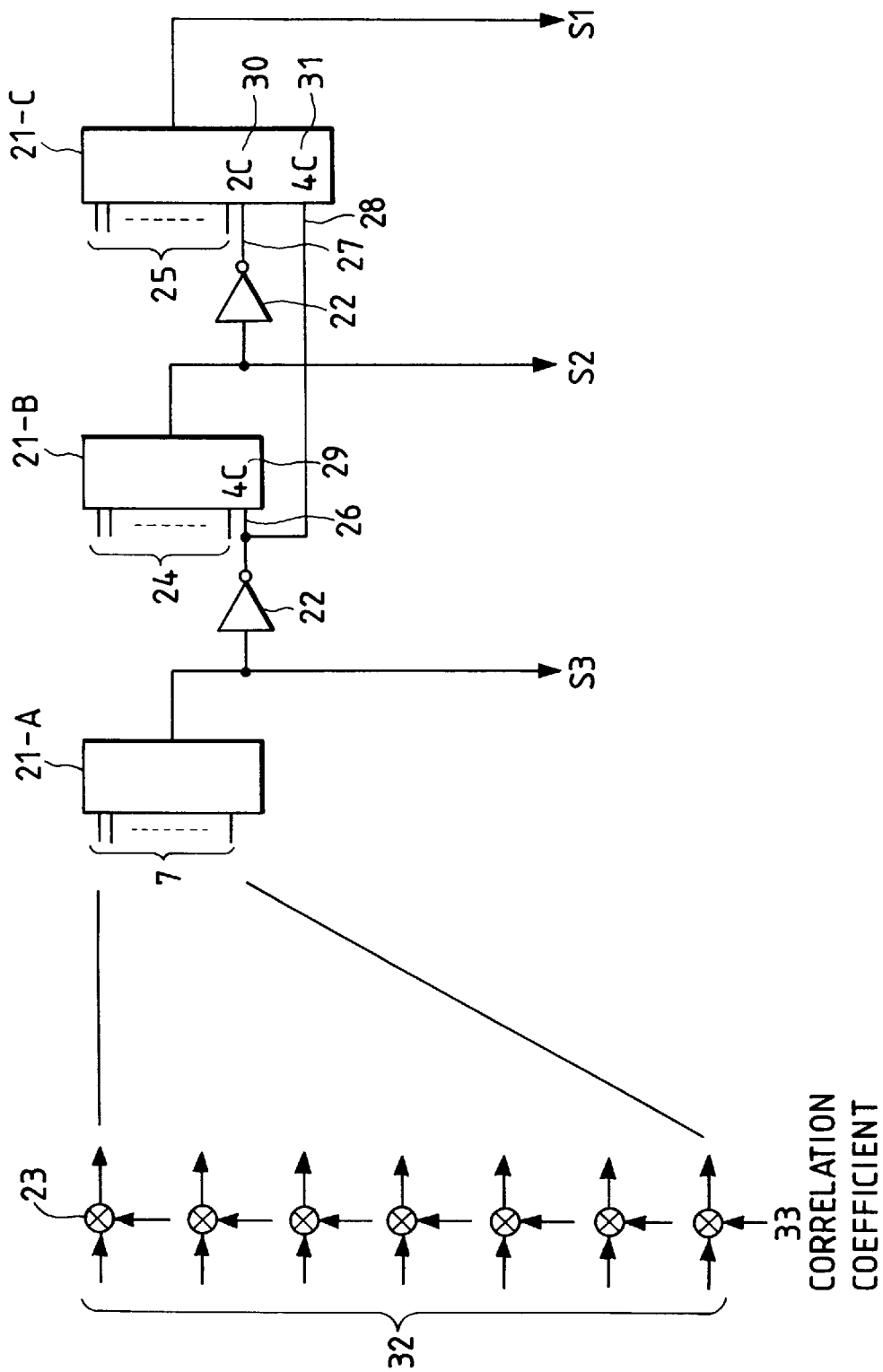

Now, the case of applying the semiconductor devices mentioned above in a correlation operation circuit is described as Embodiment 16 with reference to FIG. 37. In FIG. 37, 21-A, 21-B and 21-C with seven input terminals constitute a majority operation circuit block, 22 is an inverter and 23 is a comparator. 24 and 25 are a group of input terminals to which signals similar to seven input signals inputted in the majority operation block 21-A are inputted. 26, 27 and 28 are input terminals for inputting output signals coming from the preceding majority operation circuit. 29, 30 and 31 show capacity values of 4C, 2C and 4C connected corresponding to input terminals 26, 27 and 28 when capacitors connected with normal input terminals are C.

In FIG. 37, each input signal is inputted first into respective comparator 23 together with correlation coefficient 33. The comparators 23 output high level signals when the input signals and the correlation coefficient match, and output low level signals when they do not match. The comparator output is inputted into the majority operation circuit block 21-A to 21-C. For example, when the output of the comparators 23 is inputted into the majority operation circuit block with seven inputs, in case where the number of high level inputs is a majority, in other words four or more inputs out of seven are high level inputs, the majority operation circuit block 21-A outputs high level signals. This state of output is shown in S3 of Table 3.

Similarly, for example the majority operation circuit block 21-B with eleven inputs by seven inputs and 4C equivalent to four inputs of the input terminal 26 outputs high-level signals when six or more inputs are high level. This output state is shown in S2 of Table 3. Likewise, the majority operation circuit block 21-C with 13 inputs in total by seven inputs and 4C equivalent to four inputs of the input terminal 28 and 2C equivalent to two inputs of the input terminal 27 outputs high-level signals when seven or more inputs are high level. This output state is shown in S1 of Table 3.

To describe more specifically, the output values of the majority operation circuit block with seven inputs for every number of high-level inputs are as shown in S3 of Table 3. Then, as shown in FIG. 37, the output of the majority operation circuit block 21-A with seven inputs is inverted by means of the inverter 22 and is applied into the weighed input terminal 26 of the majority operation circuit block 21-B.

Figure 38:
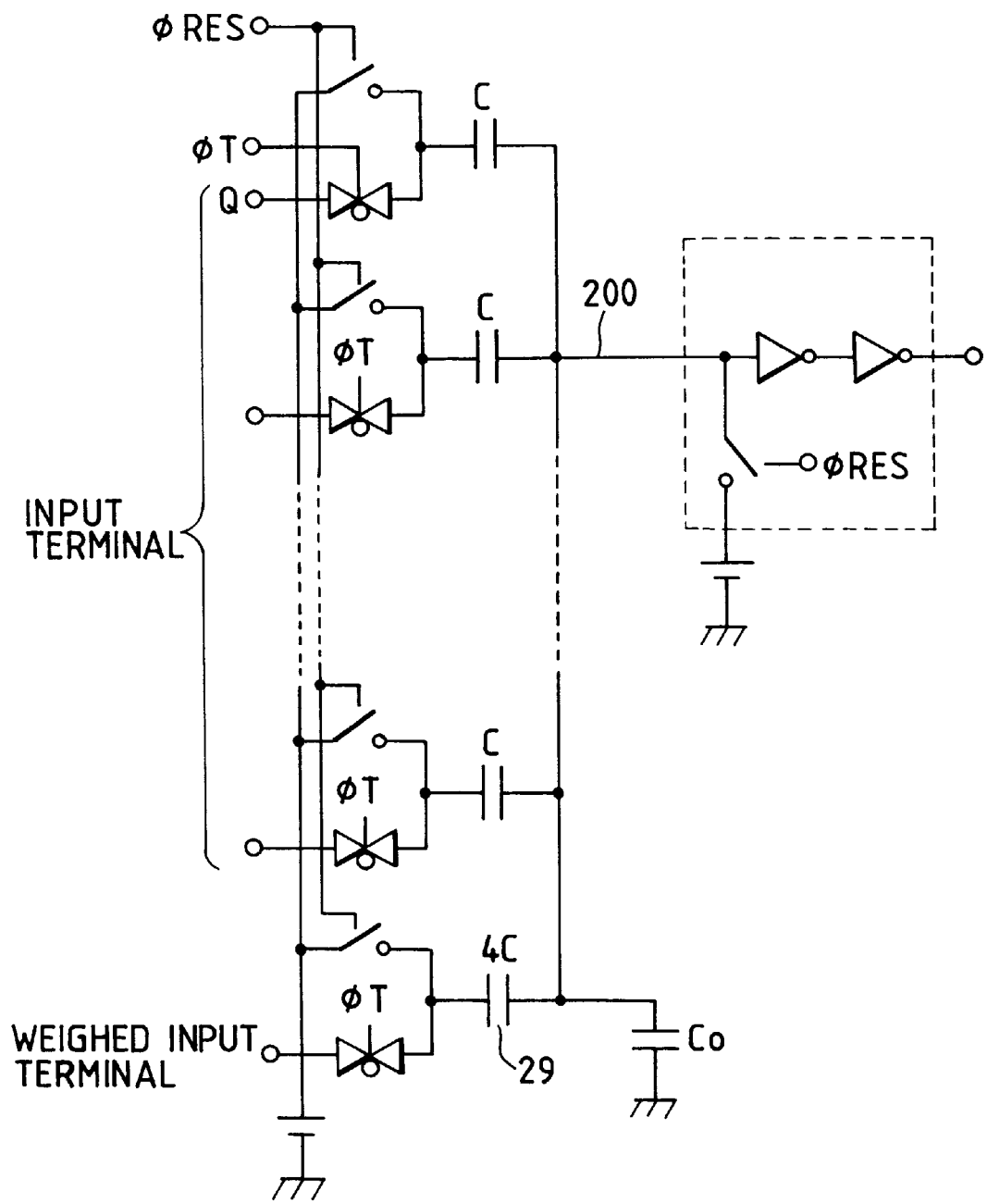

A circuit configuration example of the majority operation circuit block 21-B is shown in FIG. 38. This is a weighed circuit. In FIGS. 38, 29 is capacitor with a capacity value approximately four times of the capacitor C connected with the other input paths. The circuit in FIG. 38 is a majority operation circuit with eleven inputs in which, supposing that the capacitor value connected with the input terminal path is C, eleven C are commonly connected, among which four C receive signals coming from the weighed input terminals, and other seven terminals receive signals identical to those inputted into the majority operation circuit block 21-A. For example, if four inputs or more out of seven are high level, as described above, low-level inputs are applied into the weighed input terminals. In addition, if six inputs or more out of seven input signals applied to input terminals other than weighed input terminals are at a high level, the majority operation circuit with eleven inputs considers itself as a whole as representing a majority and outputs high-level signals. If between four and five inputs out of seven are at a high level, a majority is not reached and low-level signals are outputted. On the other hand, if three inputs or less out of seven inputs are high level, high-level signals are applied into the weighed input terminals. If between two and three inputs out of seven are at a high level, 4+2 or 4+3 being equal to 6 or more and are determined to represent a majority and high-level signals are outputted. If one input or less is at a high level, 4+0 or 4+1 being less than 6, low-level signals are outputted. The output values of the majority operation circuit block 21-B for each number of high-level inputs are as shown in S2 of Table 2.

According to this invention, in FIG. 38 the use of NMOS or PMOS and various structures described in Embodiments 10 to 15 for switching units operating with control sequence pulse φRES permits to assure the accuracy and high speed of data as well as the diminution of the general circuit scale.

In addition, as for the majority operation circuit block 21-C, the application of inverted signals of the output of the majority operation circuits 21-A and 21-B to two weighed terminals with a capacity value 4C four times larger than the input terminal 28 and with a capacity value 2C twice larger than the input terminal 27 to operate the circuit block permits to obtain outputs as shown in S1 of Table 1 in FIG. 38. This circuit configuration permits, as shown in FIGS. 3A to 3J, to convert the number of inputs whose signals match with correlation coefficients from among a plurality of inputs into 3-digit binary numbers and to output the same.

FIG. 39 is a typical circuit diagram of the majority operation circuit block. This is an unweighed circuit. In FIG. 39, 41 is a resetting switch. 42 is a capacitor. 43 is a signal transfer switch. 205 is a sense amplifier. 46 is the first inverter in the sense amplifier 205. 44 is the second inverter in the sense amplifier 205. 47 is the second resetting switch to reset the input terminal of the inverter 46. 48 is a resetting power source. 50 is a second resetting power source. 51 is the output terminal. 49 represents the parasitic capacity developing on one end commonly connected of the capacitor 42 but this is not exclusive.

FIGS. 40A to 40C are operation timing diagrams of the majority operation circuit of this invention. The following is a description of its operation with reference to the diagram. To begin with, one end of the capacitor 42 is reset by means of resetting sequence pulse φRES. The resetting voltage chosen will be 2.5 V, approximately a half of the power source voltage, which may be 5 V for example. The resetting voltage is not limited to this and may be different. At this time, almost simultaneously the input end of the inverter 46 in the sense amplifier 205 is reset by switching on the resetting switch 47. The resetting voltage chosen at this time is close to the logical inversion voltage at which the output of the inverter 46 is inverted.

TABLE 3

| Input | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

Then, when the resetting sequence pulse φRES is switched off, both ends of the capacitor 42 will be kept at their respective resetting voltage. Then, when the transfer switch 42 is switched on by means of transfer sequence pulse φT, input signals are transferred to one end of the capacitor 42, and the electric potential at one end of the capacitor 42 changes from a resetting voltage of for example 2.5 V to a low level of 0 V or a high level of 5 V. Supposing that the capacity of the capacitor 42 is Ci, that the capacity value of the parasitic capacity is Co and that n number of capacitors 42 are connected in parallel, one end of the capacitors 42 commonly connected, in response to an input, due to the division of capacity, changes from somewhere close to the logical inversion voltage of the inverter 46:

$$(Ci \times V)/(Co+N \times Ci) \qquad [V]$$

$$(Ci \times 2.5)/(Co+N \times Ci) \qquad [V]$$

When the voltage at the input end of the inverter 46 changes from the logical inversion voltage, the voltage at the output end of the inverter 46 is inverted accordingly. When signals are inputted into each of n inputs, on the input end of the inverter 46 the sum of n outputs with capacity divided are inputted. After all, if high-level signals represent a majority among n inputs, the input end of the inverter 46 shifts from the logical inversion voltage to a high electric potential, and at the output end 51 of the sense amplifier 205 high-level signals are outputted and, if low-level signals represent a majority, low-level signals are outputted.

The circuit described in FIG. 39 as configured above functions as a majority operation circuit outputting logical values accounting for a majority among a plurality of inputs. In other words, this embodiment also functions as a majority operation circuit. Moreover, as described above, the use of NMOS or PMOS and various structures described in Embodiments 1 to 6 in switches 41 and 47 shown in FIG. 39 and operating with control sequence pulse φRES according to this invention permits to assure the accuracy and high speed of data and the diminution of the general circuit scale of the majority operation circuit.

[Embodiment 17]

Figure 41:
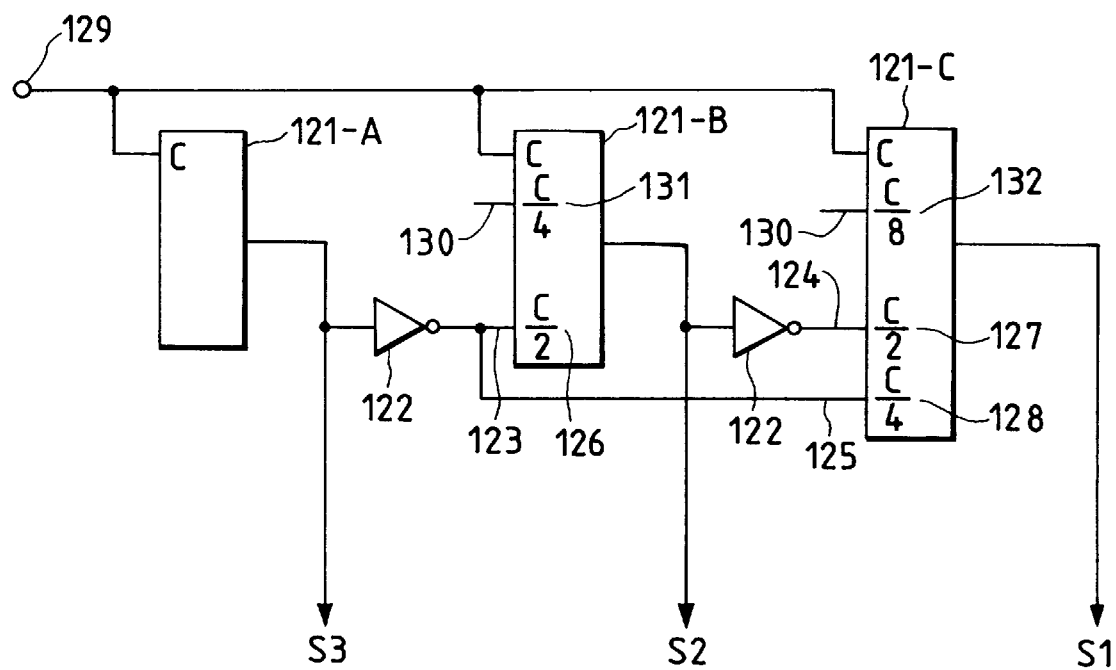

Embodiment 17 is described with reference to FIG. 41 and Table 4. This embodiment is a 3-bit precision analog-to-digital converter (hereinafter referred to as "A/D converter") in which this invention is used. In particular in case where resetting means is used in various operation blocks, other input terminals and the input unit of sense amplifier, preferably the resetting means described above should be applied. In FIG. 41, 121-A, -B, and -C are respectively calculation circuit blocks with one input, two inputs and three inputs. 123, 124, and 125 are input terminals for inputting output signals coming from the preceding calculation circuit blocks. 126, 127 and 128 represent capacity values C/2, C/2 and C/4 connected corresponding to 123, 124 and 125 when the capacitors connected with normal input terminals are designated by C. 129 is an analog input terminal. 130 is a set input terminal. And 131 and 132 represent capacity values C/4 and C/8 connected respectively corresponding thereto. S1, S2 and S3 are digital output signal terminals.

And now the use of 5 V power source system in this embodiment will be described. To begin with, in FIG. 41 the sense amplifier input in the calculation circuit blocks 121-A to C is reset at 0 V, and that in the calculation circuit blocks 121-B and -C is reset at approximately 2.5 V. And the signal input terminals 123, 124 and 125 as well as the input side of the input operation condenser 202 of the set input terminal 130 are reset at 5 V. At this time, the signal input terminal 129 is at 0 V. Then, the set input terminals 130 are reset at 0 V, and when the input voltage of the input terminal 129 shifts from 0 V to the analog signal voltage, and the analog input signal in the calculation circuit block 121-A rises to approximately 2.5 V or more, the input voltage of the sense amplifier in the calculation circuit block 121-A tops the logical inversion voltage (here assumed to be 2.5 V), and high-level signals are outputted. The results are shown in S3 of Table 4.

When analog input signals are at 2.5 V or more, the electric potential of the input terminal 123 changes from the resetting voltage of 5 V to 0 V. At this time, changes in the electric potential at the input terminal of the sense amplifier within the calculation circuit block 121-B will be as shown in the following formula if the analog input signal voltage is assumed to be VA.

$$\{C \times VA - (C/2) \times 5 - (C/4) \times 5\}/(C + C/2 + C/4) \qquad [V]$$

This formula reveals that the calculation circuit block 121-B outputs high-level signals when the analog signal voltage is equal to 3.75 V or more and that it outputs low-level signals when the latter is between 2.5 V and 3.75 V. The results are shown in S2 of Table 4.

Similarly, the output of the calculation circuit block 121-C shall be as shown in S1 of Table 4.

As shown in Table 4, this embodiment permits to realize on a very small scale an analog-to-digital converter capable of converting analog signal voltage to 3-digit digital signals for output with a high operating speed and a low power consumption.

In this embodiment, a 3-bit analog-to-digital converter is described. However, this does not means a limit and this can be easily expanded to further multibit machines.

In this embodiment, an example of flush-type analog-to-digital converter with capacitors is described. However, this invention is not limited to this process, and even if this invention is applied to the encoder circuit section of an analog-to-digital converter to compare for example signals inputted into a resistor sequence and reference signals with comparators and to encode the results thereof with encoders, obviously the same effects as those described above can be obtained.

As described above, in a circuit block in which one end of capacity means corresponding to each of multi-input terminals is commonly connected to input a sense amplifier, if the minimum capacitor among the capacitors connected with the multi-input terminals described above is C, the sum of the capacitor means mentioned above is approximately odd multiples of C.

In case of a correlation circuit without any control input terminal, all consist of the minimum values, and even in cases having control input terminals, as described for example in Embodiment 16 shown in FIG. 37, the capacitors connected with the control input terminals are even numbers of 2C and 4C, and the total sum obtained by adding them with odd number input signal terminals is an odd number times C or approximately an odd number times thereof. Such a configuration permits to highlight the distinction of large and small from the desired reference value and has the effect of enhancing the precision of operation.

TABLE 4

| Analog Input Signal Voltage | S3 | S2 | S1 |
| --- | --- | --- | --- |
| 0.0 ≦ VA < 0.625 | 0 | 0 | 0 |
| 0.625 ≦ VA < 1.25 | 0 | 0 | 1 |
| 1.25 ≦ VA < 1.875 | 0 | 1 | 0 |
| 1.875 ≦ VA < 2.5 | 0 | 1 | 1 |
| 2.5 ≦ VA < 3.125 | 1 | 0 | 0 |
| 3.125 ≦ VA < 3.75 | 1 | 0 | 1 |
| 3.75 ≦ VA < 4.375 | 1 | 1 | 0 |
| 4.375 ≦ VA < 5.0 | 1 | 1 | 1 |

The above description relates to a correlation circuit, and when a binary digital-to-analog converter takes C for the capacity of the minimum bit LSB signal input capacitor, the following bit requires 2C and the next bit requires 4C increasing by geometric progression, and the sum total of all the capacitors of the multi-input terminal will be an odd number times C or approximately an odd number times thereof. Thus, a high-precision digital-to-analog conversion can be achieved.

Furthermore, as described in Embodiment 17 shown in FIG. 41 with regard to the analog-to-digital converter, division numbers clearly establishing whether the level of analog signals exceeds a half of the full range or is equal or less than a half is full IC for 121-A, and ¼, 2/4, ¾ and 4/4 for 121-B.

Such a configuration permits especially high-precision operations without providing unnecessarily large capacitors and contributes to the realization of low power consumption and high-speed operations.

In the preceding paragraph, the examples of correlation processor and analog-to-digital converter were taken up for description. This invention, however, is not limited to such devices and can obviously be applied with similar benefits to digital-to-analog conversion circuits, addition circuits, subtraction circuits and other logic circuits.

In the configuration of a digital-to-analog converter in particular, when C is taken as the basic unit for the capacitor for inputting LSB data, the doubling of capacity from 2C, to 4C, to 8C, and so on as the number of digits increases will lead to the realization of binary digital-to-analog conversion. In this case, it is enough to adopt the configuration of connecting the commonly connected terminals of capacitors with a MOS-type source follower amplifier.

[Embodiment 18]

Embodiment 18 according to this invention is shown in FIG. 42. Embodiment 18 combined the art described in Embodiment 10 of this invention with the prior art in circuitry to realize a dynamic image and other movement detection tip. In FIG. 25, 61 and 62 are memory sections respectively storing standard and reference data, 63 is a correlation calculation section, 64 a control section controlling the whole tip, 65 is an addition processing section of correlation results of the correlation calculation section 63, 66 is a register section storing the minimum values of addition results of the addition processing section 65, 67 is a comparison and memory section storing comparators and the minimum values and address, 68 is an output buffer and storage section of output results. The input bus 69 takes the inputs of standard data sequence, while the input bus 70 takes the inputs of reference data sequence for comparison with the standard data sequence. The memory section 61 and 62 consists of SRAMs and is formed by normal CMOS circuits.

Data inputted from the reference data memory section 62 and the standard data memory section 61 and sent to the correlation calculation section 63 for correlation processing are processed by the correlation procession circuit according to this invention characterized by a high-speed parallel processing. This correlation calculation circuit not only realizes a very high-speed processing, but it is also characterized by a limited number of elements and a reduced size of tips and low costs. The results of correlation calculation are scored (evaluated) by the addition processing section 65, and they are compared with the register section 66 storing the maximum correlation results (added values become the minimum values) before the above-mentioned correlation calculation by the comparison and memory section 67. If the results of new processing are smaller than the minimum values obtained until the last processing, the results will be newly stored in the register section 66, and when the results obtained prior to the last processing are smaller, the results will be maintained. By so doing, the maximum correlation results are always stored in the register section 66, and after all the data sequence have been processed, the results will be outputted from the output bus 71 for example in the form of 16-bit signals.

The control section 64, the addition processing section 65, the register section 66, the comparison and memory section 67, and the output results storage section 68 have been made this time with normal MOS circuits. However, in the case of the addition processing section 65 and some other sections in particular, the use of circuit containing the resetting means of this invention permits to realize a precise and high-gain operation of the sense amplifier and also a high-speed processing. As mentioned above, not only high speed and low costs but also the resetting means are realized precisely and at a high speed and processings are carried out on the basis of capacity. Therefore, power consumption is reduced and a shift to low power was made possible. Thus, this embodiment is suitable for 8 mm VTR camera and other portable equipment.

[Embodiment 19]

Embodiment 19 according to this invention is described with reference to FIGS. 43A to 43C. Embodiment 19 combined the art of this invention described in Embodiment 10 with that of photosensor (solid state image sensor) to arrive at the structure of a chip capable of high-speed image processing before reading image data.

Figure 43A:
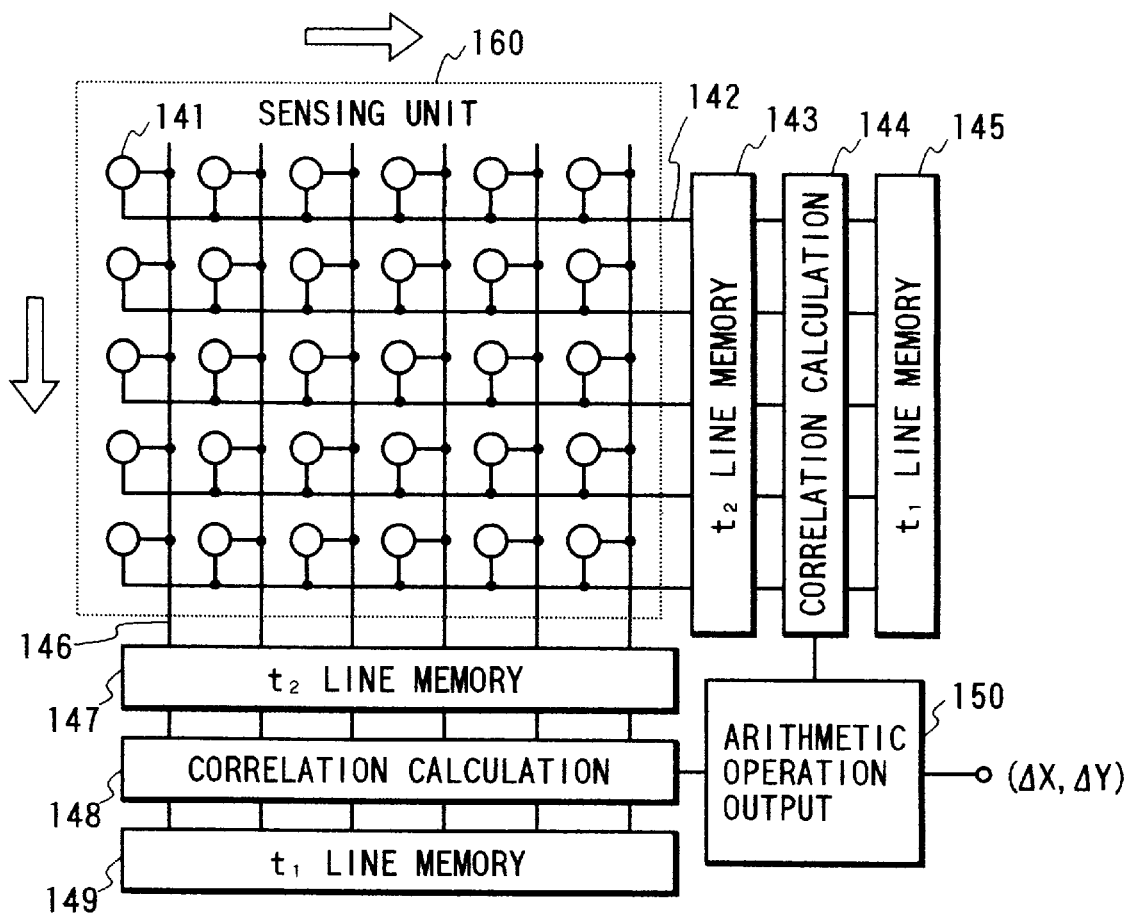
Figure 43B:
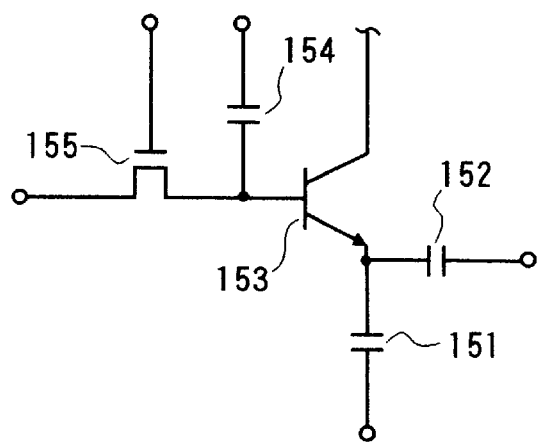
Figure 43C:
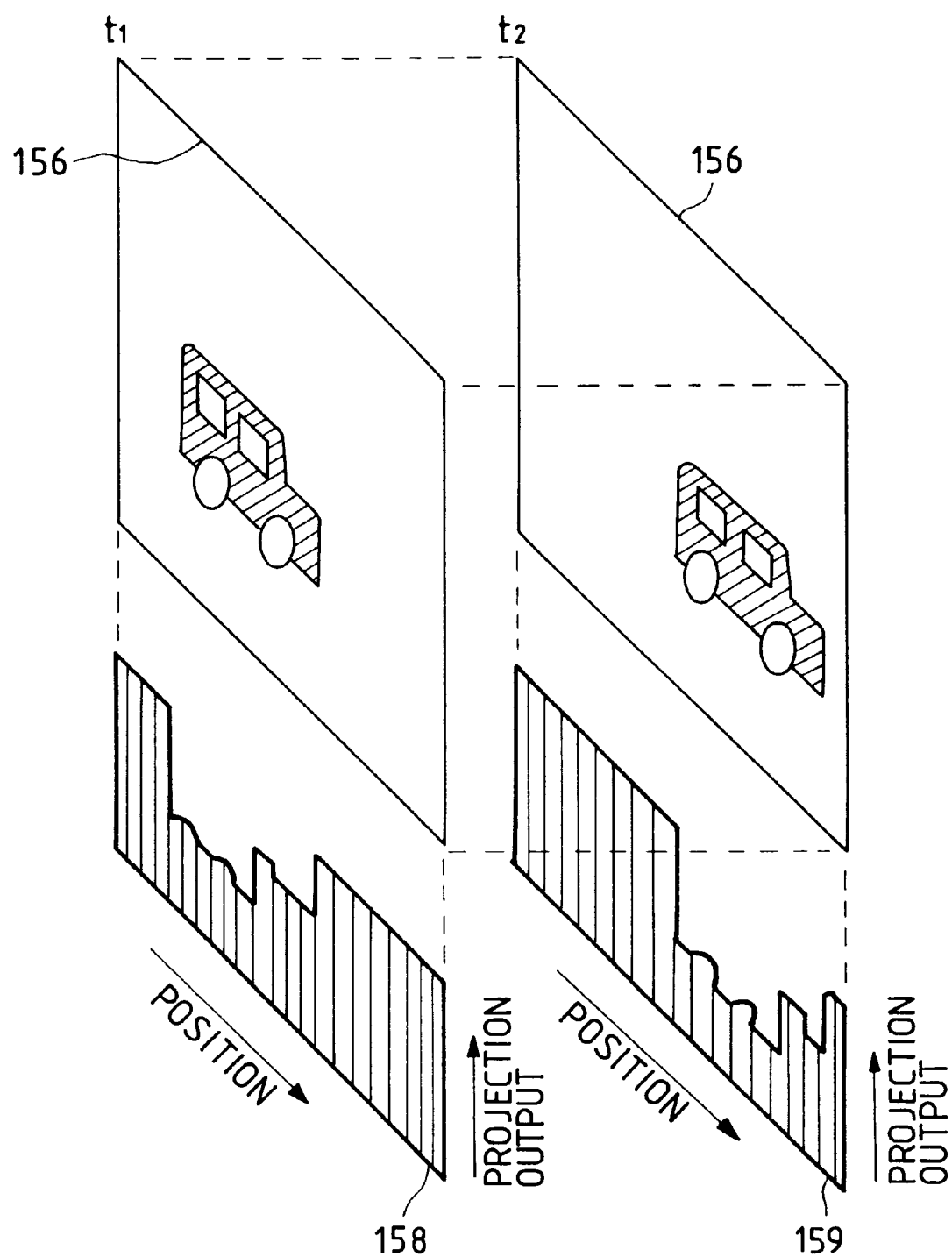

FIG. 43A is a block diagram showing the general configuration of a chip applying this invention, FIG. 43B is a circuit diagram showing the configuration of the pixel section of a chip applying this invention and FIG. 43C is a bird's eye view describing the contents of calculations of a chip applying this invention.

In the figure, 141 is a sensing unit including photoelectric conversion elements, 143, 145, 147 and 149 are line memory sections, 144, 148 are correlation calculation sections, and 150 is an arithmetic operation output section. Further, 151 and 152 in the sensing unit shown FIG. 43B are joint capacity means connecting output bus lines shown by optical signals output terminals 142 and 146, 153 is a bipolar transistor, 154 is a capacity means connected with the base area of the bipolar transistor 153, and 155 is a switch MOS transistor. Picture data projected onto a picture data sensing unit 160 are converted into photoelectric signals in the base area of the bipolar transistor 153.

Outputs corresponding to optical carriers resulting from the photoelectric conversion are read by the emitter of a bipolar transistor 153, and through joint capacity means 151 and 152, they raise the electric potential of the output bus lines 142 and 146 in response to input storage charge signals. As a result of the above operations, the results of adding vertical pixels are read by the line memory 147, while the results of adding horizontal pixels are read by the line memory 143. The choice of areas for raising the basic electric potential of the bipolar transistor 153 by means of a decoder (not shown in FIGS. 43A to 43C through the capacitor 154 in the pixel section permits to output the results of adding in the X and Y directions in any area of the sensing unit 160.

For example, as shown in FIG. 43C, supposing that a picture as shown in 156 is inputted at a point in time t1 and a picture as shown in 157 is inputted at a point in time t2, the output results added in the Y direction will be picture signals representing the state of movement of the illustrated car as shown in 158 and 159, and these data will be stored respectively in line memory 147 and 149. As for the horizontal direction likewise, the data will be stored in line memory 143 and 145.

As may be understood from the output of data sequence of picture data 158 and 159 in FIG. 43C, both data shift in response to the movement of pictures, and the calculation of their shift by the correlation calculation unit 148 and likewise the calculation of horizontal data by the correlation calculation unit 144 permit to detect the movements of bodies on a two-dimensional plane by a very simple method.

The correlation calculation circuit according to this invention can be applied to the correlation calculation units 144 and 148. It has fewer elements than the previous circuits and in particular these elements could be arranged with the pitch of sensor pixels. This configuration was designed to permit calculations based on analog signals of sensors. However, the provision of an analog-to-digital converter between the line memory unit and the output bus line obviously permits to address to digital correlation calculations.

As the sensor element of this invention, a bipolar type was used for description. However, the use of MOS-type sensor elements and also that of photodiodes alone without the provision of amplifier transistors are as a matter of course effective.

Moreover, in this embodiment correlation calculations of data sequences at different points in time were carried out. However, the storage in a memory unit of the results of X and Y projections of a plurality of pattern data of which recognition is desired permits to realize the recognition of patterns.

As described above, the fusion of a pixel input unit with a correlation calculation circuit according to this invention permits to produce the following effects:

(1) Instead of serially reading the sensor and then processing the data as in the past, data read in parallel and wholly in a block are processed in parallel. Therefore, the whole operation is conducted at a high speed and thus detection and pattern recognition operation can be performed.

(2) One-tip semiconductor devices including sensors can be realized. Such devices are capable of processing pictures without increasing peripheral circuits. Therefore, it is possible to realize the following products with small circuit scale and at low costs. This invention can be applied to (a) a control device for directing the TV screen towards users; (b) a control device for directing the air flow coming from the air-conditioner; (c) tracking control device for 8 mm VTR camera; (d) an industrial label recognition device at factories; (e) a reception robot capable of automatically recognizing humans; and (f) a car-to-car distance control device.

So far, the fusion with the picture input unit have been described. Needless to say, this is effective not only for processing picture data but also for processing voice recognition and for other similar operations.

[Effects of the Invention]

As described above, this invention allows to construct circuits for processing in parallel multi-parameter signals with a smaller number of transistors as compared with the normal logic circuits. And because of the possibility of obtaining high sensitivity for micro-signals, it is possible to increase further processing speed and to reduce power consumption.

Particularly because of the minimization of effects of turning on and off of reset sequence pulse on multi-input terminal, on capacitors corresponding to said multi-input terminal, the semiconductor devices of a sense amplifier inputted through a multi-input terminal the other end of which are commonly connected, on the input end of sense amplifier and on the input end of said capacitors, it is possible to reduce resetting time, to avoid any noises and any adverse effects on signals and to obtain highly sensitive, correct and high-speed data outputs. As a result it is possible to reduce its circuit scale, to increase its processing speed and to reduce its power consumption.

In addition, circuits for parallel processing by means of the semiconductor devices can be constructed with a smaller number of transistors as compared with normal CMOS-type logic circuits and can be made highly sensitive for micro-signals.

The application of this invention to semiconductor circuits and correlation calculation circuits in which this semiconductor device is used, analog-to-digital converters or digital-to-analog converters and other signal converters as well as to signal processing systems in which these are used allows to reduce their circuit scale, increase their processing speed and to reduce their power consumption. In addition, it allows to reduce production costs and to improve production yield.

Furthermore, this invention is not limited to the above descriptions, embodiments and drawings and can be adapted and varied as situation requires within the limit of its purpose.

For example, any transistors other than MOS transistors may be used as the situation requires. In drawings used in the above embodiments, for example in FIGS. 8, 11, 16, 17, 28, 31, 33, 38 and 39, only resetting means to which φRES signals are inputted are often shown. However, it is needless to say that structures into which φRES signals are inputted in connection with resetting means are omitted and such structure are provided according to the needs.

What is claimed is:

1. A semiconductor device comprising:
   a plurality of input terminals;
   a plurality of capacitors each of which has first and second terminals, the first electrode of each capacitor being connected with a respective one of said input terminals, a sense amplifier having an input section to which the second terminals of said capacitors are commonly connected electrically;
   resetting means which is commonly connected with the second electrode of said capacitor and the input section of said input section; and
   a structure in which an inverted signal of the reset signal which is input to said resetting means is input, wherein said structure is connected commonly to the second electrodes of said capacitors and the input section of said sense amplifier.

2. A semiconductor device as set forth in claim 1, further comprising a semiconductor substrate, wherein said resetting means has a MOSFET, said structure has a pair of semiconductor regions including an impurity of conductivity type different from that of said semiconductor substrate, and which is formed on said semiconductor substrate through an electrode to apply said inverted signal, and said semiconductor regions are electrically connected with the second electrode of said capacitor and the input section of said sense amplifier.

3. A semiconductor device as set forth in claim 2, wherein the MOSFET of said resetting means has a gate electrode, and a gate capacity of the gate electrode is approximately twice the gate capacity of said structure.

4. A semiconductor device as set forth in claim 2, wherein the MOSFET of said resetting means has a gate electrode having a width W that is approximately twice a gate width of said structure.

5. A semiconductor device as set forth in claim 1, wherein said resetting means has plural MOSFET's of which gate electrodes are connected commonly.

6. A semiconductor device as set forth in claim 5, wherein the sum total of the gate capacity of the MOSFET's of said resetting means is approximately twice the gate capacity of said structure.

7. A semiconductor device as set forth in claim 5, wherein the sum total of the gate widths of the MOSFET's of said resetting means is approximately twice the gate width of said structure.

8. A semiconductor device as set forth in claim 5, wherein the MOSFET's of said resetting means are two in number and are both of the same type.

9. A semiconductor device as set forth in claim 8, wherein the two MOSFET's of the resetting means have gate electrodes having widths W and lengths L that are substantially equal to the gate width and length of said structure.

10. A semiconductor device as set forth in claim 1, further comprising switching means between an input terminal and the first electrode, and second resetting means, and a second structure inputting the inverted signal of the reset signal inputted into said second resetting means connected between said switching means and said capacitor.

11. A semiconductor device as set forth in claim 10, further comprising a semiconductor substrate, and wherein said second resetting means has a MOSFET, said second structure has a pair of semiconductor regions including an impurity of a type which is different from said semiconductor substrate which is formed on a semiconductor through a gate electrode to apply the inverted signal to said semiconductor substrate, and said semiconductor regions are electrically commonly connected with the first electrode of said capacitor.

12. A semiconductor device as set forth in claim 11, wherein the MOSFET of said second resetting means has a gate electrode having a capacity that is approximately twice the gate capacity of said structure.

13. A semiconductor device as set forth in claim 11, wherein the MOSFET of said second resetting means has a gate electrode having a width that is approximately twice the gate width of said structure.

14. A semiconductor device as set forth in claim 10, wherein said second structure has a capacitor.

15. A semiconductor device as set forth in claim 10, wherein said second structure has a transistor.

16. A semiconductor device as set forth in claim 10, wherein said second resetting means has plural MOSFET's, having gate electrodes that are connected commonly.

17. A semiconductor device as set forth in claim 16, wherein the sum total of the capacities of the gate electrodes of the MOSFET's of said second resetting means is approximately twice the gate capacity of said second structure.

18. A semiconductor device as set forth in claim 16, wherein the sum total of the gate width's W of the MOSFET's of said second resetting means is approximately twice the gate width of said second structure.

19. A semiconductor device as set forth in claim 16, wherein the MOSFET's of said resetting means are two in number and are of the same type.

20. A semiconductor device as set forth in claim 19, wherein the two MOSFET's have gate electrodes having gate widths W and lengths L that are substantially equal to the gate width and length of said second structure.

21. A semiconductor device as set forth in claim 1, wherein the inverted signal is input so as to rise or fall at the same time with or later than the drive signal.

22. A semiconductor device as set forth in claim 1, wherein the reset signal is inputted into said resetting means through a circuit comprising an inverter circuit.

23. A semiconductor device having circuit units each of which comprises:
    plural input terminals;
    plural capacitors each of which has first and second electrodes, the first electrode of each capacitor being connected electrically to a respective one of said plural input terminals;
    a sense amplifier having an input and output sections, said input section being connected electrically to said second electrodes commonly;
    reset means connected commonly to the second electrodes of said capacitors and the input section of said sense amplifier; and
    a structure to which an inverted signal of the reset signal inputted to said reset means is inputted;
    wherein an output from the output section of a first circuit unit of said circuit units, or an inverted output of said output, is inputted into an input terminal of a second circuit unit of said circuit units.

24. A semiconductor device as set forth in claim 1, wherein, when the minimum capacity value among plural capacitors corresponding to plural input terminals is C, the total capacity value of the capacitors is substantially an odd number times C.

25. An arithmetic operation apparatus having a semiconductor device having at least two circuit units each comprising:
    plural input terminals;
    plural capacitors each of which has first and second electrodes, the first electrode of each capacitor being connected electrically to a respective one of said plural input terminals;
    a sense amplifier having an input and output section connected electrically to said second electrodes commonly;
    reset means connected commonly to the second electrodes of said capacitors and the input section of said sense amplifier; and
    a structure to which an inverted signal of the reset signal inputted to said reset means is inputted;
    wherein a correlation between signals inputted into said semiconductor device is calculated.

26. A signal converter having a semiconductor device having at least two circuit units each comprising:
    plural input terminals;
    plural capacitors each of which has first and second electrodes, the first electrode of each capacitor being connected electrically to a respective one of said plural input terminals;
    a sense amplifier having an input section connected electrically to said second electrodes commonly;
    reset means connected commonly to the second electrodes of said capacitors and the input section of said sense amplifier; and
    a structure to which an inverted signal of the reset signal inputted to said reset means is inputted;
    wherein said structure is connected commonly to the second electrodes of said capacitors and the input section of said sense amplifier;
    thereby inputting an analog signal into said semiconductor device to output a digital signal corresponding to the analog signal.

27. A signal converter having a semiconductor device having at least two circuit units each comprising:
    plural input terminals;
    plural capacitors each of which has first and second electrodes, the first electrode of each capacitor being connected electrically to a respective one of said plural input terminals;
    a sense amplifier having an input section connected electrically to said second electrodes commonly;
    reset means connected commonly to the second electrodes of said capacitors and the input section of said sense amplifier; and
    a structure to which an inverted signal of the reset signal inputted to said reset means is inputted;
    wherein said structure is connected commonly to the second electrodes of said capacitors and the input section of said sense amplifier;
    thereby inputting a digital signal into said semiconductor device to output an analog signal corresponding to the digital signal.

28. A signal system having a signal converter having a semiconductor device having at least two circuit units each comprising:
    plural input terminals;
    plural capacitors each of which has first and second electrodes, the first electrode of each capacitor being connected electrically to a respective one of said plural input terminals;
    a sense amplifier having an input section connected electrically to said second electrodes commonly;
    reset means connected commonly to the second electrodes said capacitors and the input section of said sense amplifier; and
    a structure to which an inverted signal of the reset signal inputted to said reset means is inputted;
    wherein said structure is connected commonly to the second electrodes of said capacitors and the input section of said sense amplifier;
    thereby inputting an analog or digital signal into said semiconductor device to output a digital signal corresponding to the analog signal or an analog signal corresponding to the digital signal, as the case may be.

29. A semiconductor device having circuit units each comprising:
   plural input terminals;
   plural capacitors each of which has first and second electrodes, the first electrode of each capacitor being connected electrically to a respective one of said plural input terminals;
   a sense amplifier having an input section connected electrically to said second electrodes commonly;
   reset means connected commonly to the first electrodes of said capacitors and said switch means, to reset a voltage between the first electrodes and said switch means; and
   a structure to which an inverted signal of the reset signal inputted to said reset means is inputted;
   wherein said structure is connected between the first electrodes of said capacitors and said switch means.

30. A semiconductor device as set forth in claim 29, further comprising a semiconductor substrate, wherein said second resetting means has a MOSFET, and wherein said structure has a pair of semiconductor regions including an impurity of a type different from said semiconductor substrate and which are formed on said semiconductor substrate through a gate electrode to apply said inverted signal, and said semiconductor regions are electrically connected commonly with the first electrodes of said capacitors.

31. A semiconductor device as set forth in claim 30, wherein the MOSFET of said resetting means has a gate electrode having a capacity that is substantially twice the gate capacity of said structure.

32. A semiconductor device as set forth in claim 30, wherein the MOSFET of said resetting means has a gate electrode having a width that is substantially twice the gate width of said structure.

33. A semiconductor device as set forth in claim 30, wherein said resetting means has two MOSFET's having gate electrodes that are connected commonly.

34. A semiconductor device as set forth in claim 29, further comprising a semiconductor substrate, and wherein said structure has a pair of semiconductor regions including an impurity of a type different from said semiconductor substrate, and which are formed on said semiconductor substrate through a gate electrode to apply an inverted signal, and wherein said semiconductor regions are electrically connected commonly with the first electrodes of said capacitors.

35. A semiconductor device as set forth in claim 34, wherein the MOSFETs of said resetting means have gate electrodes having capacities whose sum is substantially twice the gate electrode capacity of said structure.

36. A semiconductor device as set forth in claim 30, wherein the MOSFETs of said resetting means have gate electrodes having widths whose sum is substantially twice the gate electrode width of said structure.

37. A semiconductor device as set forth in claim 30, wherein said resetting means has two MOSFET's and said structure has a MOSFET, and wherein the MOSFET's of said resetting means and the MOSFET of said structure are of the same type.

38. A semiconductor device as set forth in claim 37, wherein the two MOSFETs of the resetting means have gate electrodes having a width W and length L that are substantially equal to the gate width and length of said structure.

39. A semiconductor device as set forth in claim 29, wherein the reset signal is input to said resetting means through a circuit comprising an inverter circuit.

40. A semiconductor device having circuit units each comprising:
   plural input terminals;
   plural capacitors each of which has first and second electrodes, the first electrode of each capacitor being connected electrically to a respective one of said plural input terminals through a switch;
   a sense amplifier having an input and output sections, said input section being connected electrically to said second electrodes commonly;
   reset means connected for resetting a voltage between the first electrodes of said capacitors and the switch; and
   a structure to which an inverted signal of the reset signal inputted to said reset means is inputted and which is connected between said first electrodes of said capacitors and said switch;
   wherein an output from the output section of a first circuit unit of said circuit units, or an inverted output of said output, is inputted into an input terminal of a second circuit unit of said circuit units.

41. A semiconductor circuit using a semiconductor device as set forth in claim 29, wherein, when the minimum capacity value among the capacities corresponding to said plural input terminals is C, the sum of those capacities is substantially an odd number times C.

42. An arithmetic operation apparatus having a semiconductor device having circuit units each comprising:
   plural input terminals;
   plural capacitors each of which has first and second electrodes, the first electrode of each capacitor being connected electrically to a respective one of said plural input terminals through a switch;
   a sense amplifier having an input and output sections, said input section being connected electrically to said second electrodes commonly;
   reset means connected for resetting a voltage between the first electrodes of said capacitors and the switch; and
   a structure to which an inverted signal of the reset signal inputted to said reset means is inputted and which is connected between said first electrodes of said capacitors and said switch, thereby calculating correlation between signals inputted into said semiconductor device.

43. A signal converter having a semiconductor device having circuit units each comprising:
   plural input terminals;
   plural capacitors each of which has first and second electrodes, the first electrode of each capacitor being connected electrically to a respective one of said plural input terminals through a switch;
   a sense amplifier having an input and output sections, said input section being connected electrically to said second electrodes commonly;
   reset means connected for resetting a voltage between the first electrodes of said capacitors and the switch; and
   a structure to which an inverted signal of the reset signal inputted to said reset means is inputted and which is connected between said first electrodes of said capacitors and said switch;
   wherein an analog signal is inputted into said semiconductor device, and a digital signal corresponding to the analog signal is outputted.

44. A signal converter having a semiconductor device having circuit units each comprising:
   plural input terminals;
   plural capacitors each of which has first and second electrodes, the first electrode of each capacitor being connected electrically to a respective one of said plural input terminals through a switch;

a sense amplifier having an input and output sections, said input section being connected electrically to said second electrodes commonly;

reset means connected for resetting a voltage between the first electrodes of said capacitors and the switch; and a structure to which an inverted signal of the reset signal inputted to said reset means is inputted and which is connected between said first electrodes of said capacitors and said switch;

wherein an a digital signal is inputted into said semiconductor device, and a analog signal corresponding to the digital signal is outputted.

45. A signal processing system comprising:

a signal converter having a semiconductor device having circuit units each comprising:

plural input terminals;

plural capacitors each of which has first and second electrodes, the first electrode of each capacitor being connected electrically to a respective one of said plural input terminals through a switch;

a sense amplifier having an input and output sections, said input section being connected electrically to said second electrodes commonly;

reset means connected for resetting a voltage between the first electrodes of said capacitors and the switch; and a structure to which an inverted signal of the reset signal inputted to said reset means is inputted and which is connected between said first electrodes of said capacitors and said switch;

wherein an analog or digital signal is inputted into said semiconductor device, and a digital or analog signal corresponding to the inputted analog or digital signal is outputted, as the case may be.

46. A signal system comprising:

an arithmetic operation apparatus having a semiconductor device having at least two circuit units each comprising:

plural input terminals;

plural capacitors each of which has first and second electrodes, the first electrode of each capacitor being connected electrically to a respective one of said plural input terminals;

a sense amplifier having an input and output section connected electrically to said second electrodes commonly;

reset means connected commonly to the second electrodes said capacitors and the input section of said sense amplifier; and structure to which an inverted signal of the reset signal inputted to said reset means is inputted;

wherein a correlation between signals inputted into said semiconductor device is calculated.

47. A signal processing system comprising:

an arithmetic operation apparatus having a semiconductor device having circuit units each comprising:

plural input terminals;

plural capacitors each of which has first and second electrodes, the first electrode of each capacitor being connected electrically to a respective one of said plural input terminals through a switch;

a sense amplifier having an input and output sections, said input section being connected electrically to said second electrodes commonly;

reset means connected for resetting a voltage between the first electrodes of said capacitors and the switch; and a structure to which an inverted signal of the reset signal inputted to said reset means is inputted and which is connected between said first electrodes of said capacitors and said switch, thereby calculating a correlation between signals inputted into said semiconductor device.

48. A semiconductor device as set forth in claim 1, wherein said structure has a capacitor.

49. A semiconductor device as set forth in claim 1, wherein said structure has a transistor.

50. A semiconductor device as set forth in claim 1 comprising a plurality of semiconductor devices, wherein the output of a first semiconductor device of said plurality of semiconductor devices and/or the inversion output of the semiconductor device output is input to a second semiconductor device.

51. A signal processing system as set forth in claim 28 comprising an image input device to input picture signal.

52. A signal processing system as set forth in claim 28 comprising a storage to store information.

53. A semiconductor device as set forth in claim 29, wherein said inverted signal rises or falls at the same time with or later than said drive signal.

54. A semiconductor device as set forth in claim 29, wherein said structure has a capacitor.

55. A semiconductor device as set forth in claim 29, wherein said structure has a transistor.

56. A semiconductor device as set forth in claim 29, wherein said inverter constitutes a delay circuit.

57. A signal processing system as set forth in claim 45 comprising an image input device to input picture signal.

58. A signal processing system as set forth in claim 45 comprising a storage to store information.

* * * * *

UNITED STATES PATENT AND TRADEMARK OFFICE
CERTIFICATE OF CORRECTION

PATENT NO. : 5,903,043

DATED : May 11, 1999

INVENTOR(S) : TAKESHI ICHIKAWA, ET AL.

It is certified that error appears in the above-identified patent and that said Letters Patent is hereby corrected as shown below:

COLUMN 3

Line 36, "which-occurs" should read --which occurs--.

COLUMN 8

Line 25, "is it" should read --it is--; and
    Line 33, "is it" should read --it is--.

COLUMN 9

Line 32, "is it" should read --it is--.

COLUMN 12

Line 48, "don't" should read --do not--.

COLUMN 19

Line 14, "is it" should read --it is--.

COLUMN 20

Line 45, "is it" should read --it is--.

COLUMN 22

Line 29, "ransister" should read --transistor--.

COLUMN 29

Line 48, "means" should read --mean--.

UNITED STATES PATENT AND TRADEMARK OFFICE
CERTIFICATE OF CORRECTION

PATENT NO. : 5,903,043

DATED : May 11, 1999

INVENTOR(S) : TAKESHI ICHIKAWA, ET AL.

It is certified that error appears in the above-identified patent and that said Letters Patent is hereby corrected as shown below:

COLUMN 31

Line 55, "applying" should read --applying to--;
    Line 57, "applying" should read --applying to--;
    Line 59, "applying" should read --applying to--; and
    Line 64, "shown" should read --as shown in--.

COLUMN 32

Line 15, "43C" should read --43C)--.

COLUMN 33

Line 7, "have" should read --has--.

COLUMN 35

Line 59, "section" should read --sections--.

COLUMN 36

Line 55, electrodes" should read --electrodes of--.

COLUMN 39

Line 12, "an a" should read --a--;
    Line 13, "a" should read --an--;
    Line 47, "section" should read --sections--; and
    Line 51, "trodes" should read --trodes of--.

UNITED STATES PATENT AND TRADEMARK OFFICE
CERTIFICATE OF CORRECTION

PATENT NO. : 5,903,043
DATED      : May 11, 1999
INVENTOR(S) : TAKESHI ICHIKAWA, ET AL.

It is certified that error appears in the above-identified patent and that said Letters Patent is hereby corrected as shown below:

<u>COLUMN 40</u>

```
Line 28, "claim 1" should read --claim 1,--;
Line 34, "claim 28" should read --claim 28,--;
Line 36, "claim 28" should read --claim 28,--;
Line 45, "claim 29," should read --claim 39,--;
Line 47, "claim 45" should read --claim 45,--; and
Line 49, "claim 45" should read --claim 45,--.
```

Signed and Sealed this

Fourth Day of January, 2000

Attest:

*Attesting Officer*

*Acting Commissioner of Patents and Trademarks*